(12) United States Patent
Okuda et al.

(10) Patent No.: US 7,356,918 B2
(45) Date of Patent: Apr. 15, 2008

(54) COMPONENT MOUNTING METHOD

(75) Inventors: Osamu Okuda, Chikushino (JP); Kazuo Kido, Kofu (JP); Hideki Uchida, Yamanashi (JP); Haneo Iwamoto, Sakai (JP); Takashi Yazawa, Kai (JP); Kazuyuki Yoshidomi, Kurume (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 282 days.

(21) Appl. No.: 10/537,304

(22) PCT Filed: Dec. 2, 2003

(86) PCT No.: PCT/JP03/15376

§ 371 (c)(1),
(2), (4) Date: Jun. 2, 2005

(87) PCT Pub. No.: WO2004/052072

PCT Pub. Date: Jun. 17, 2004

(65) Prior Publication Data

US 2006/0048380 A1    Mar. 9, 2006

(30) Foreign Application Priority Data

Dec. 2, 2002   (JP)   ............................. 2002-349852
Nov. 27, 2003  (JP)   ............................. 2003-397077

(51) Int. Cl.
*H05K 3/30* (2006.01)
(52) U.S. Cl. ........................... 29/833; 29/832; 29/740; 356/614; 382/151

(58) Field of Classification Search .......... 29/832–834, 29/836, 709, 712, 720, 721, 739–743; 356/243.1, 356/614, 615; 382/151; 700/125; 348/87; 901/47

See application file for complete search history.

(56) References Cited

U.S. PATENT DOCUMENTS

| | | | |
|---|---|---|---|
| 4,812,666 A * | 3/1989 | Wistrand | 901/47 |
| 4,980,971 A * | 1/1991 | Bartschat et al. | 29/833 |
| 6,563,530 B1 * | 5/2003 | Oyama et al. | 348/87 |

FOREIGN PATENT DOCUMENTS

| | | |
|---|---|---|
| EP | 1 018 862 A1 | 12/2000 |
| JP | 5-30562 | 4/1993 |
| JP | 6-624 | 1/1994 |
| JP | 6-81926 | 3/1994 |

(Continued)

*Primary Examiner*—Donghai D. Nguyen
(74) *Attorney, Agent, or Firm*—Wenderoth, Lind & Ponack, L.L.P.

(57) ABSTRACT

An X-Y robot having a structure that linearly deforms along an X-axis direction and a Y-axis direction, a camera reference mark, and a control unit are provided. The X-Y robot causes no displacement of warp or the like and linearly deforms along only the X-axis direction and the Y-axis direction even if heat takes effect due to continuous operation. Therefore, if the amount of expansion and contraction of the X-Y robot due to heat is obtained by picking-up an image of the camera reference mark by a board recognition camera and the component placing position is corrected on the basis of the amount of expansion and contraction, then an electronic component can be mounted in a prescribed position or almost in the prescribed position.

3 Claims, 51 Drawing Sheets

FOREIGN PATENT DOCUMENTS

| | | |
|---|---|---|
| JP | 6-126671 | 5/1994 |
| JP | 6-310899 | 11/1994 |
| JP | 6-167788 | 6/1996 |
| JP | 8-236995 | 9/1996 |
| JP | 8-242094 | 9/1996 |
| JP | 9-181130 | 7/1997 |
| JP | 11-74700 | 3/1999 |
| JP | 2001-352200 | 12/2001 |

* cited by examiner 202-1  61S  202-2

COMPONENT MOUNTING METHOD

TECHNICAL FIELD

The present invention relates to a component mounting method and apparatus for placing a component on a board with high accuracy. The present invention relates particularly to a component mounting apparatus and a component mounting method carried out by the component mounting apparatus, and more particularly to a component mounting apparatus and method considering expansion and contraction due to heat of an X-Y robot that carries out component mounting by moving in X- and Y-directions.

BACKGROUND ART

Regarding the accuracy of mounting electronic components on electronic circuit boards, there has been a growing demand for increasing the accuracy with the minimization of electronic components to be mounted. In order to achieve the mounting accuracy as described above, various devices have conventionally been proposed. For example, a method for image-picking up board marks existing on the circuit board loaded into a component mounting apparatus by means of a board recognition camera to obtain the displacement of the circuit board, image-picking up, by means of a component recognition camera, the electronic component held by a suction nozzle of an X-Y robot that carries out component mounting by moving in the X- and Y-directions to obtain the displacement of the electronic component, correcting the displacements of both the board and the component, and then mounting the electronic component on the circuit board by means of the X-Y robot, and the like are disclosed. Furthermore, a method for further improving the mounting accuracy by obtaining relative positions between the suction nozzle of the X-Y robot, the board recognition camera, and the component recognition camera in addition to the method (see, for example, Japanese unexamined patent publication No. H08-242094) is also proposed.

Furthermore, since the X-Y robot is expanded and contracted due to a temperature change of the component mounting apparatus accompanying the operation of the component mounting apparatus that has the X-Y robot, a method for improving the mounting accuracy in consideration of the amount of expansion and contraction is also proposed. As shown in FIG. 28, the method image-picks up a reference mark 4 by means of a board recognition camera 3 attached to a head 2 provided for an X-Y robot 1 and obtains the displacement of the X-Y robot 1 due to heat on the basis of the image-pick up information (see, for example, Japanese unexamined patent publication No. H06-126671).

Although the various methods are proposed to improve the component mounting accuracy as described above, the advancement of the minimization of electronic components are remarkable, and the component mounting accuracy has become more severe in accordance with it. Therefore, it is a possible case that the aforementioned methods cannot satisfy the mounting accuracy of the recent electronic components. It is concretely currently demanded to mount, for example, a chip component of a size of 1.6×0.8 mm within an error range of, for example, ±70 μm.

Moreover, it is required to obtain the relative positional relation between the suction nozzle of the X-Y robot and the component recognition camera in order to improve the component mounting accuracy. However, it is not easy to obtain the relative positional relation since the X-Y robot expands and contracts due to heat as described above. That is, when the amount of expansion and contraction of the X-Y robot 1 due to heat is considered, if an X-axis robot 7 and Y-axis robots 8 that constitute the X-Y robot 1 are arranged perpendicular to each other and heat takes effect as shown in FIG. 28, it is possible to cope with the expansion and contraction so long as the X-Y robot 1 expands and contracts with the perpendicular state maintained. That is, if the expansion and contraction of the X-axis robot 7 and the Y-axis robots 8 occur only in one direction, it is possible to regard the amounts of expansion and contraction same or approximately equal to each other in a position where the reference mark 4 is image-picked up by a camera 3 provided for the head 2 to calculate the amount of expansion and contraction of the X-Y robot 1 and a position where the head 2 actually mounts an electronic component on the printed board 6, or calculate the amount of displacement in the placing position from the amount of the expansion and contraction at the reference mark image-pickup position, and it is possible to treat the amount of the expansion and contraction obtained on the basis of the image-pickup as effective.

However, conventionally, even when the placing position is corrected in consideration of the amount of expansion and contraction, it is true that the mounting accuracy cannot be improved to the intended extent. Although the reason for the above has not completely been clarified, it may be considered as the reason that the expansion and construction of the X-Y robot 1 occur not only in the X-axis direction and the Y-axis direction but also in other directions when heat takes effect in the conventional structure. That is, as exampled or illustrated with exaggeration in FIGS. 29 and 30, it can be considered that the X-axis robot 7 and the Y-axis robots 8 independently deform to expand, warp, or in a similar manner due to heat. Therefore, it can be considered that the amounts of expansion and construction as well as the displacement directions of the X-Y robot 1 are disadvantageously varied in the position where the reference mark 4 is image-picked up by the camera 3 provided for the head 2 to calculate the amount of expansion and contraction of the X-Y robot 1 and the position where the head 2 actually mounts the electronic component on the printed board 6, and the obtained amounts of expansion and contraction cannot contribute to the correction of the placing position, causing no improvement in the mounting accuracy.

Although the component mounting of component suction by the nozzle of the head, recognition by the camera of the sucked component, and placement on the board has been carried out by moving the component suction head in the X- and Y-directions by driving the X-Y robot, it has not been able to achieve high mounting accuracy due to the distortion of the component mounting apparatus itself no matter how the component recognition accuracy has been improved. The distortion of the component mounting apparatus itself is attributed to the poor machining accuracy or poor assembling accuracy of the X-Y robot of the component mounting apparatus.

If the impossibility of the high-accuracy component placing on the board during placing due to the distortion of the X-Y robot attributed to the factors of machining accuracy and so on as described above is analyzed more concretely, displacements in the X- and Y-directions are caused by the yawing (rolling in the direction perpendicular to the traveling direction of the head moving on the X-Y robot), pitching (poor linearity in the transfer pathway of the head), and rolling (pitching in a direction at an angle of ninety degrees different from the above rolling) of the guide members of the X-Y robot.

Accordingly, the component mounting has conventionally been made accurate by carrying out camera calibration, recognizing the reference mark of a reference board by means of a component recognition camera fixed to the X-Y robot, calculating the amount of displacement between a target position where the reference mark should properly exist and the actual position of the reference mark, and carrying out correction by adding the calculated amount of displacement as a placing position offset value to each position (see, for example, Japanese unexamined patent publication No. H06-126671).

In this case, the camera calibration of the board recognition camera is to make the board recognition camera recognize a jig of which the position coordinate is previously known in order to detect the installation error of the board recognition camera, calculate the installation error of the board recognition camera by a difference between the position coordinate calculated on the basis of the recognition result and the previously known position coordinate, and carry out positional correction. During the camera calibration, not only the positional correction of the board recognition camera but also the positional correction of the component recognition camera and the nozzle are additionally carried out.

However, according to the method of carrying out the correction in each of the positions, it is possible that the position of the reference board is displaced by, for example, almost 1 mm between the first-time positioning and the second-time positioning of the reference board. Furthermore, the reference board is very expensive since the reference board is required to have very high accuracy, and the positioning is achieved by stopping the reference board in an approximate X-direction position without using a board stopper from the viewpoint of the damage prevention. In addition, a board conveyor, which has a gap slightly smaller than 1 mm also in the Y-direction for conveyance, therefore has no reproducibility of the positioning of the reference board in the board holding section of the component mounting apparatus, and this becomes a factor that reduces the mounting accuracy.

As described above, the amounts of relative displacement between the respective positions of the robot are obtained by positioning the reference board in the approximate position and thereafter recognizing the reference mark of the reference board, and the amounts of displacement are reflected in the placing position data of the mounting board during mounting. This therefore is a factor that reduces the mounting accuracy.

On the other hand, in a case where the correction is carried out by recognizing a glass reference board provided with a grid in a matrix form, it can be considered to measure the grid of the reference board on the assumption that the reference board is accurately positioned and uses the measured data as a correction value without modification.

However, it is very difficult to accurately hold the reference board on the micrometer order in the board holding section as described above, and a special positioning device for accurately holding the board in the board holding section of the component mounting apparatus is necessary. Eventually, if the measured data is used directly as a correction value, it is impossible to accurately correct the X-Y robot unless the reference board is accurately positioned with high reproducibility.

If the component placing region of the component mounting apparatus is totally taken into consideration, there has been an issue that the mounting accuracy has not been able to be secured due to insufficient correction only by the conventional camera calibration and the placing position offset value for the reason that the distortion of the head operation due to the distortion of the X-Y robot has been changed depending on the position where positioning is carried out.

Even if the reference board itself on which a lot of reference marks are arranged at regular intervals in a matrix form can be accurately manufactured, it is impossible to provide an absolute parallel between the X-Y robot and the reference board. Furthermore, as a result that the absolute perpendicularity of the X-Y robot itself is not guaranteed, there is existing no reference. Since the X-Y robot, on which the head that has had the board recognition camera for recognizing the reference board arranged in the component placing region of the component mounting apparatus has been supported, has been distorted, the position obtained from the reference board has not been able to be used as a reference, and it has been unsuccessful to improve the placing accuracy (e.g., unsuccessful to increase the robot accuracy to about ±2 µm or increase the total accuracy of the mounting apparatus to about ±20 µm).

The present invention is made to solve the aforementioned issues and has an object to provide a component mounting apparatus and a component mounting method to be carried out by the component mounting apparatus which are capable of improving the component mounting accuracy further than in the conventional case.

Another object of the present invention is to solve the aforementioned issues and provide a component mounting method and apparatus which are capable of improving the placing accuracy by obtaining an optimum offset value in accordance with the size of the board.

SUMMARY OF THE INVENTION

In order to achieve the above object, the present invention has the following constitution.

According to a first aspect of the present invention, there is provided a component mounting apparatus comprising: an X-Y robot that has a component holding member for holding an electronic component, for mounting the held electronic component in a component placing position of a circuit board after moving in an X-axis direction and a Y-axis direction that are perpendicular to each other; a fixed board recognition camera that is provided for the X-Y robot, for picking up an image of a board mark on the circuit board; and a component recognition camera for picking up an image of the electronic component held by the component holding member, the apparatus comprising:

a camera reference mark arranged in vicinity of the component recognition camera; and a control unit for correcting the component placing position based on position information of the camera reference mark obtained by picking-up the camera reference mark by means of the board recognition camera.

According to a second aspect of the present invention, there is provided the component mounting apparatus as defined in the first aspect, further comprising an integrally structured component mounting apparatus chassis, wherein the X-Y robot comprises two identical Y-axis robots arranged mutually parallel along the Y-axis direction and one X-axis robot arranged along the X-axis direction perpendicular to the Y-axis robots, each of the Y-axis robots has a Y-ballscrew structure that is formed directly on the component mounting apparatus chassis, for linearly thermally expanding and contracting only in the Y-axis direction with one end served as a fixed end and the other end served as a support end and moving the X-axis robot in the Y-axis direction, and the X-Y robot thermally expands and contracts linearly along the X-axis direction and the Y-axis direction.

According to a third aspect of the present invention, there is provided the component mounting apparatus as defined in the second aspect, wherein the X-axis robot comprises an X-frame that has both ends fixed to the ballscrew structure provided for each of the Y-axis robots and an X-ballscrew structure which is formed on the X-frame, for thermally expanding and contracting linearly only in the X-axis direction with one end served as a fixed end and the other end served as a support end, receiving a component placing head provided with the component holding member, and moving the component placing head in the X-axis direction, and the X-Y robot having the X-axis robot thermally expands and contracts linearly along the X-axis direction and the Y-axis direction.

According to a fourth aspect of the present invention, there is provided the component mounting apparatus as defined in the third aspect, wherein the X-frame comprises: a support guide member that is attached to the X-frame along the X-axis direction, supporting the component placing head slidably in the X-axis direction and made of a material different from that of the X-frame; and a deformation prevention member, which is attached to the X-frame along the X-axis direction opposing the support guide member with interposition of the X-frame, for preventing the deformation of the X-frame, which is made of the same material as that of the support guide member.

According to a fifth aspect of the present invention, there is provided the component mounting apparatus as defined in the fourth aspect, wherein the component placing head comprises a plurality of the component holding members, a holding member-driving source for moving the component holding members in a Z-axis direction perpendicular to the X-axis direction and the Y-axis direction, that is independently provided for each of the component holding members to reduce generation of heat of the holding member-driving source.

According to a sixth aspect of the present invention, there is provided the component mounting apparatus as defined in any one of the first through fifth aspects, wherein the camera reference mark is arranged at the same height position as that of the circuit board when the board recognition camera picks up the board mark on the circuit board in the Z-axis direction perpendicular to the X-axis direction and the Y-axis direction.

According to a seventh aspect of the present invention, there is provided the component mounting apparatus as defined in any one of the first through sixth aspects, wherein a plurality of the component recognition cameras are provided and the camera reference marks are provided adjacently to the respective component recognition cameras.

According to an eighth aspect of the present invention, there is provided the component mounting apparatus as defined in the first aspect, wherein the X-Y robot has a relative position immovable with respect to the component holding member and the board recognition camera and thermally expands and contracts linearly along the X-axis direction and the Y-axis direction.

According to a ninth aspect of the present invention, there is provided the component mounting apparatus as defined in the eighth aspect, further comprising a component mounting apparatus chassis, wherein the component mounting apparatus chassis is formed into an integrated structure by casting and causes linear thermal expansion and contraction in the X-Y robot.

According to a 10th aspect of the present invention, there is provided the component mounting apparatus as defined in the ninth aspect, wherein the X-axis robot comprises an X-frame that has both ends fixed to the ballscrew structure provided for each of the Y-axis robots, the X-frame has a support guide member attached to the X-frame along the X-axis direction, and a deformation prevention member that is attached to the X-frame along the X-axis direction opposing the support guide member with interposition of the X-frame, for preventing the deformation of the X-frame due to heat, and the X-axis robot has a relative position immovable with respect to the component holding member and the board recognition camera.

According to an 11th aspect of the present invention, there is provided the component mounting apparatus as defined in the 10th aspect, wherein the X-axis robot further comprises an X-ballscrew structure which is formed on the X-frame, for thermally expanding and contracting linearly only in the X-axis direction with one end served as a fixed end and the other end served as a support end, receiving a component placing head provided with the component holding member, and moving the component placing head in the X-axis direction, the component placing head comprises a plurality of the component holding members, a holding member-driving source for moving the component holding member in the Z-axis direction perpendicular to the X-axis direction and the Y-axis direction, that is independently provided for each of the component holding members, and the relative position of the component placing head is immovable with respect to the component holding member and the board recognition camera.

According to a 12th aspect of the present invention, there is provided a component mounting method carried out by a component mounting apparatus that has a component holding member for holding an electronic component and mounting the held electronic component in a component placing position of a circuit board after moving in an X-axis direction and a Y-axis direction that are perpendicular to each other, the method comprising:

picking-up an image of a camera reference mark arranged adjacent a component recognition camera for picking up an image of the electronic component held by the component holding member, by means of a board recognition camera for picking up an image of a board mark on the circuit board;

comparing position information of the camera reference mark obtained by the image-picking-up with preset reference position information to obtain a difference;

using the difference for correcting an amount of movement when the electronic component held by the component holding member is moved to the fixed component recognition camera and the image of the electronic component is picked-up; and transferring and then placing the electronic component to a placing position on the circuit board after correcting an amount of displacement of the circuit board obtained by picking-up the image of the board mark by means of the board recognition camera after the image-picking-up of the electronic component by means of the component recognition camera.

According to a 13th aspect of the present invention, there is provided the component mounting method as defined in the 12th aspect, wherein, when a productive mounting operation is interrupted, the image-picking-up of the camera reference mark is carried out immediately before restarting the productive mounting operation.

According to a 14th aspect of the present invention, there is provided the component mounting method as defined in the 12th or 13th aspect, wherein, when the difference obtained by the image-picking-up is not smaller than a set value, the operation of the component mounting apparatus is stopped.

According to a 15th aspect of the present invention, there is provided the component mounting method as defined in any one of the 12 through 14 aspects, wherein a positional relation between the component holding member and the board recognition camera, a positional relation between the component holding member and the component recognition camera, and a positional relation between the board recognition camera and the component recognition camera are preliminarily measured, and the measurement values are treated as preconditions for the correction of the component placing position.

According to a 16th aspect of the present invention, there is provided the component mounting method as defined in any one of the 12th through 15th aspects, wherein, when a plurality of the component recognition cameras are provided and a plurality of camera reference marks are provided and if the difference obtained by image-picking-up one of the plurality of the camera reference marks is smaller than a set value, then the image-picking-up of the other camera reference marks is omitted.

Moreover, in order to achieve the aforementioned objects, the present invention can also be constructed as follows.

In a component mounting apparatus including: an X-Y robot that has a component holding member for holding an electronic component, for mounting the held electronic component in a component placing position of a circuit board after moving in the X-axis direction and the Y-axis direction that are perpendicular to each other; a board recognition camera that is provided for the X-Y robot, for image-picking up a board mark on the circuit board; and a component recognition camera for image-picking up the electronic component held by the component holding member, the X-Y robot has a structure, of which the relative position between the component holding member and the board recognition camera is immovable, for thermally expanding and contracting linearly along the X-axis direction and the Y-axis direction, and the apparatus is characterized by including:

a camera reference mark that is arranged adjacent the component recognition camera for using for obtaining expansion and contraction of the X-Y robot due to heat, and a control unit for obtaining an amount of expansion and contraction of the X-Y robot due to heat based on information of a plurality of positions of the camera reference marks obtained by image-picking up each camera reference mark by means of the board recognition camera before and after the expansion and contraction of the X-Y robot due to heat, and correcting the component placing position based on the amount of expansion and contraction.

The control unit may also be constructed so as to correct the component placing position based on the relative positions among the component holding member, the board recognition camera, and the component recognition camera and the amount of expansion and contraction.

Moreover, the apparatus may further include a component mounting apparatus chassis that is molded into an integrated structure by casting and causes the linear thermal expansion and contraction of the X-Y robot, wherein the X-Y robot has: two Y-axis robots arranged mutually parallel along the Y-axis direction; and one X-axis robot arranged along the X-axis direction perpendicular to the Y-axis robots, each of the Y-axis robots has a Y-ballscrew structure that is formed directly on the component mounting apparatus chassis, for linearly thermally expanding and contracting only in the Y-axis direction with one end served as a fixed end and the other end served as a support end and for moving the X-axis robot in the Y-axis direction, so that the X-Y robot may be constructed so as to thermally expand and contract linearly along the X-axis direction and the Y-axis direction.

Moreover, the X-axis robot may include: an X-frame that has both ends fixed to the ballscrew structure provided for each of the Y-axis robots; and an X-ballscrew structure, which is formed on the X-frame, for thermally expanding and contracting linearly only in the X-axis direction with one end served as a fixed end and the other end served as a support end, receiving a component placing head provided with the component holding member, and moving the component placing head in the X-axis direction, and the X-Y robot having the X-axis robot may be constructed so as to thermally expand and contract linearly along the X-axis direction and the Y-axis direction.

Moreover, the X-frame may include: a support guide member that is attached to the X-frame along the X-axis direction, for supporting the component placing head slidably in the X-axis direction; and a deformation prevention member, which is attached to the X-frame along the X-axis direction opposing the support guide member with interposition of the X-frame, for preventing the deformation of the X-frame due to heat of the support guide member, and the X-axis robot having the X-frame may be constructed so as to put the relative position between the component holding member and the board recognition camera into an immovable state.

Moreover, the component placing head may include a plurality of the component holding members, holding member-driving sources for moving the respective component holding members in a Z-axis direction perpendicular to the X-axis direction and the Y-axis direction and are provided for the respective component holding members, and the component placing head may be constructed so as to put the relative position between the component holding member and the board recognition camera into an immovable state.

The camera reference mark may be constructed so as to be arranged at the same height position as that of the circuit board when the board recognition camera image-picks up the board mark on the circuit board in the Z-axis direction perpendicular to the X-axis direction and the Y-axis direction.

Moreover, according to a 17th aspect of the present invention, in addition to the component mounting method of the twelfth aspect for placing the electronic component held by the component holding member of the component holding head movable with respect to the board holding device in the component placing position of the component mounting circuit board held by the board holding device, there is provided the method further including:

recognizing the position coordinates of the placing region reference marks arranged at regular intervals on a placing region reference mark recognition reference board held by the board holding device in a state in which the placing region reference mark recognition reference board is held by the board holding device and positioned in the component placing region, and obtaining the position coordinate of each of the recognized placing region reference marks;

obtaining a difference between an NC coordinate and the position coordinate of each of the placing region reference marks as a correction value;

obtaining the NC coordinates of the position coordinates of at least two board reference position calculation marks of the component mounting circuit board;

extracting placing region reference marks located near the two board reference position calculation marks from among the recognized placing region reference marks;

obtaining an offset value of each placing region reference mark by subjecting the position coordinate of each extracted placing region reference mark to coordinate transformation so that the correction value of the extracted placing region reference mark becomes zero or substantially zero;

recognizing at least two board reference position calculation marks of the component mounting circuit board held by the board holding device in a state in which the component mounting circuit board is held by the board holding device and positioned in the component placing region in place of the placing region reference mark recognition reference board, and obtaining the position coordinates of the recognized two board reference position calculation marks;

correcting the NC coordinates of the two board reference position calculation marks based on the position coordinates of the obtained two board reference position calculation marks;

carrying out correction of the position coordinate of the component placing position based on the offset value of the placing region reference mark located nearest to the recognition camera provided for the component holding head when the component held by the component holding head is positioned above each of the component placing position of the component mounting circuit board, and thereafter placing the component in the component placing position based on the corrected position coordinate of the component placing position.

Moreover, according to another aspect of the present invention, there may be provided a component mounting method of placing a component held by a component holding head movable with respect to a board holding device in a component placing position of a component mounting circuit board held by the board holding device, the method characterized by including:

recognizing position coordinates of placing region reference marks arranged at regular intervals on a placing region reference mark recognition reference board held by the board holding device in a state in which the placing region reference mark recognition reference board is held by the board holding device and positioned in the component placing region, and obtaining the position coordinate of each recognized placing region reference mark;

obtaining a difference between NC coordinate and the position coordinate of each placing region reference mark as a correction value;

obtaining NC coordinates of the position coordinates of at least two board reference position calculation marks of the component mounting circuit board;

extracting placing region reference marks located near to the two board reference position calculation marks from among the recognized placing region reference marks;

obtaining an offset value of each placing region reference mark by subjecting the position coordinate of each extracted placing region reference mark to coordinate transformation so that the correction value of the extracted placing region reference mark becomes zero or substantially zero;

recognizing at least two board reference position calculation marks of the component mounting circuit board held by the board holding device in a state in which the component mounting circuit board is held by the board holding device and positioned in the component placing region in place of the placing region reference mark recognition reference board, and obtaining position coordinates of the recognized two board reference position calculation marks;

correcting the NC coordinates of the two board reference position calculation marks based on the position coordinates of the obtained two board reference position calculation marks;

carrying out correction of the position coordinate of the component placing position based on the offset value of the placing region reference mark located nearest to the recognition camera provided for the component holding head when the component held by the component holding head is positioned above each of the component placing positions of the component mounting circuit board, and thereafter placing the component in the component placing position based on the corrected position coordinate of the component placing position.

According to an 18th aspect of the present invention, there is provided the component mounting method as defined in the 17th aspect, wherein, when obtaining the offset value of each placing region reference mark by subjecting the position coordinates of each extracted placing region reference mark to coordinate transformation so that the correction value of the extracted placing region reference mark located near to the two board reference position calculation marks becomes zero or substantially zero, the offset values of placing region reference marks are obtained by subjecting the position coordinates of the extracted placing region reference marks to coordinate transformation, the coordinate transformation being carried out by rotating and shifting a graphic line that connects the extracted placing region reference marks so that each of the correction values of the extracted placing region reference marks located near the two board reference position calculation marks becomes zero or substantially zero, so that the positional coordinates of the extracted placement region reference mark is subjected to coordinate transformation.

According to a 19th aspect of the present invention, there is provided the component mounting method as defined in the 17th or 18th aspect, wherein, when obtaining the offset value of each placing region reference mark by subjecting the position coordinate of each extracted placing region reference mark to coordinate transformation so that the correction value of the extracted placing region reference mark located near the two board reference position calculation marks becomes zero or substantially zero, the offset value of each placing region reference mark is obtained by calculating the correction value in at least one direction of the X-direction of the board holding device and the Y-direction perpendicular to the X-direction from the extracted placing region reference mark, obtaining an inclination of the reference board, and subjecting the position coordinate of each extracted placing region reference mark to coordinate transformation, the coordinate transformation being carried out so that the correction value of the extracted placing region reference mark becomes zero or substantially zero.

According to a 20th aspect of the present invention, there is provided the component mounting apparatus defined in the first aspect for placing the electronic component held by the component holding member of the component holding head movable with respect to the board holding device by means of the X-Y robot in the component placing position of the component mounting circuit board held by the board holding device, wherein the board recognition camera is provided for the component holding head supported by the X-Y robot and recognizes the position coordinate of the placing region reference mark arranged at regular intervals on a placing region reference mark recognition reference board held by the board holding device in a state in which the placing region reference mark recognition reference board is held by the board holding device and positioned in the component placing region, the apparatus further comprises an operation unit for: obtaining the position coordinate of each placing region reference mark from a recognition result of the placing region reference mark recognized by the board recognition camera; obtaining a difference between the NC coordinates and the position coordinates of the respective placing region reference marks as a correction value; extracting placing region reference marks located near the two board reference position calculation marks from among the recognized placing region reference marks based on the NC coordinates of the position coordinates of at least two board reference position calculation marks of the component mounting circuit board; obtaining an offset value of each placing region reference mark by subjecting the position coordinates of the extracted placing region reference mark to coordinate transformation so that the correction value of the extracted placing region reference mark becomes zero or substantially zero; recognizing at least two board reference position calculation marks of the component mounting circuit board held by the board holding device in a state in which the component mounting circuit board is held by the board holding device and positioned in the component placing region in place of the placing region reference mark recognition reference board; obtaining the position coordinates of the recognized two board reference position calculation marks; and correcting the NC coordinates of the two board reference position calculation marks based on the position coordinates of the obtained two board reference position calculation marks, and the control unit corrects the position coordinates of the component placing position based on the offset value of the placing region reference mark located nearest the recognition camera provided for the component holding head when the component held by the component placing head is positioned above each component placing position of the component mounting circuit board, and thereafter places the component in the component placing position based on the corrected position coordinate of the component placing position.

According to a 21st aspect of the present invention, there is provided the component mounting apparatus as defined in the 20th aspect, wherein, when obtaining the offset value of each extracted placing region reference mark by subjecting the position coordinate of the extracted placing region reference mark to coordinate transformation so that each of the correction values of the extracted placing region reference marks located near to the two board reference position calculation marks becomes zero or substantially zero, the operation unit obtains the offset values of placing region reference marks by subjecting the position coordinate of the extracted placing region reference marks to coordinate transformation, the coordinate transformation being carried out by rotating and shifting a graphic line that connects the extracted placing region reference marks so that each of the correction values of the extracted placing region reference marks located near the two board reference position calculation marks becomes zero or substantially zero.

According to a 22nd aspect of the present invention, there is provided the component mounting apparatus as defined in the 20th or 21st aspect, wherein, when obtaining the offset value of each extracted placing region reference mark by subjecting the position coordinate of the extracted placing region reference mark to coordinate transformation so that each of the correction values of the extracted placing region reference marks located near the two board reference position calculation marks becomes zero or substantially zero, the operation unit obtains the correction value in at least one direction of the X-direction of the board holding device and the Y-direction perpendicular to the X-direction from the extracted placing region reference mark, obtains an inclination of the reference board, and obtains the offset value of each placing region reference mark by subjecting the position coordinate of the extracted placing region reference mark to coordinate transformation so that the correction value becomes zero or substantially zero.

According to a 23rd aspect of the present invention, there is provided the component mounting apparatus as defined in any one of the 20th through 22nd aspects, comprising an X-Y robot that has two Y-axis robots arranged mutually parallel along the Y-axis direction and one X-axis robot that is arranged on the two Y-axis robots movably along the X-axis direction perpendicular to the Y-axis direction and movably supports the component holding head along the X-axis direction, wherein the component holding head is made movable by the two Y-axis robots and the one X-axis robot in the X- and Y-axis directions with respect to the board holding device.

According to a 24th aspect of the present invention, there is provided the component mounting apparatus as defined in the 23rd aspect, wherein the component holding head has a plurality of component suction nozzles that are each able to suck and hold the component and that are arranged along the X-axis direction, and the board recognition camera is arranged on the component holding head so that an image-pickup center of the board recognition camera is positioned coaxially with a straight line that extends through a center of the plurality of component suction nozzles.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
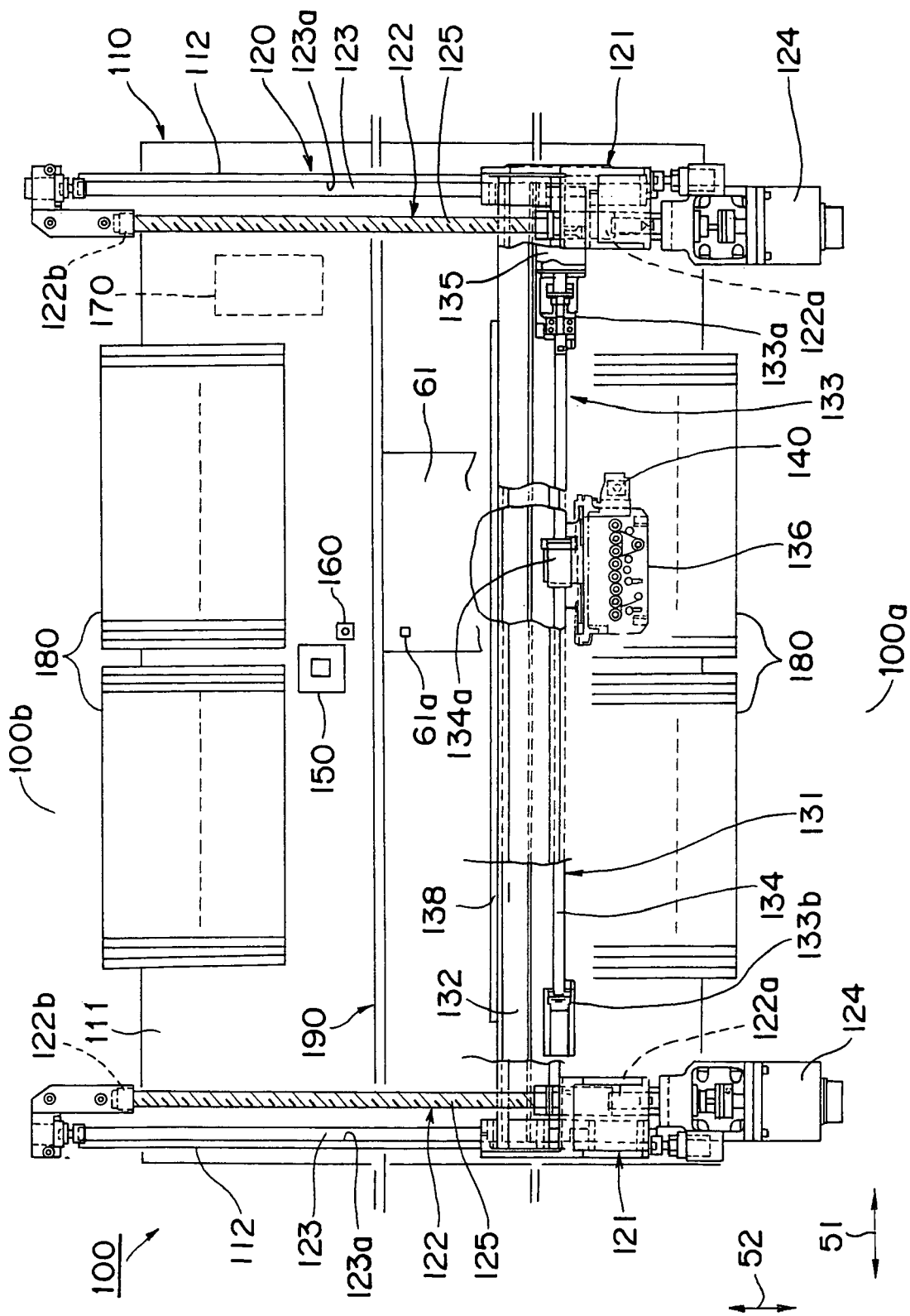
FIG. 1 is a plan view of a component mounting apparatus of a first embodiment of the present invention.

Component mounting apparatuses and component mounting methods carried out by the component mounting apparatuses according to embodiments of the present invention will be described in detail below with reference to the drawings. It is to be noted that the same constituent elements are denoted by the same reference numerals in each figure.

As shown in FIGS. 1 through 4, a component mounting apparatus 100 of the first embodiment includes a chassis 110, an X-Y robot 120, a board recognition camera 140, a component recognition camera 150, a camera reference mark 160, and a control unit 170 as the basic constituent elements, and is able to further include component feeding units 180 and a board conveyance unit 190.

The chassis 110 is a board on which the X-Y robot 120, the component recognition camera 150, the camera reference mark 160, the control unit 170, the component feeding units 180, and the board conveyance unit 190 are installed and is constructed of a rectangular base section 111 and Y-axis robot leg sections 112. The base section 111 and the Y-axis robot leg sections 112, i.e., the chassis 110 are molded into an integrated structure by casting. The Y-axis robot leg sections 112 protrude from the base section 111 at both end portions of the base section 111 in an X-axis direction 51 and extend along a Y-axis direction 52 perpendicular to the X-axis direction 51. On each of the Y-axis robot leg sections 112 is installed a linear guide 123 or the like of a Y-axis robot 121 that constitutes an X-Y robot 120 and is described in detail later. Each linear guide 123 serving as a guide support member of a nut section 126 described below is installed in the Y-axis robot leg section 112 along a linear guide installation surface 123a formed along the Y-axis direction 52. As described above, each Y-axis robot leg section 112 is constructed of the structure integrated with the base section 111 by casting, and therefore, the linear guide installation surface 123a can be finished with very high accuracy by machining. Therefore, parallelism between both the linear guide installation surfaces 123a, i.e., parallelism between both the Y-axis robots 121 can be finished with an accuracy of not greater than about 0.02 mm.

The chassis, which constitutes the conventional component mounting apparatus, is produced by welding shape steel or the like, and the Y-axis robots, which are produced separately from the chassis, are fixed to the chassis of the shape steel with bolts. Therefore, it is difficult to improve the parallelism between both the Y-axis robots to the extent that no influence is exerted on the component mounting accuracy, and the parallelism between the Y-axis robots in the conventional component mounting apparatus is considerably inferior to that of the Y-axis robots 121 of the first embodiment.

The X-Y robot 120 has two Y-axis robots 121 arranged mutually parallel along the Y-axis direction 52 and one X-axis robot 131 that is perpendicular to the Y-axis robots 121 and arranged along the X-axis direction 51 on the Y-axis robot leg sections 112, i.e., the chassis 110 molded into an integrated structure by casting.

Figure 5:
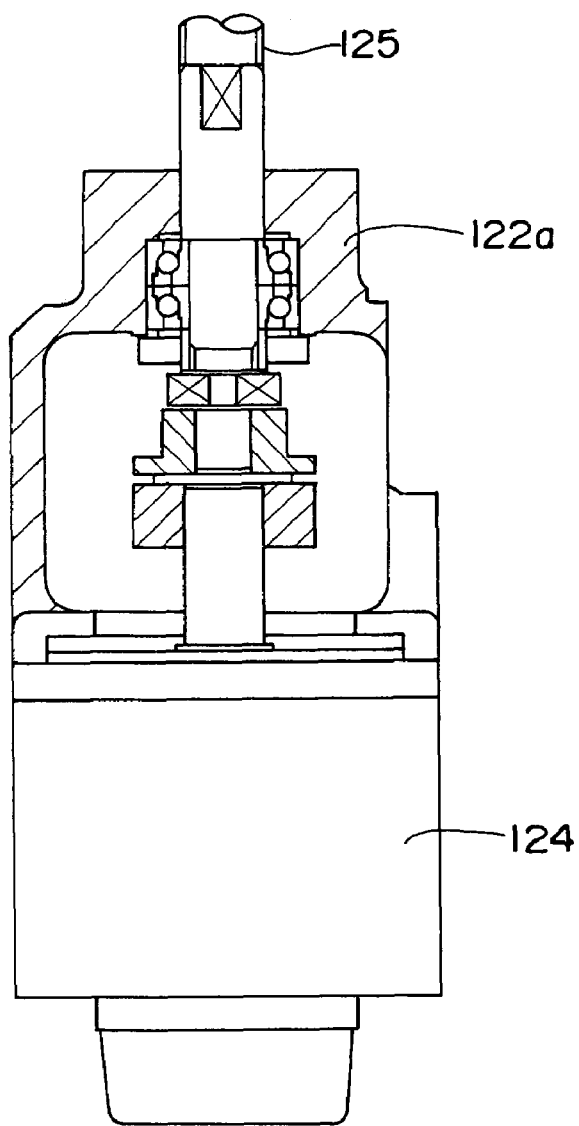
FIG. 5 is a view showing the fixed end of a ballscrew structure of the X-Y robot provided for the component mounting apparatus shown in FIG. 1.
Figure 6:
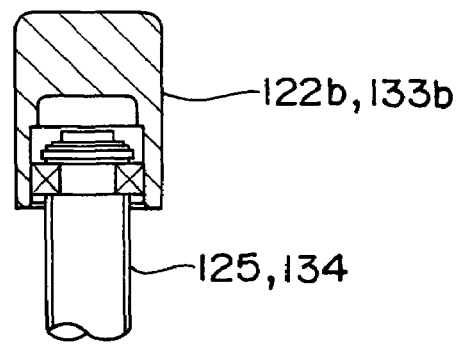
FIG. 6 is a view showing the support end of the ballscrew structure of the X-Y robot provided for the component mounting apparatus shown in FIG. 1.

Each of the Y-axis robots 121 has a Y-ballscrew structure 122 and the linear guide 123. The Y-ballscrew structure 122 linearly expands and contracts only in the Y-axis direction 52 due to heat and moves the X-axis robot 131 in the Y-axis direction 52 with one end 122a served as a fixed end and the other end 122b served as a support end. If reference is made in detail, as shown in FIG. 5, a motor 124, which serves as a driving source of the ballscrew 125 and is fixed to the Y-axis robot leg section 112, is provided at the one end 122a in the Y-ballscrew structure 122 and connected to the ballscrew 125. As shown in FIG. 6, the other end 122b is fastened to the Y-axis robot leg section 112 while supporting the ballscrew 125 rotatably in the circumferential direction thereof and extendibly in the axial direction thereof, i.e., in the Y-axis direction 52.

When the Y-axis robot 121 constructed as described above is continuously operated, the portions that generate heat are the ballscrew 125 and the motor 124, and the other end 122b permits the expansion and contraction of the ballscrew 125 in the Y-axis direction 52 due to heat. Moreover, since the motor 124 is fixed to the chassis 110 of the integrated structure as described above, the expansion and contraction, i.e., the thermal expansion and contraction of each Y-axis robot 121 due to heat can be made linear only in the Y-axis direction 52. Moreover, since the operation of the two Y-axis robots 121 are the same, the amounts of thermal expansion and contraction of the Y-axis robots 121 in the Y-axis direction 52 become equalized.

Figure 4:
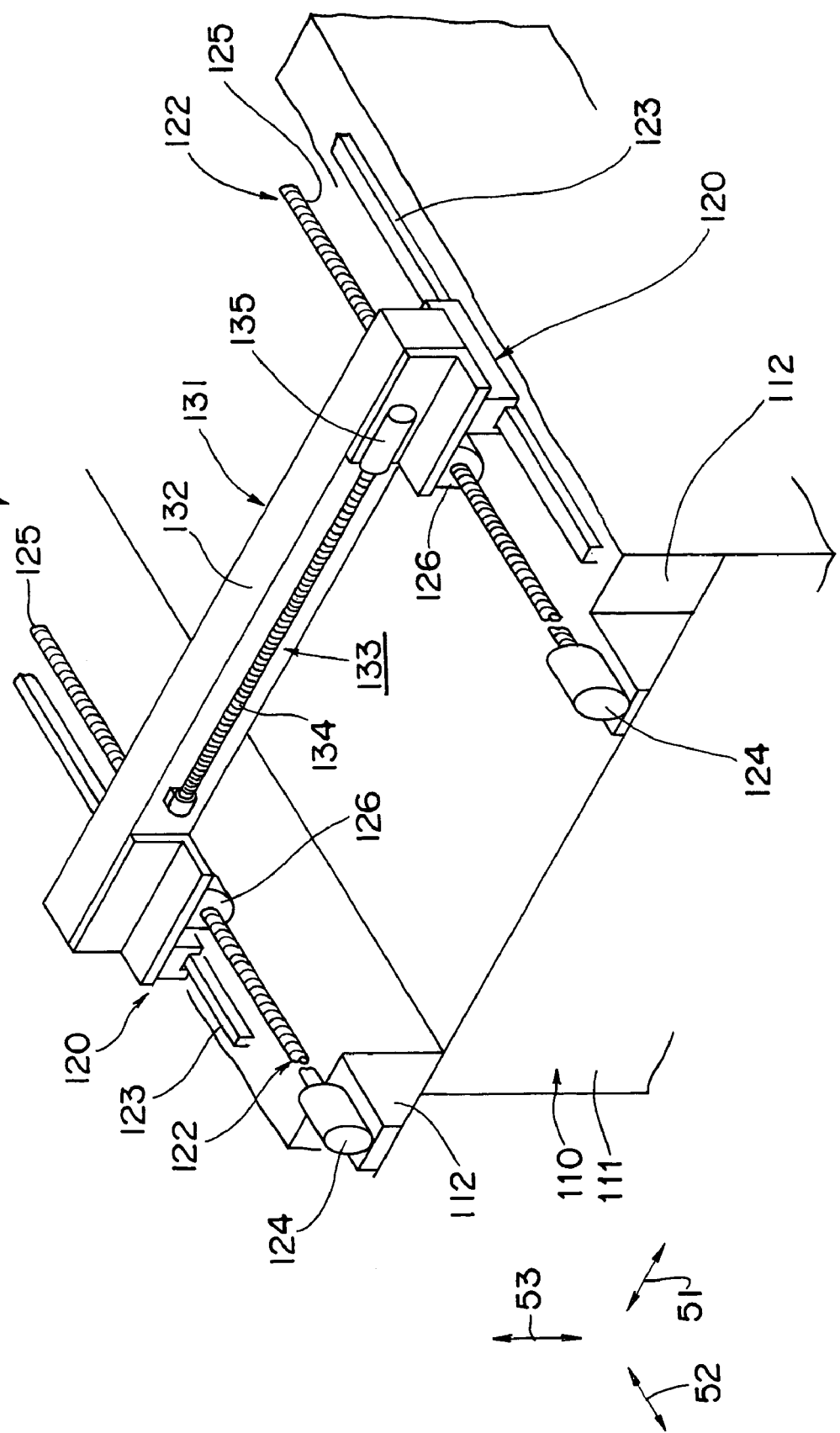
FIG. 4 is a conceptual diagram of a chassis and an X-Y robot provided for the component mounting apparatus shown in FIG. 1.

Moreover, a nut section 126 is attached around the ballscrew 125 of each Y-axis robot 121 as shown in FIG. 4, and the nut sections 126 move in the Y-axis direction 52 by the rotation of the respective ballscrews 125. The X-axis robot 131, which constitutes the X-Y robot 120, is arranged between the nut sections 126 along the X-axis direction 51. Since the amounts of expansion and contraction of the Y-axis robots 121 in the Y-axis direction 52 are the same as described above, the X-axis robot 131 arranged between the nut sections 126 can be moved in the Y-axis direction 52 parallel to the X-axis.

Figure 2:
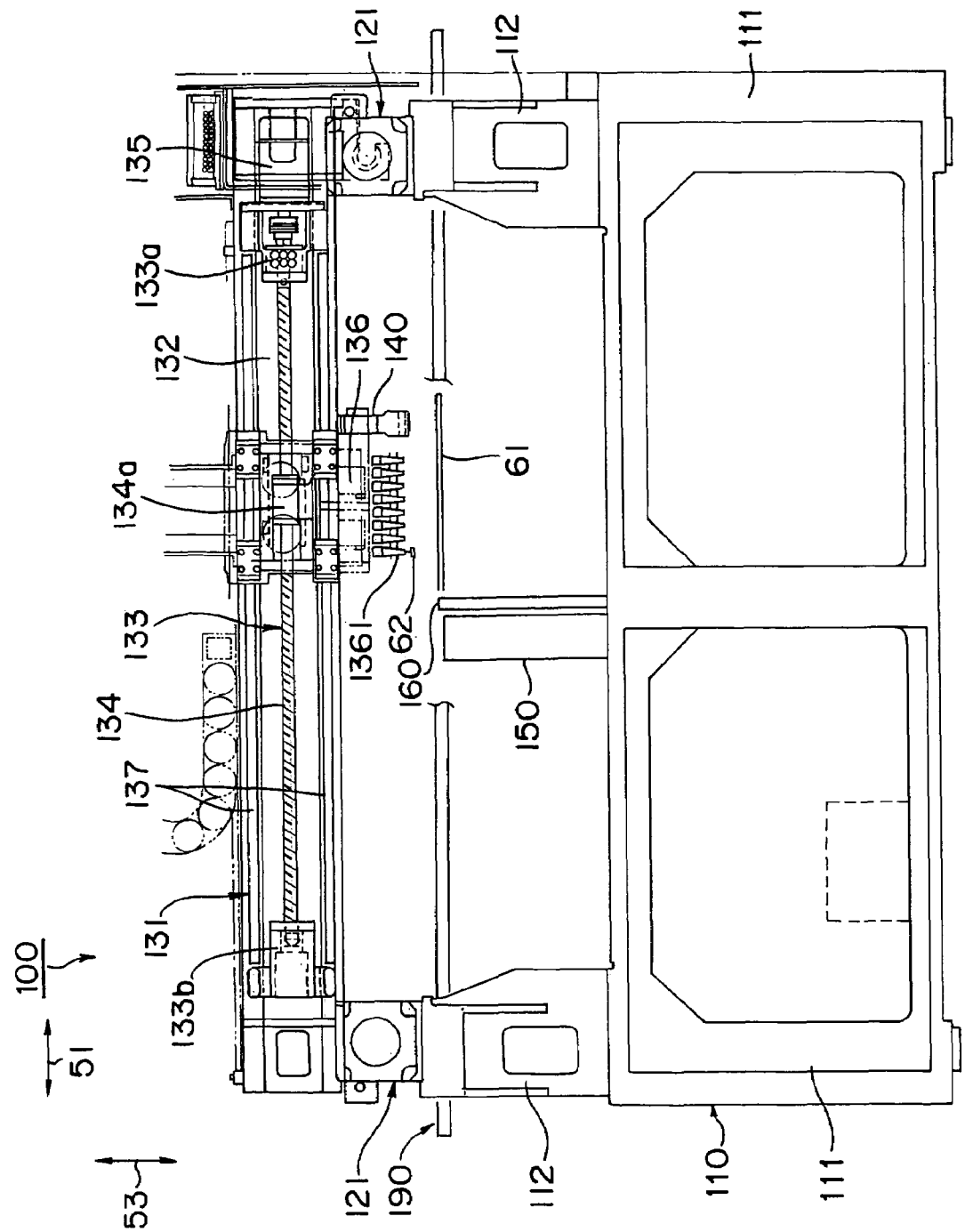
FIG. 2 is front view of the component mounting apparatus shown in FIG. 1.
Figure 3:
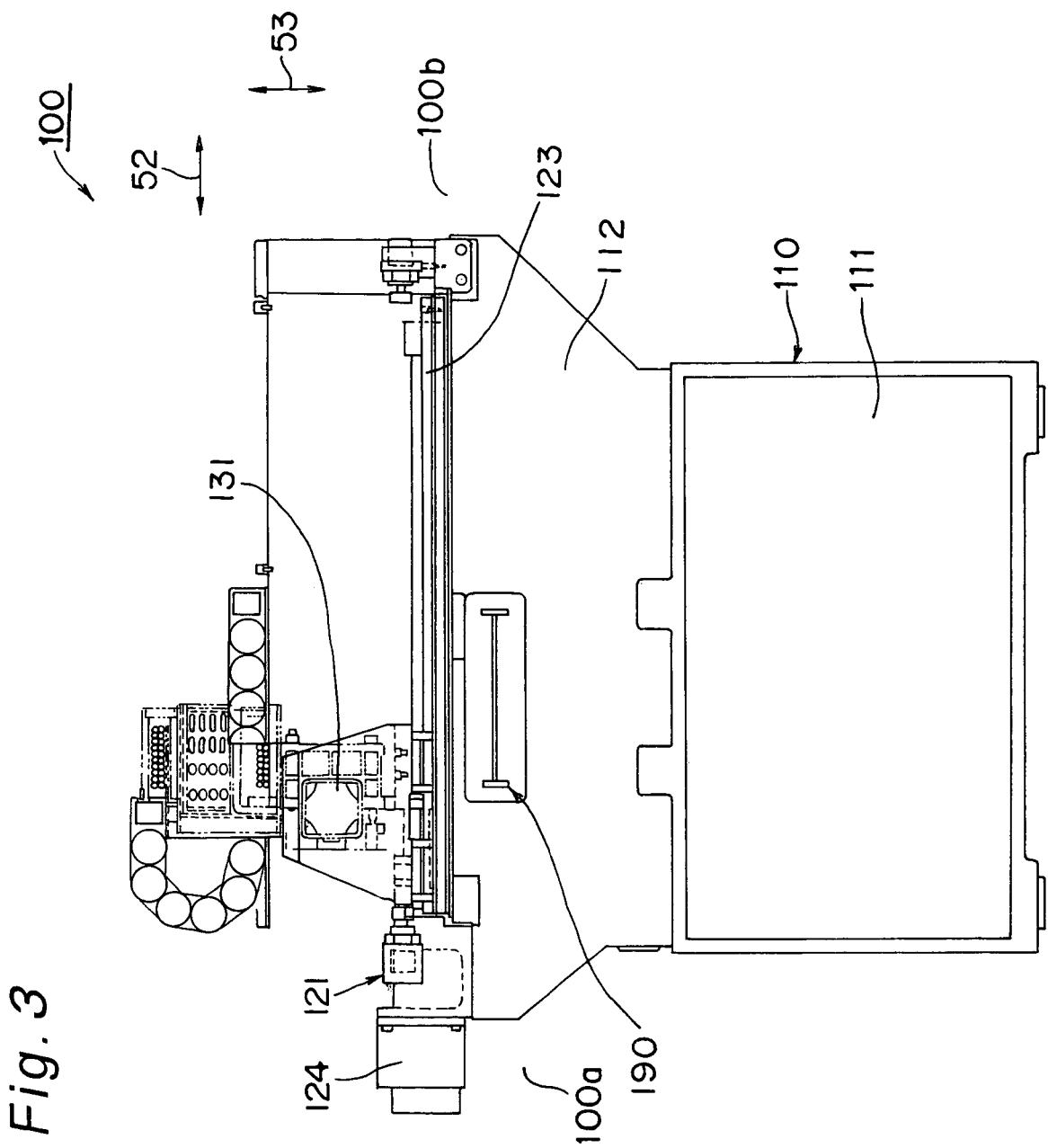
FIG. 3 is a right side view of the component mounting apparatus shown in FIG. 1.

It is to be noted that FIG. 4 is a view conceptually showing the structure of the chassis 110 and the X-Y robot 120, and the figure is not necessarily consistent with the structure of the component mounting apparatus 100 shown in FIGS. 1 through 3. Moreover, the component placing head described later is not shown. Moreover, the component feeding units 180 are not shown in FIGS. 2 through 4.

The X-axis robot 131 has an X-frame 132 and an X-ballscrew structure 133. The X-frame 132 has both ends fixed to the nut sections 126 of the ballscrew structure 122 of each Y-axis robot 121 and extends in the X-axis direction 51 as described above. The X-ballscrew structure 133 is formed on the X-frame 132 and expands and contracts linearly only in the X-axis direction 51 due to heat with its one end 133a served as a fixed end and the other end 133b served as a support end. A component placing head 136 is further attached, and the component placing head 136 is moved in the X-axis direction 51.

Figure 7:
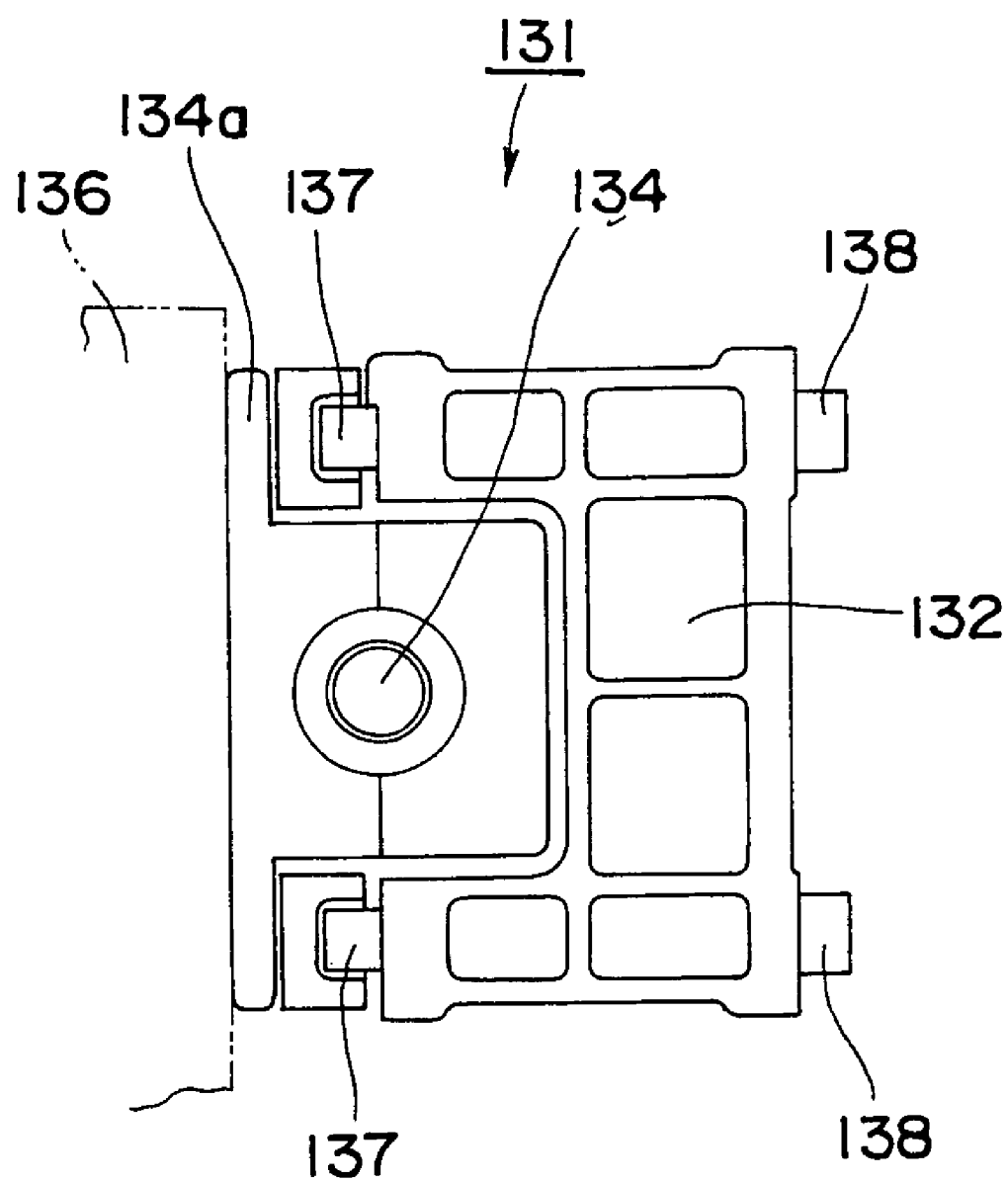
FIG. 7 is a view showing an X-frame section of an X-axis robot provided for the component mounting apparatus shown in FIG. 1.

The X-frame 132 is a member constructed of aluminum of an almost square pillar configuration as shown in FIG. 7, and both the ends are fixed to the nut sections 126 as described above. A motor 135, which serves as a driving source of the ballscrew 134 and is fixed to the X-frame 132 as shown in FIG. 4 and other figures, is provided at the one end 133a in the X-ballscrew structure 133 formed on the side surface of the X-frame 132 and connected to the ballscrew 134. As shown in FIG. 6, the other end 133b is fastened to the X-frame 132 while supporting the ballscrew 134 rotatably in the circumferential direction thereof and extendibly in the axial direction thereof, i.e., in the X-axis direction 51. When the X-axis robot 131 is continuously operated, the portions that generate heat are the ballscrew 134 and the motor 135, and the other end 133b permits the expansion and contraction of the ballscrew 134 in the X-axis direction 51 due to heat.

Moreover, as shown in FIG. 1, a nut section 134a for fastening the component placing head 136 is attached around the ballscrew 134, and the nut section 134a, i.e., the component placing head 136 is moved in the X-axis direction 51 by the rotation of the ballscrew 134.

Figure 8:
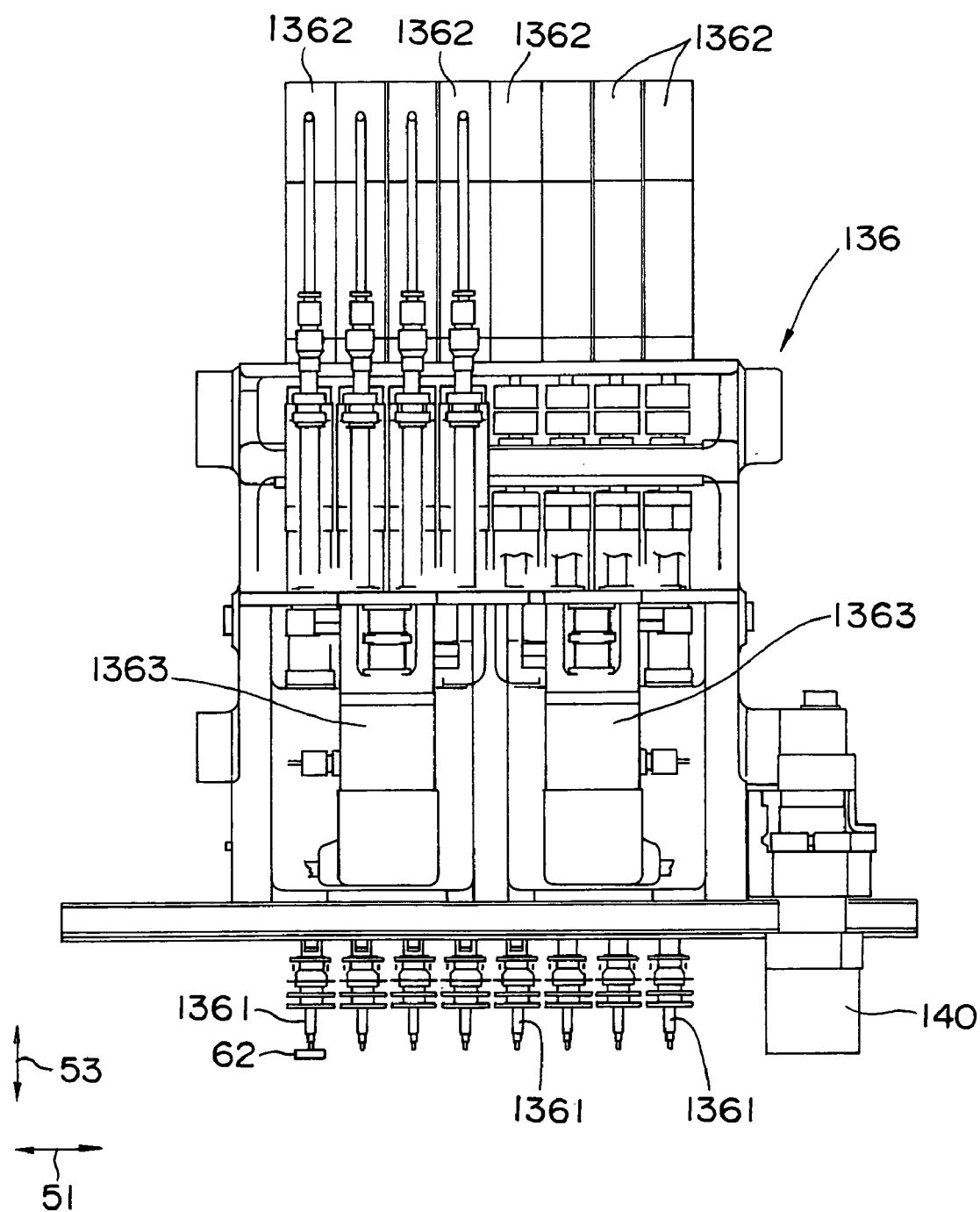
FIG. 8 is a front view of a component placing head of the X-axis robot provided for the component mounting apparatus shown in FIG. 1.

The component placing head 136 has component suction nozzles 1361 that serve as one example and that produce the function of the component holding members for holding electronic components 62 and a board recognition camera 140 for image-picking up a board mark 61a that is located on a circuit board 61 to confirm the displacement of the circuit board 61 that is loaded and placed in the first embodiment. As shown in detail in FIG. 8, with regard to the component suction nozzle 1361, eight component suction nozzles 1361 are provided in a straight line along the X-axis direction 51 in the first embodiment. It is to be noted that the electronic component 62 is a small component of a chip component or the like or a large component of QFP or the like. Therefore, component suction nozzles 1361 of optimum sizes and configurations are attached in correspondence with various components to be sucked. As described above, the board recognition camera 140 is arranged so that the image-pickup center of the board recognition camera 140 is positioned coaxially with a straight line that extends through the center of the component suction nozzles 1361 arranged along the X-axis direction 51. Moreover, a rotary motor 1363 for rotating each of the component suction nozzles 1361 in the circumferential direction of its axis is further provided for the component placing head 136.

Each of the component suction nozzles 1361 is required to be moved in the axial direction of the component suction nozzle 1361, i.e., along the Z-axis direction 53 in order to suck the electronic component 62 from the component feeding unit 180 and mount the sucked electronic component 62 on the circuit board 61. In the first embodiment, a moving motor 1362, which serves as one example and that functions as a driving source for the component holding member, is provided for each of component suction nozzles 1361 to move the component suction nozzle 1361 at the component placing head 136. Therefore, a low power motor can be used and the amount of the heat generation from the motor can be suppressed in comparison with the conventional case where all of a plurality of component suction nozzles have been driven by one high power motor. As one working example, the moving motor 1362 has an output of 20 W, and scarce heat is generated from the moving motor 1362. Furthermore, in the conventional case where the high power motor with large amount of heat generation is singly provided, a temperature gradient in accordance with the distance from the high power motor occurs in the conventional component placing head, and a distance between the component suction nozzles is disadvantageously varied in the direction of the array due to the difference in the thermal expansion and contraction. In contrast to this, by virtue of the provision of the moving motor 1362 for each of the component suction nozzles 1361 in the first embodiment, scarce heat is generated from each moving motor 1362, and if heat generation occurs, there occurs no such a temperature gradient that exerts influence on the component mounting accuracy at the component placing head 136. Therefore, even if the component placing head 136 is continuously operated, the distance between the component suction nozzles 1361 can be maintained equal or almost equal in the X-axis direction 51. It is to be noted that the almost equal state means the extent that no influence is exerted on the component mounting accuracy.

Moreover, since there occurs no such a temperature gradient that exerts influence on the component mounting accuracy at the component placing head 136 as described above, the relative position between each of the component suction nozzles 1361 and the board recognition camera 140, i.e., the distance between each of the component suction nozzles 1361 and the board recognition camera 140 can be made immovable. In this case, the above-mentioned "immovable" means that the expansion and contraction to the extent that influence is exerted on the component mounting accuracy is not caused by heat with regard to the distance between each of the component suction nozzles 1361 and the board recognition camera 140.

Figure 13:
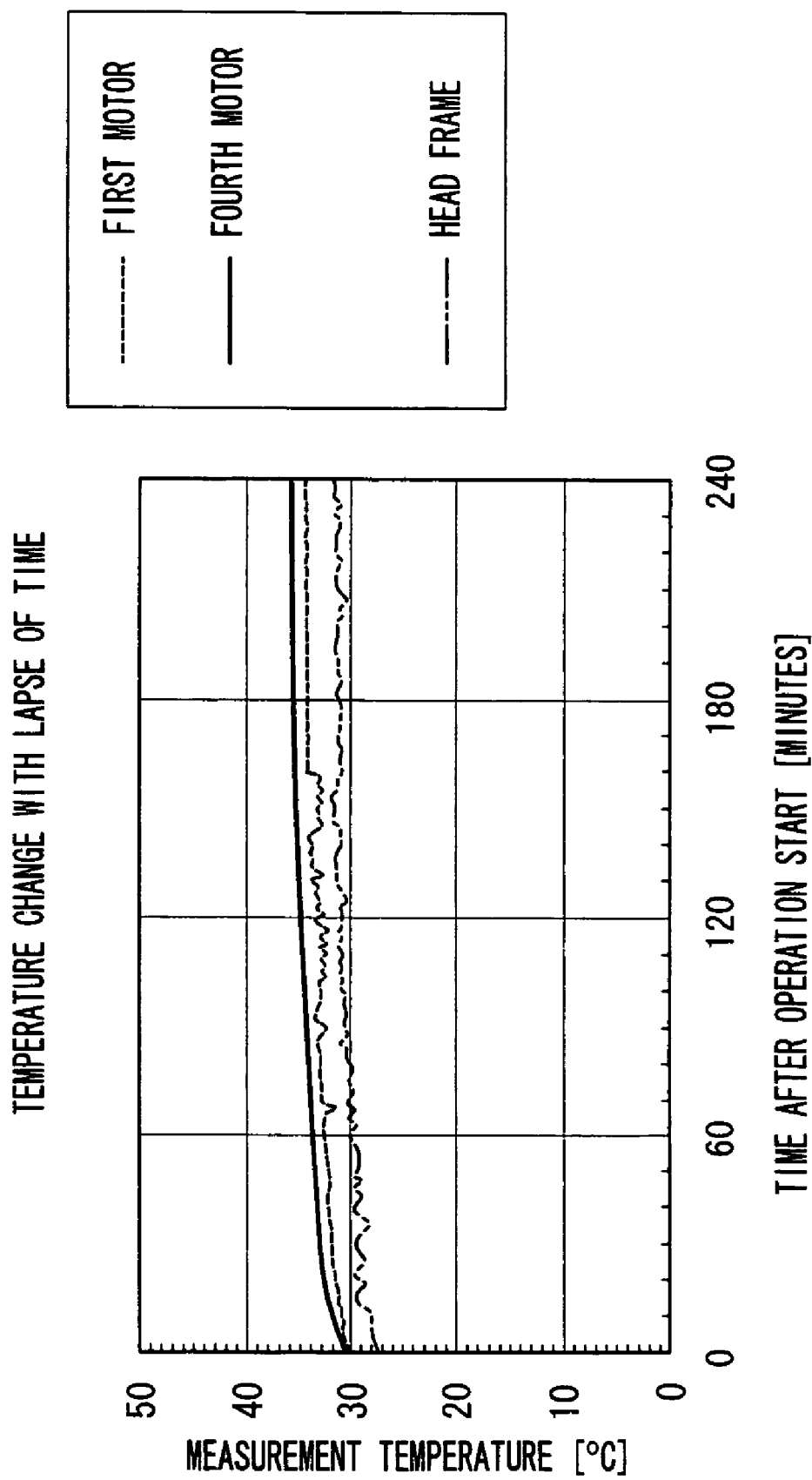
FIG. 13 is a graph showing the relation between a lapse of time and a temperature at each section in the component placing head provided for the component mounting apparatus shown in FIG. 1.

FIG. 13 shows temperature measurement results of portions of the component placing head 136 proving no harmful temperature gradient occurring at the component placing head 136. In FIG. 13, the "first motor" is the motor arranged at the left end among eight moving motors 1362 shown in FIG. 8, the "fourth motor" is the motor arranged fourthly from the left end, and the "head frame" is the frame member that forms the component placing head 136. As is apparent from FIG. 13, the temperature change at each portion of the component placing head 136 is restrained within about 5° C. regardless of a lapse of time from the start of operation of the component placing head 136. Therefore, it is allowed to consider that there is scarce deformation that is attributed to the temperature change and exerts influence on the component mounting accuracy at the component placing head 136.

Figure 14:
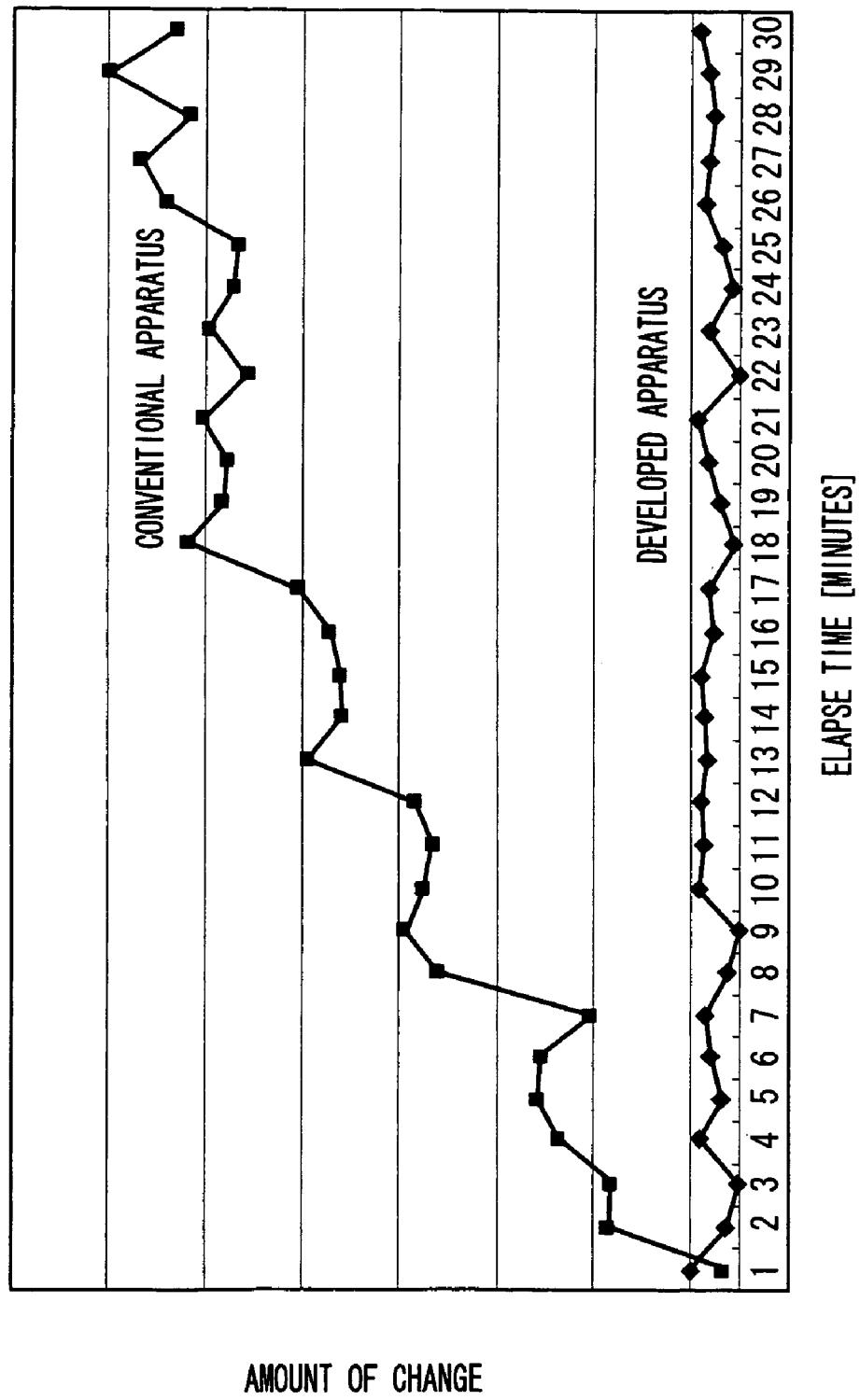
FIG. 14 is a graph showing a comparison between the component mounting apparatus shown in FIG. 1 and a conventional component mounting apparatus with regard to a displacement with a lapse of operating time of each component suction nozzle provided for the component placing head.

Moreover, it can be understood that, since the temperature change at the component placing head 136 is less than in the conventional case as described above, the amount of displacement in the distance between the component suction nozzles 1361 located at the left end and the right end of the component placing head 136 is almost constant regardless of a lapse of time as shown in FIG. 14, and the displacement also falls within about 1 µm. It is to be noted that the displacement within about 1 µm is not the amount of displacement that exerts influence on the component mounting accuracy. On the other hand, since a large temperature gradient as described above is generated in the conventional apparatus, the amount of displacement in the distance between the nozzles increases with a lapse of time as illustrated.

From the measurement results of FIGS. 13 and 14, it can be understood that the distance between the component suction nozzles 1361 can be maintained almost equal in the X-axis direction 51 regardless of the lapse of operating time of the component placing head 136, and that scarce expansion and contraction due to heat occurs in the distance between each of the component suction nozzles 1361 and the board recognition camera 140.

Further, linear guides 137, which serve as two support guide members and are made of iron of a material different from that of the X-frame 132, are provided parallel along the X-axis direction 51 as shown in FIGS. 2 and 7 in order to slidably support the component placing head 136 in the X-axis direction 51. Further, deformation prevention members 138, which opposes the linear guides 137 with interposition of the X-frame 132, prevent the deformation of the X-frame 132 along the X-axis direction 51 and are made of iron of a material of the same type as that of the linear guide 137, are attached to the X-frame 132.

The reason why the structure in which the deformation prevention members 138 with the X-frame 132 to which the linear guides 137 are attached held therebetween are provided is described. That is, if the operation of the X-axis robot 131 is continued as described above, mainly the ballscrew 134 and the motor 135 generate heat, and the linear guides 137 also generate heat. The heats are transmitted also to the X-frame 132. As also shown in FIG. 7, the X-frame 132 takes the form that is superior in terms of volume and so on and reluctant to deformation as far as possible in comparison with the motor 135 and the linear guides 137, and it is allowable to consider that there are scarce expansion and contraction and deformation due to heat. However, since the X-frame 132 is made of aluminum and the linear guides 137 are made of iron as described above, there can be considered the possibility that deformation of warp or the like occurs in the X-frame 132 due to a difference in the thermal expansion between both the members. Accordingly, by attaching the deformation prevention members 138 that are made of iron and have the same shape, dimensions, and arrangement as those of the linear guides 137, the deformation of the X-frame 132 can be canceled. Therefore, it can be assumed that the X-frame 132 neither expands nor contracts in the X-axis direction 51 and causes no deformation of warp or the like due to heat, or the amounts of the expansion and contraction and deformation come to have ignorable values with regard to the component mounting operation.

With the aforementioned construction of the X-axis robot 131, the portion where the thermal expansion and contraction occur in the X-axis robot 131 can be considered to be only the ballscrew 134, and the direction of expansion and contraction can be made linear only in the X-axis direction 51.

Figure 15:
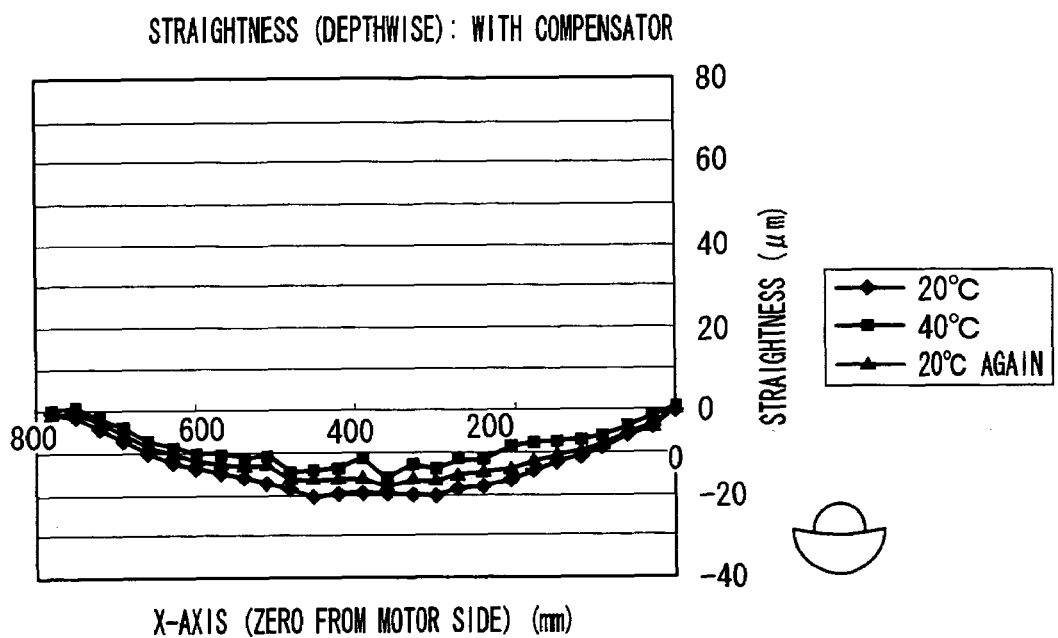
FIG. 15 is a graph showing the amount of deformation caused by a temperature change in the X-axis robot of the component mounting apparatus shown in FIG. 1.
Figure 16:
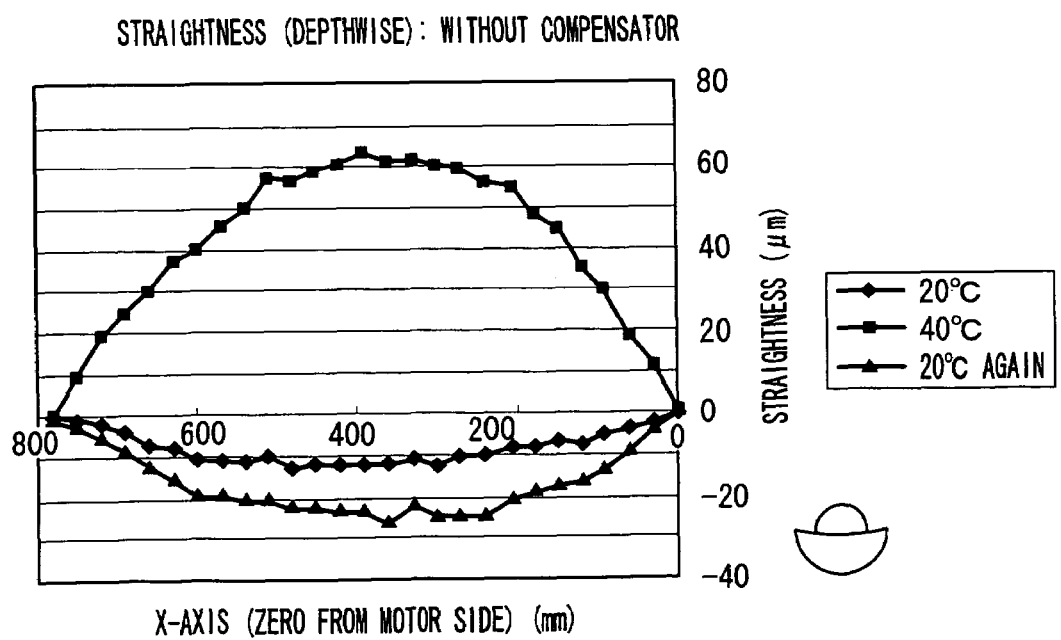
FIG. 16 is a graph showing the amount of deformation caused by a temperature change in the X-axis robot of the conventional component mounting apparatus.

The effect of providing the deformation prevention members 138 will be described with reference to FIGS. 15 and 16. It is to be noted that FIG. 15 shows the amount of deformation of the X-axis robot in the Y-axis direction 52 when the deformation prevention members are provided for the X-frame, and FIG. 16 shows the amount of deformation when the deformation prevention members are not provided. Moreover, FIGS. 15 and 16 are both graphs when the X-axis robot is subjected to a temperature change sequentially from 20° C.→40° C.→20° C., in which the horizontal axis represents a distance from a reference point on the ballscrew driving motor side provided for the X-axis robot.

As is apparent from the graphs of FIGS. 15 and 16, when the deformation prevention members are provided, the amount of deformation in the X-axis robot is suppressed within ±10 μm, and it can be said that scarce deformation occurs. When the deformation prevention members are not provided, a deformation of 90 μm at maximum occurs, and it can be understood that a bad influence is obviously exerted on the component mounting accuracy.

As is also apparent from the experimental results described above, it can be assumed that the X-axis robot 131 of the first embodiment in which the deformation prevention members 138 are attached to the X-frame 132 neither expands nor contracts in the X-axis direction 51 and causes no deformation of warp or the like due to heat, or the amounts of the expansion and contraction and deformation come to have ignorable values with regard to the component mounting operation, as described above. Moreover, it can be understood that the portion where the expansion and contraction occur due to heat at the X-axis robot 131 can be regarded as only the ballscrew 134.

According to the structures of the chassis 110 and the X-Y robot 120 that constitute the component mounting apparatus 100 of the first embodiment described above, the Y-axis robot 121 that constitutes the X-Y robot 120 linearly thermally expands and contracts only in the Y-axis direction 52 even when heat takes effect, and only the ballscrew 134 linearly thermally expands and contracts only in the X-axis direction 51 at the X-axis robot 131. Moreover, since the X-axis robot 131 is supported by the right and left Y-axis robots 121 and moved in the Y-axis direction 52, the amounts of heat generation at the Y-axis robots 121 are equal to each other. Therefore, the amounts of thermal expansion and contraction in the Y-axis direction 52 at the Y-axis robots 121 are equal to each other. Therefore, even if heat takes effect on the X-Y robots 120, displacement occurs only in the X-axis direction 51 and the Y-axis direction 52 in the component placing head 136 engaged with the ballscrew 134 of the X-axis robot 131. Further, as described above, neither expansion, contraction, nor deformation that causes troubles in the component mounting accuracy occurs in the distance between the component suction nozzles 1361 and in the distance between each of the component suction nozzles 1361 and the board recognition camera 140 provided for the component placing head 136 in the component placing head 136 even when heat takes effect.

Therefore, even when heat takes effect on the X-Y robot 120, the X-Y robot 120 is displaced only in the X-axis direction 51 and the Y-axis direction 52, and the three-dimensional displacement such as warp that causes bad influence on the component mounting accuracy does not occur dissimilarly to the conventional case. This is clarified also by the following experimental data.

Figure 17:
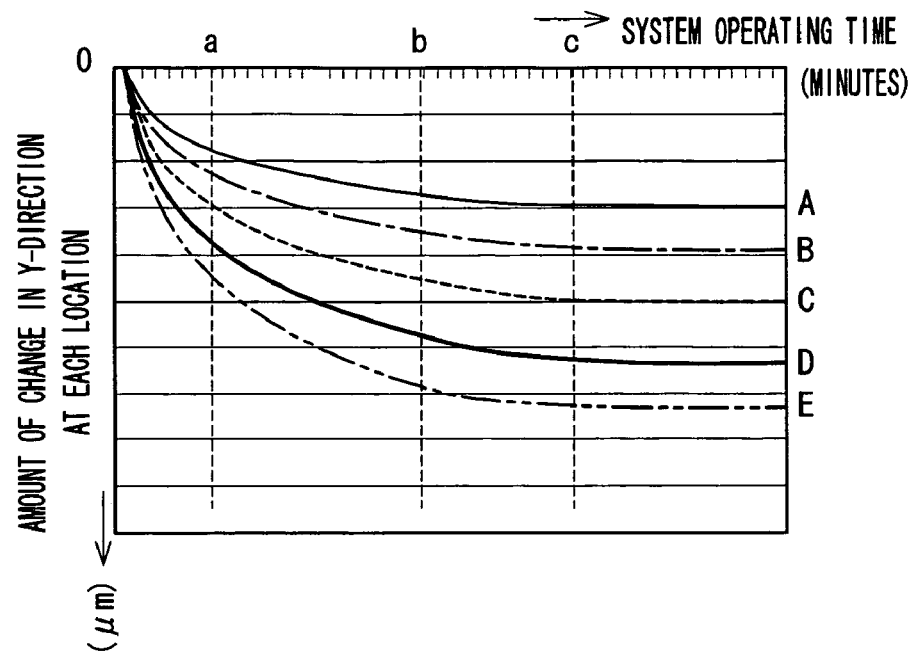
FIG. 17 is a graph showing the amounts of displacement at respective measurement points with a lapse of operating time in the component mounting apparatus shown in FIG. 1.
Figure 18:
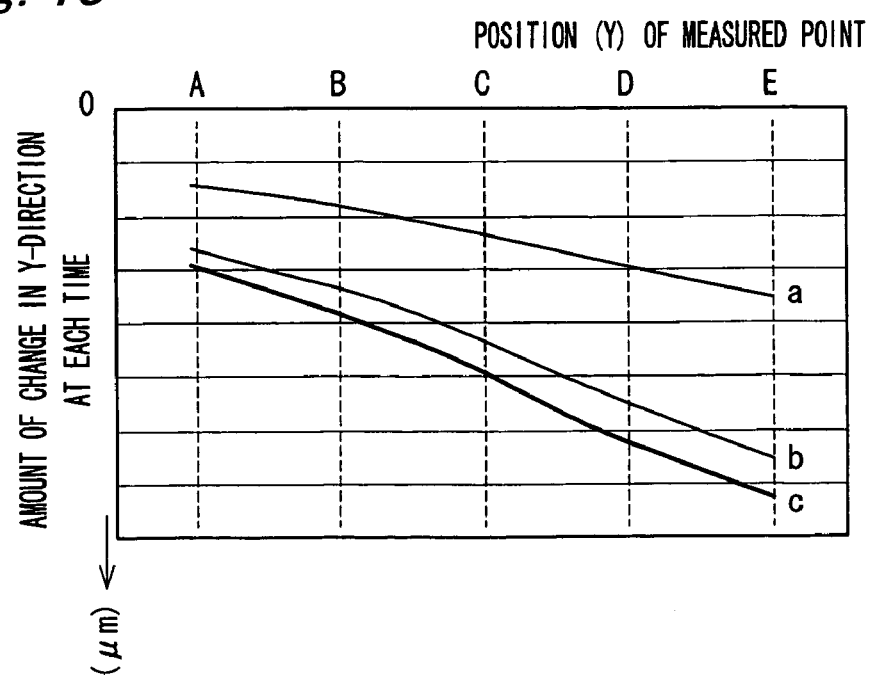
FIG. 18 is a graph showing the amounts of displacement at the respective measurement points measured at the respective times shown in FIG. 17.
Figure 19:
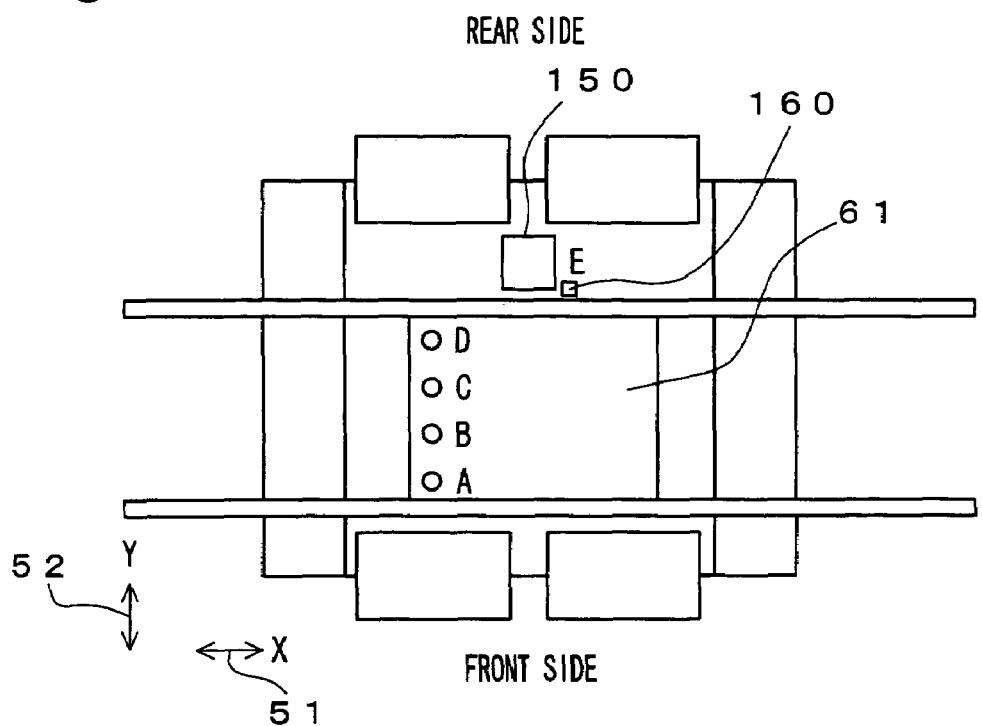
FIG. 19 is a view showing the respective measurement points shown in FIGS. 17, 18, 20, and 21.
Figure 20:
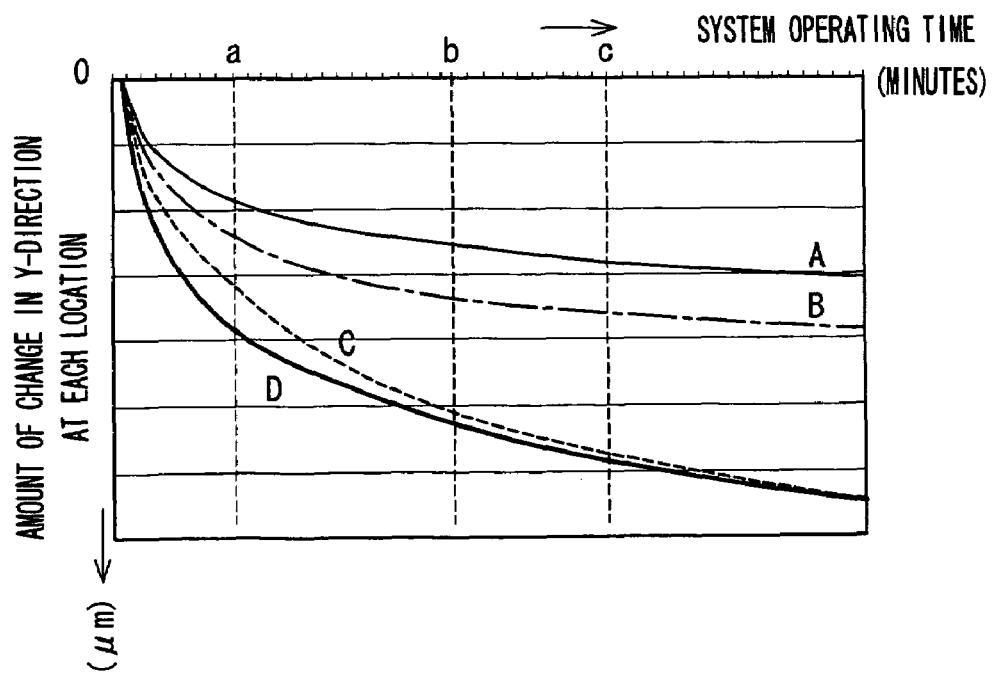
FIG. 20 is a graph showing the amounts of displacement at the respective measurement points with a lapse of operating time in the conventional component mounting apparatus.
Figure 21:
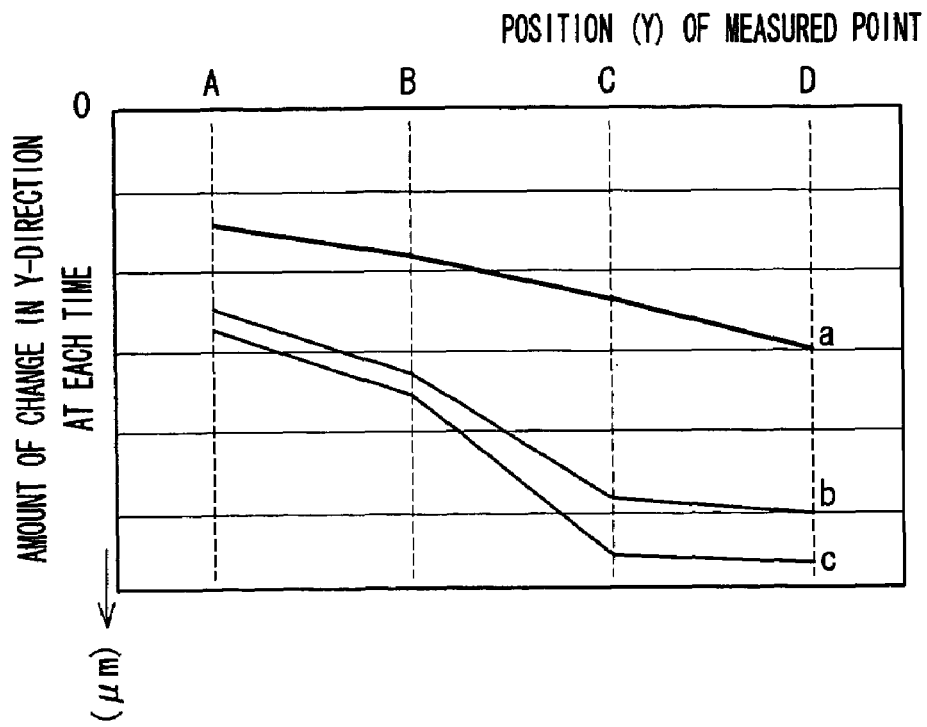
FIG. 21 is a graph showing the amount of displacement at each of the measurement points measured at each of the times shown in FIG. 20.

That is, as shown in FIG. 19, when four points A through D arranged in the Y-axis direction 52 of the circuit board 61 loaded into the component mounting apparatus and a point E of the camera reference mark 160 were recognized by the board recognition camera attached to the X-axis robot of the X-Y robot, the changes in the position of each of the points A through D in the Y-axis direction 52 with the lapse of operating time of the component mounting apparatus were measured. The points A through E are arranged at almost regular intervals in the Y-axis direction 52, and the X-axis robot is moved from the front side to the rear side in the Y-axis direction 52 by the Y-axis robot and image-picked up by the board recognition camera. FIGS. 17 and 18 are the measurement results of the aforementioned component mounting apparatus 100, and FIGS. 20 and 21 are the measurement results of the conventional component mounting apparatus. Since the point E does not exist in the conventional component mounting apparatus, there is no data of the point E in FIGS. 20 and 21.

In FIG. 17, the amounts of positional changes at the points A through E in the Y-axis direction 52 with the lapse of operating time of the component mounting apparatus 100 are shown. As is apparent from FIG. 17, the amount of positional change in the Y-axis direction 52 increases with the lapse of time at each of the points A through E, and the positional change is saturated after the lapse of a specified time. Moreover, the amounts of positional changes at the points A through E increase regularly from the point A to the point E without crossing at each of the times. Therefore, it can be understood that the X-Y robot 120 of the first embodiment expands only in the Y-axis direction 52 with a lapse of time until a specified time, and the expansion is saturated after the lapse of the specified time. Moreover, FIG. 18 shows the amounts of positional changes at the points A through E in the Y-axis direction 52 at each of the times of "a" through "c" within the elapsed time shown in FIG. 17. As is apparent from FIG. 18, the amounts of positional changes at the points A through E at the time "a" exhibit almost linear changes, and this tendency is similar at the times of "b" and "c". Therefore, it can be understood that the X-Y robot 120 is uniformly expanded in proportion to the distance in the Y-axis direction 52 regardless of a lapse of time.

On the other hand, FIG. 20 is a graph that corresponds to FIG. 17 and shows the case of the conventional component mounting apparatus. As is apparent from FIG. 20, in the conventional component mounting apparatus, the positional changes are not saturated although the amount of positional change in the Y-axis direction 52 increases with a lapse of time at each of the points A through D, and the amounts of positional changes cross each other at the points C and D. Moreover, FIG. 21 shows the amounts of positional changes at the points A through D in the Y-axis direction 52 at each of the times "a" through "c" within the elapsed time shown in FIG. 20, and no linear change is observed at the times of "b" and "c". As is apparent also from FIGS. 20 and 21, the X-Y robot in the conventional component mounting apparatus does not exhibit the expansion only in the Y-axis direction 52, and there is a tendency that the linearity of the amount of displacement disappears with a lapse of time, i.e., as the temperature change increases.

Figure 9:
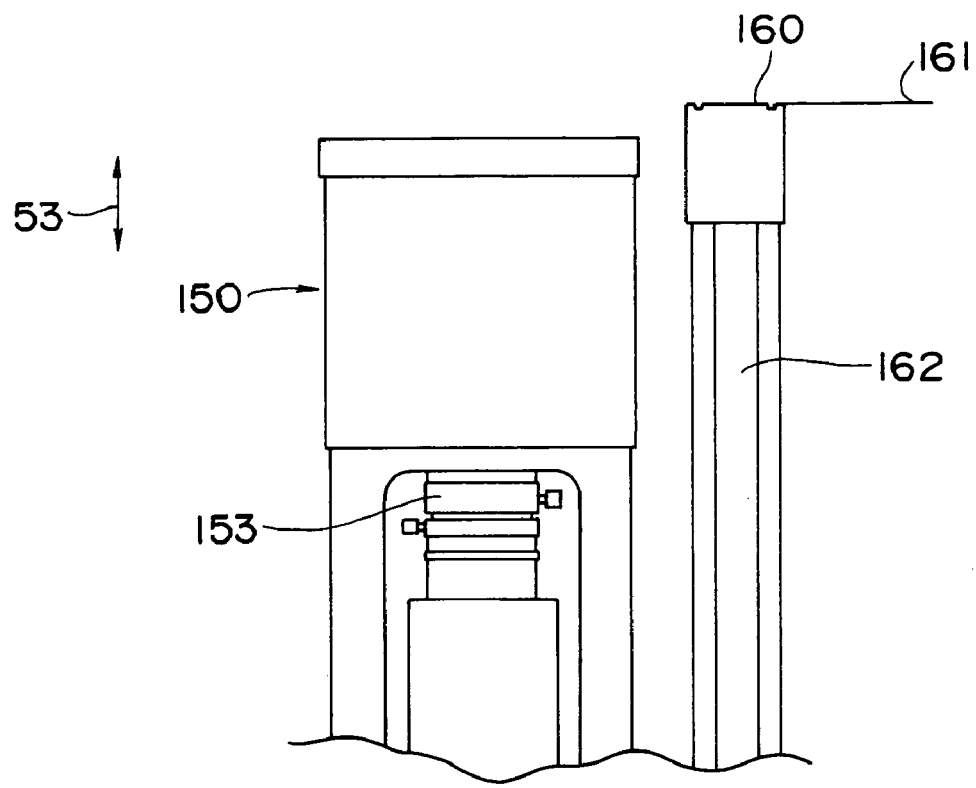
FIG. 9 is a front view of a component recognition camera and camera reference mark portions provided for the component mounting apparatus shown in FIG. 1.
Figure 10:
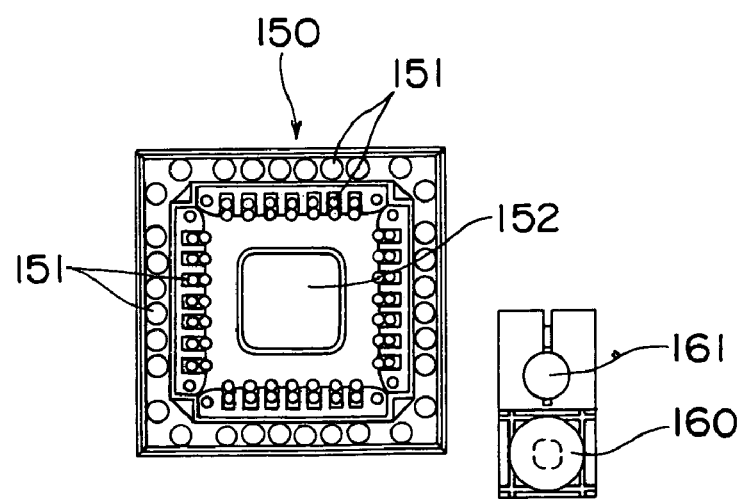
FIG. 10 is a plan view of the component recognition camera and the camera reference mark portions shown in FIG. 9.

Next, as shown in FIGS. 9 and 10, the component recognition camera 150 is a camera that has a well-known form in which LEDs 151 serving as sources of light for illumination are arranged in peripheral portions, and an image-pickup camera 152 is arranged in a central portion, relative to image-pick up the electronic component 62 sucked and held by the component suction nozzle 1361 from a lower side. In the first embodiment, as shown in FIGS. 1 and 2, the component recognition camera 150 is provided upright on the base section 111 of the chassis 110.

Since the component recognition camera 150 employs the LEDs 151 as the sources of light, the amount of heat generation at the component recognition camera 150 is a little. Moreover, since the camera is provided upright on the chassis 110 formed into an integrated structure by casting, the installation position of the component recognition camera 150 is not displaced due to heat or comes to have an ignorable amount of displacement.

As shown in FIGS. 9 and 10, the camera reference mark 160 is a mark that is arranged adjacent to the component recognition camera 150 and image-picked up by the board recognition camera 140 in order to obtain the expansion and contraction of the X-Y robot 120 due to heat, i.e., thermal expansion and contraction. Various forms can be considered with regard to the form of the mark, and one example in FIG. 10 shows a mark of a circle enclosed in a square frame. Such the camera reference mark 160 is supported on a pillar 162 that is provided upright on the base section 111 of the chassis 110, and arranged in an image-pickup height position 161. The image-pickup height position 161 is a height position such that a distance between the board recognition camera 140 and the camera reference mark 160 in the Z-axis direction 53 becomes equal to a distance between the board recognition camera 140 and the board mark 61a in the Z-axis direction 53 when the board recognition camera 140 image-picks up the board mark 61a of the circuit board 61.

By thus arranging the camera reference mark 160 in the image-pickup height position 161, the board recognition camera 140 comes to have an equalized focal distance when the board recognition camera 140 image-picks up the board mark 61a and when the board recognition camera 140 image-picks up the camera reference mark 160. Therefore, the image qualities of the image-picked-up images of both the board mark 61a and the camera reference mark 160 become equal to each other, and a recognition error attributed to the difference in the image quality can be eliminated.

As shown in FIG. 9, the image-pickup height position 161 is located in a position protrusive from the component recognition camera 150, and therefore, the camera reference mark 160 is arranged in a place where the image-pickup of the electronic component 62 by the component recognition camera 150 is not disturbed.

The component feeding unit 180 is a so-called cassette type component feeding unit that has a plurality of reels around which tapes accommodating the electronic components 62 are wound, and there are provided two sets of the units arranged on the front side 100a and the rear side 100b in the component mounting apparatus 100 of the first embodiment.

The board conveyance unit 190 is a unit that performs loading and unloading of the circuit board 61 in the component mounting apparatus 100, and, as shown in FIG. 1 and other figures, the unit is arranged along the X-axis direction 51 at an approximately central portion of the component mounting apparatus 100.

Figure 11:
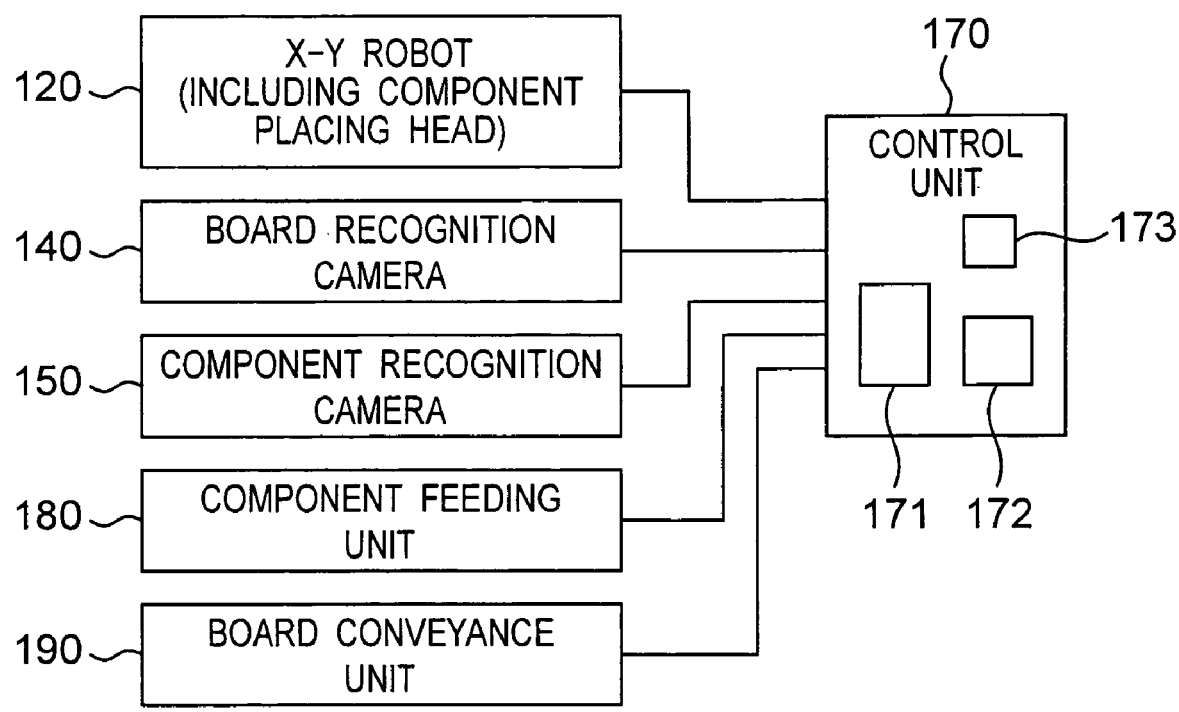
FIG. 11 is a block diagram showing the relation between the constituents and a control unit of the component mounting apparatus shown in FIG. 1.

As shown in FIG. 11, the control unit 170 is connected to the X-Y robot 120, the board recognition camera 140, the component recognition camera 150, the component feeding unit 180, and the board conveyance unit 190, which are the constituents described above, and controls the mounting operation of the electronic components 62 on the circuit board 61 by controlling operations of these constituents. The control unit 170 includes a storage section 173 for storing a program and so on necessary for the mounting operation, and functionally includes an expansion/contraction amount determining section 171 for obtaining the amount of expansion and contraction of the X-Y robot 120 due to heat on the basis of the image-pickup information of the camera reference mark 160, and further includes a fundamental position determining section 172 for preparatorily obtaining relative positional relations among the board recognition camera 140, the component recognition camera 150, and the component suction nozzles 1361. The operation of the control unit 170 constructed as above will be described in detail below.

The operation of the component mounting apparatus 100 constructed as described above, i.e., the component mounting method to be carried out by the component mounting apparatus 100 will be further described in detail with reference to FIG. 12. It is to be noted that the conveyance operation of the circuit board 61 by the circuit board conveyance unit 190 as well as the operations from the component suction from the component feeding unit 180 to the component mounting on the circuit board 61 by the X-Y robot 120 including the component placing head 136 are basically similar to the operations carried out in the conventional component mounting apparatus, and therefore, these operations are briefly explained. Accordingly, the operation of determining the amount of expansion and contraction of the X-Y robot 120 when heat takes effect carried out by using the camera reference mark 160 will be mainly described below.

Figure 12:
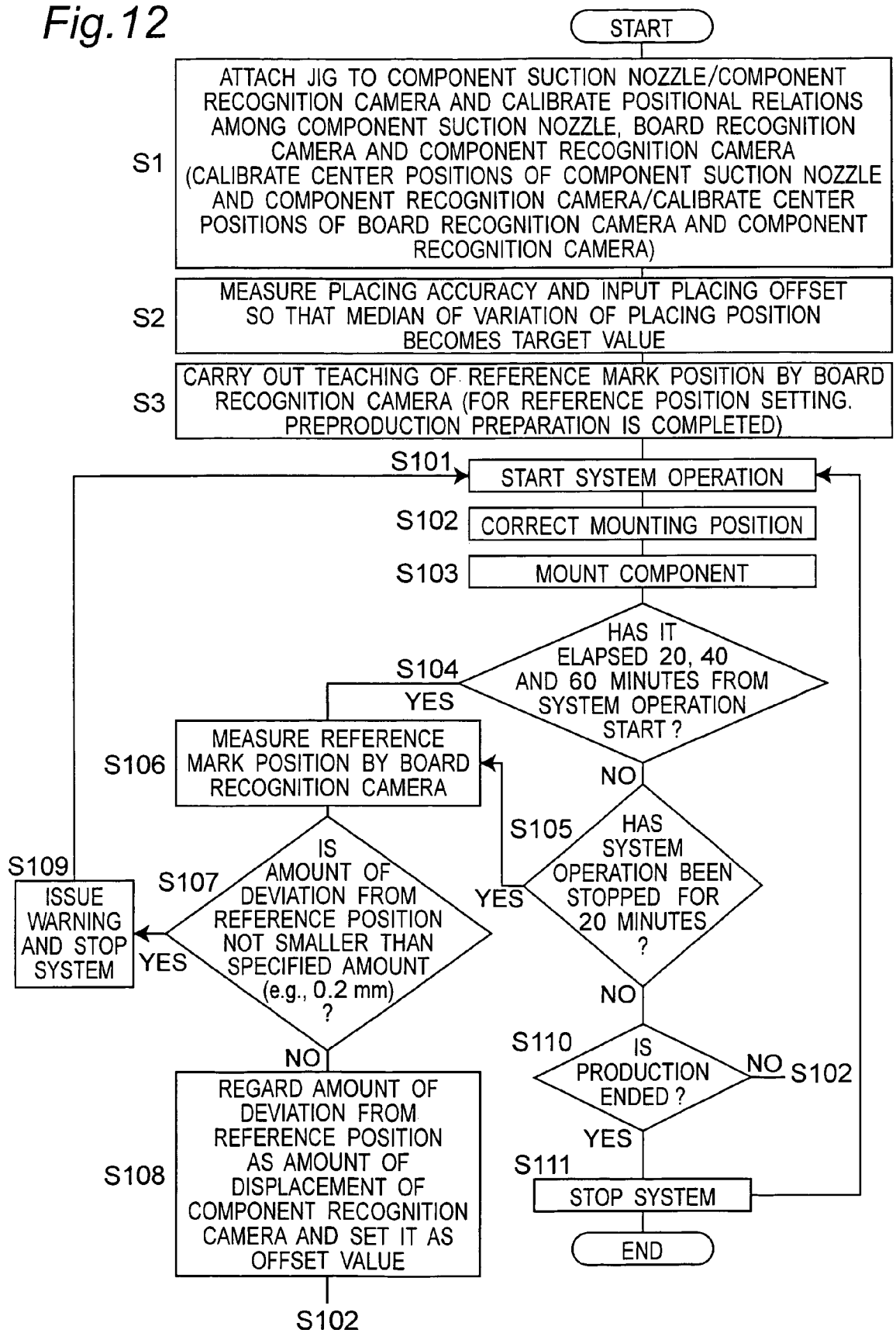
FIG. 12 is a flow chart for explaining a component mounting method carried out by the component mounting apparatus shown in FIG. 1.

In steps S1 through S3 shown in FIG. 12, as a preparation for continuously operating the component mounting apparatus 100, various calibration data are obtained.

That is, first of all, in step S1, obtained are the relative positional relations among the component suction nozzle 1361, the board recognition camera 140, and the component recognition camera 150, i.e., displacements between the center of the component suction nozzle 1361 and the center of the board recognition camera 140 in the X-axis direction 51 and the Y-axis direction 52, displacements between the center of the component suction nozzle 1361 and the center of component recognition camera 150 in the X-axis direction 51 and the Y-axis direction 52, and displacements between the center of the board recognition camera 140 and the center of the component recognition camera 150 in the X-axis direction 51 and the Y-axis direction 52.

Even if heat takes effect in the component mounting apparatus 100 of the first embodiment as described above, the displacement between the component suction nozzle 1361 and the board recognition camera 140 and the displacement of the position where the component recognition camera 150 is installed do not occur or come to have an ignorable amount of displacement with regard to the component mounting accuracy. Therefore, it is sufficient to carry out the displacement measurement operation of step S1 once before shipping, for example, after the completion of the component mounting apparatus 100. It is a matter of course that the user of the component mounting apparatus 100 can carry out the measurement operation, for example, before the start of everyday operation. It is to be noted that the operation of step S1 is executed under the control of the fundamental position determining section 172 of the control unit 170.

A concrete way to obtain the relative positional relations among the component suction nozzle 1361, the board recognition camera 140, and the component recognition camera 150 will be briefly described.

That is, as disclosed in, for example, Japanese unexamined patent publication No. H08-242094, a nozzle center measurement jig is attached to the component suction nozzle 1361, and the nozzle center measurement jig is image-picked up by the component recognition camera 150 to obtain nozzle center measurement jig image-pickup information. Moreover, a camera center position measurement jig provided with an image-pickup mark is attached to the component recognition camera 150 so that the mark is included in the image-pickup visual field of the component recognition camera 150, and the image-pickup mark is image-picked up by both the board recognition camera 140 and the component recognition camera 150 to obtain camera center measurement jig image-pickup information. Then, on the basis of the nozzle center measurement jig image-pickup information and the camera center measurement jig image-pickup information, the relative positional relations among the component suction nozzle 1361, the board recognition camera 140, and the component recognition camera 150 are obtained. By carrying out correction using the obtained relative positional relations, the center of the component suction nozzle 1361 and the image-pickup center of the component recognition camera 150 can be made to coincide with each other in operation, and the image-pickup center of the board recognition camera 140 can be located on a straight line that extends through the center of each component suction nozzle 1361.

Further, the positional relation between the component suction nozzle 1361 and the board recognition camera 140 among the relative positional relations obtained as described above is the amount of displacement that is not changed or ignorable due to heat in the component mounting apparatus 100 of the first embodiment. Moreover, as described in connection with the structure of the X-Y robot 120, the X-Y robot 120 moves only in the Y-axis direction 52 and the X-axis direction 51 due to heat, and the conventional deformation such as warp does not occur. Therefore, in order to obtain the expansion and contraction of the X-Y robot 120 due to the effect of heat after the start of the operation of the component mounting apparatus 100, it is sufficient to merely image-pick up only the camera reference mark 160 as described later, and the amount of displacement obtained from the result of image-pickup the camera reference mark 160 can be regarded as the amount of expansion and contraction of the X-Y robot 120. Therefore, after the start of the operation of the component mounting apparatus 100, the amount of expansion and contraction of the X-Y robot 120 can be obtained by the image-pickup operation of the camera reference mark 160. Therefore, by carrying out the correction of the placing position in consideration of the amount of expansion and contraction, the electronic component 62 can be mounted in the prescribed placing position with high accuracy.

In the next step S2, an electronic component 62 is experimentally mounted on the circuit board 61 and the placing accuracy is measured before starting the continuous mounting operation in the component mounting apparatus 100 or, for example, before the start of everyday operation, and a placing offset is set and inputted so that the median of variation in the placing position comes to have the target value.

In the next step S3, for example, continuous imaging is carried out for about one hour, and after the component mounting apparatus 100 enters a steady operating state, the camera reference mark 160 is image-picked up by the board recognition camera 140. The expansion/contraction amount determining section 171 of the control unit 170 obtains displacements in the X-axis direction 51 and the Y-axis direction 52 at the center of the board recognition camera 140 of which the absolute position has been obtained in step S1 and the center of the camera reference mark 160 on the basis of the camera reference mark image-pickup information. Further, the expansion/contraction amount determining section 171 stores the obtained displacement information as the amount of initial expansion and contraction as the reference position of the X-Y robot 120 immediately before starting the continuous operation.

In steps S2 and S3, the preparatory operation prior to the start of the continuous operation ends. Subsequently, the continuous operation is carried out in steps 101 through 111.

In step S101, the continuous operation of the component mounting apparatus 100 is started. That is, after the circuit board 61 is loaded by the circuit board conveyance unit 190 according to the so-called mounting program of NC data or the like, the X-Y robot 120, the component placing head 140, and the component feeding unit 180 are driven in step S103, and electronic components 62 are successively mounted in the placing positions of the circuit board 61. At this time, in step S102, on the basis of not only the relative positional relations among the component suction nozzle 1361, the board recognition camera 140, and the component recognition camera 150 obtained in step S1 but also the amount of displacement of the board position obtained by image-picking up the board mark 61a of the circuit board 61 by means of the board recognition camera 140 and the amount of displacement of the component position obtained by image-picking up the electronic component 62 held by the component suction nozzle 1361 by means of the component recognition camera 150, the amount of correction with respect to the prescribed placing position of the mounting program is obtained. It is to be noted that the amount of displacement of the component contains the angle of displacement of the electronic component 62 in the circumferential direction around the axis of the component suction nozzle 1361, i.e., the so-called direction of θ.

The amount of displacement of the component obtained by image-picking up by means of the component recognition camera 150 is consistently the amount of displacement of the electronic component 62 with respect to the component suction nozzle 1361. That is, since the component suction nozzle 1361 is holding the electronic component 62, the component recognition camera 150 is able to image-pick up the electronic component 62 but unable to image-pick up the component suction nozzle 1361 that is holding the electronic component 62. Therefore, the amount of displacement of the component position obtained by the recognition operation of the component recognition camera 150 becomes the amount of displacement of the electronic component 62 with respect to the component suction nozzle 1361. However, as already described, since the relative positional relation between the component suction nozzle 1361 and the component recognition camera 150 has been determined through the operation of step S1, it is only required to perceive the amount of displacement of the electronic component 62 with respect to the component suction nozzle 1361.

Furthermore, the relative positional relation between the board recognition camera 140 and the component recognition camera 150 has already been known through the operation of step S1, and the displacement such that influence is exerted on the component mounting accuracy between the component suction nozzle 1361 and the board recognition camera 140 does not occur in the first embodiment as described above.

Therefore, the displacement information obtained by recognizing the camera reference mark 160 by the board recognition camera 140 can be regarded as the displacement information of the component recognition camera 150 and the component suction nozzle 1361 due to the thermal expansion and contraction of the X-Y robot 120 in operation. That is, in order to obtain the displacement between the component recognition camera 150 and the component suction nozzle 1361 due to the thermal expansion and contraction of the X-Y robot 120 in operation in the component mounting apparatus 100, it is proper to recognize the camera reference mark 160 by the board recognition camera 140.

Moreover, in the component mounting apparatus 100 of the first embodiment as described above, it is only required to recognize the camera reference mark 160 in order to obtain the displacement between the component recognition camera 150 and the component suction nozzle 1361. Therefore, it is not required to prepare a jig as described in Japanese unexamined patent publication No. H08-242094 during the operation of the component mounting apparatus 100, and the operability can be improved further than in the conventional component mounting apparatus.

As described above, the amount of displacement between the component recognition camera 150 and the component suction nozzle 1361 obtained on the basis of the recognition operation of the camera reference mark 160 is used for correcting the amount of displacement of the component obtained on the basis of the recognition operation of the electronic component 62 by means of the component recognition camera 150. That is, when obtaining the amount of displacement of the component, the control unit 170 uses the amount of initial expansion and contraction of the X-Y robot 120 obtained in step S3 as the amount of correction. That is, when moving the electronic component 62 held by the component suction nozzle 1361 to the component recognition camera 150, the movement is achieved by subjecting the prescribed amount of movement on the mounting program to the correction of the amount of initial expansion and contraction. By carrying out the correction, the displacement attributed to the thermal expansion and contraction can be removed, and the center of the component suction nozzle 1361 and the center of the component recognition camera 150 can be made to coincide with each other. Therefore, if the amount of displacement of the component and the amount of displacement of the board obtained by the component recognition by means of the component recognition camera 150 are corrected, then the electronic component 62 is to be mounted in the prescribed placing position on the mounting program. Therefore, the component mounting is carried out by executing the operation control of the X-Y robot 120 and the component suction head 1361 so that the electronic component 62 is mounted in the prescribed placing position in consideration of the correction (step S103).

Moreover, as is apparent from the above description, the amount of movement of the X-Y robot 120 to make the board recognition camera 140 recognize the camera reference mark 160 and the amount of movement of the X-Y robot 120 to make the component recognition camera 150 recognize the electronic component 62 held by the component suction nozzle 1361 are preferably identical as far as possible in order not to cause an error attributed to the amount of movement of the X-Y robot 120. Therefore, in the first embodiment, the component recognition camera 150 and the camera reference mark 160 are arranged as near as possible.

When the component mounting operation is continued as described above, it is determined in step S104 whether or not it has elapsed, for example, 20 minutes, 40 minutes, and 60 minutes from the start of the continuous operation of the component mounting apparatus 100. Moreover, if such time has not elapsed, it is determined in step S105 whether or not the component mounting apparatus 100 has been stopped for, for example, 20 minutes after the start of the continuous operation. When the aforementioned prescribed time has elapsed in step S104 or when the system has stopped for the prescribed time in step S105, it is assumed that the X-Y robot 120 expands or contracts due to heating or cooling, and the camera reference mark 160 is image-picked up again by the board recognition camera 140 in step S106. Then, displacements in the X-axis direction 51 and the Y-axis direction 52 at the center of the board recognition camera 140 and the center of the camera reference mark 160 are obtained again on the basis of the camera reference mark image-pickup information, and the obtained displacements are determined as the update amount of expansion or contraction.

Then, in the next step S107, the expansion/contraction amount determining section 171 compares the amount of initial expansion and contraction obtained in the step S3 with the update amount of expansion and contraction obtained in step S106. If the difference value of the comparison result deviates more than the set value of, for example, 0.2 mm, then warning is issued as the occurrence of an abnormal deviation in step S109, and the system is stopped. As described above, since the component mounting within an error range of, for example, ±70 μm is currently required, the occurrence of the deviation greater than 0.2 mm in the X-axis direction 51 or the Y-axis direction 52 due to heat can be regarded as the occurrence of abnormality.

If the difference value of the comparison result is smaller than the set value, then the update amount of expansion and contraction can be considered to be ascribed to the expansion and contraction of the X-Y robot 120 due to heat caused by the operation. Therefore, the update amount of expansion and contraction obtained this time is updated as the amount of initial expansion and contraction in step S108.

The reason why only the image-pickup results of the camera reference mark 160 by means of the board recognition camera 140 can be regarded as the amounts of expansion and contraction in the X-axis direction 51 and the Y-axis direction 52 due to heat of the X-Y robot 120 is as described above.

If the system has not been stopped for the prescribed time in step S105 or after undergoing the updating operation by the update amount of expansion and contraction in step S108, the program flow proceeds to step S102 again.

It is determined in step S110 whether or not the component mounting has been completed entirely for a set number of circuit boards 61, and the program flow proceeds to step S111 when the operation is entirely completed, and then, the system stops. If the operation has not yet been completed, then the program flow returns again to step S102.

The component mounting operation is carried out as described above.

The fact that the component mounting accuracy in the component mounting apparatus 100 is improved in comparison with the conventional case will be described below with reference to experimental data.

Figure 22:
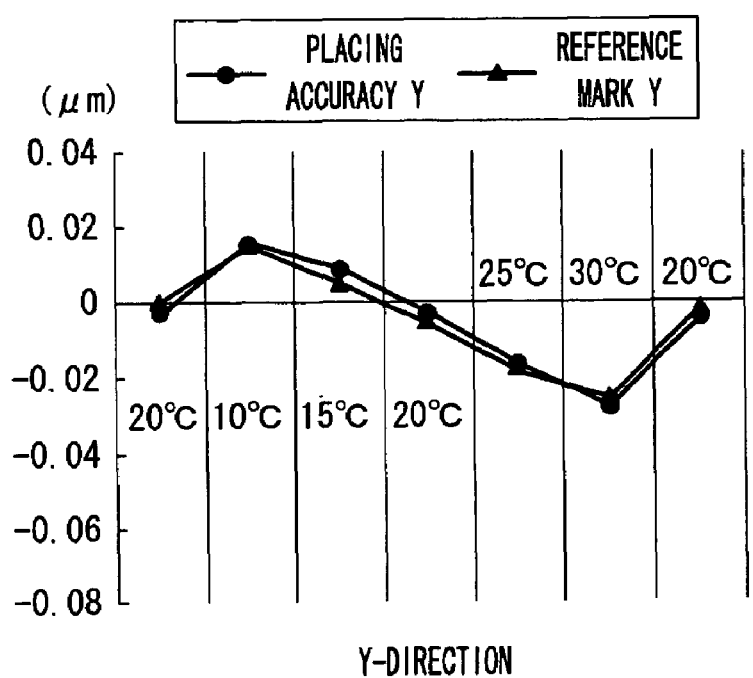
FIG. 22 is a graph showing the displacements of the camera reference mark and the placing position accuracy in the Y-axis direction according to a change in the ambient temperature in the component mounting apparatus shown in FIG. 1.
Figure 23:
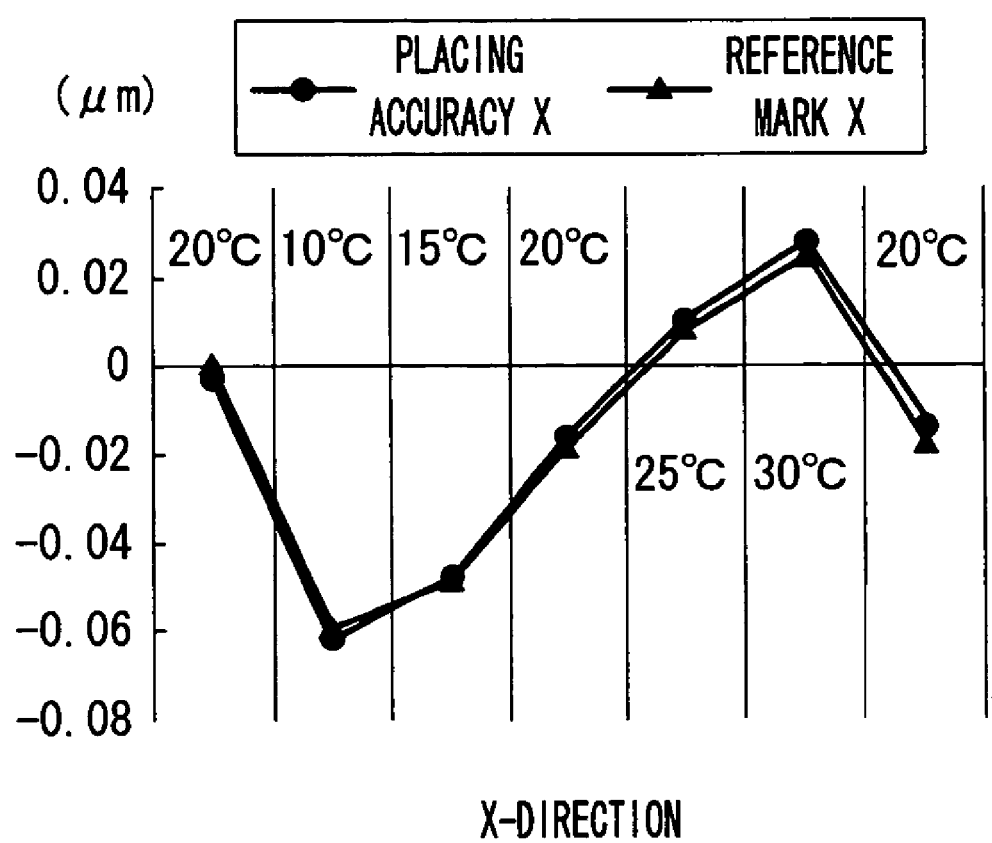
FIG. 23 is a graph showing the displacements of the camera reference mark and the placing position accuracy in the X-axis direction according to a change in the ambient temperature in the component mounting apparatus shown in FIG. 1.

Referring to FIGS. 22 and 23, in the component mounting apparatus 100, the X-Y robot 120 is operated at an ambient temperature of 20° C., and the camera reference mark 160 is image-picked up by the board recognition camera 140 and subjected to the correction in step S102 and the correction in step S106. Subsequently, the ambient temperature was lowered to 10° C., and thereafter, the ambient temperature was changed in increments of 5° C. up to 30° C. Under the above-mentioned conditions, the amount of displacement of the camera reference mark 160 recognized by the board recognition camera 140 and the amount of deviation of the median of the placing accuracy were measured at each of the temperatures. FIG. 22 shows measurement results in the Y-axis direction 52, and FIG. 23 shows measurement results in the X-axis direction 51. As is apparent from FIGS. 22 and 23, it can be understood that the amount of displacement of the camera reference mark 160 and the amount of deviation of the median of the placing accuracy approximately coincide with each other in the Y-axis direction 52 and the X-axis direction 51 even when the ambient temperature is changed, and that the expansion and contraction due to heat of the X-Y robot 120 occur only in the Y-axis direction 52 and the X-axis direction 51.

As described above, according to the component mounting apparatus 100 of the first embodiment, the expansion and contraction due to heat of the X-Y robot 120 occur only in the Y-axis direction 52 and the X-axis direction 51, and no rotational deviation occurs around the Z-axis. Therefore, it is sufficient to provide only one camera reference mark 160, which is correspondingly provided adjacent the component recognition camera 150, as described above, and it is not required to arrange two camera reference marks for one component recognition camera and obtain the angle of rotational deviation by recognizing the two camera reference marks.

Figure 25:
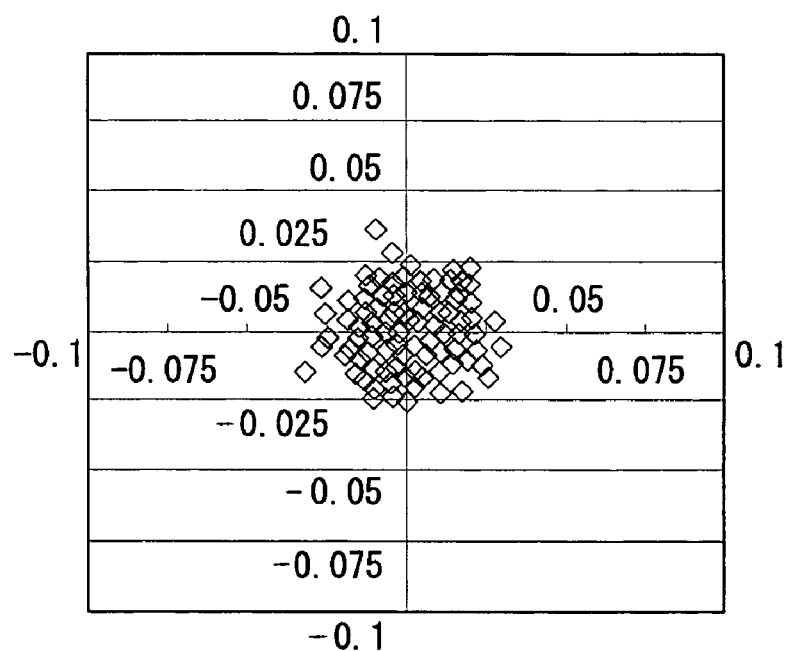
FIG. 25 is a graph showing variation in the placing position with respect to a prescribed position when component mounting is carried out by the component mounting apparatus shown in FIG. 1.
Figure 26:
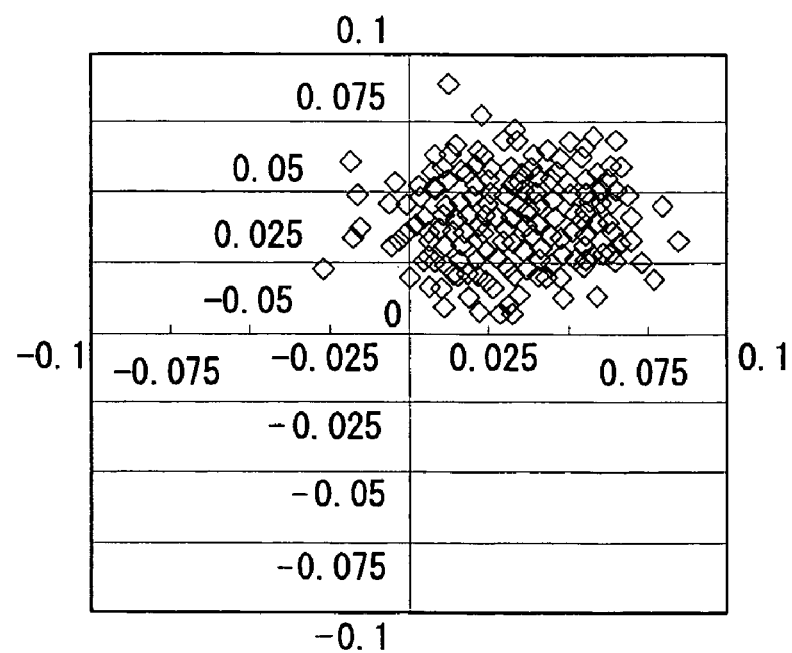
FIG. 26 is a graph showing variation in the placing position with respect to a prescribed position when component mounting is carried out by the conventional component mounting apparatus.
Figure 27:
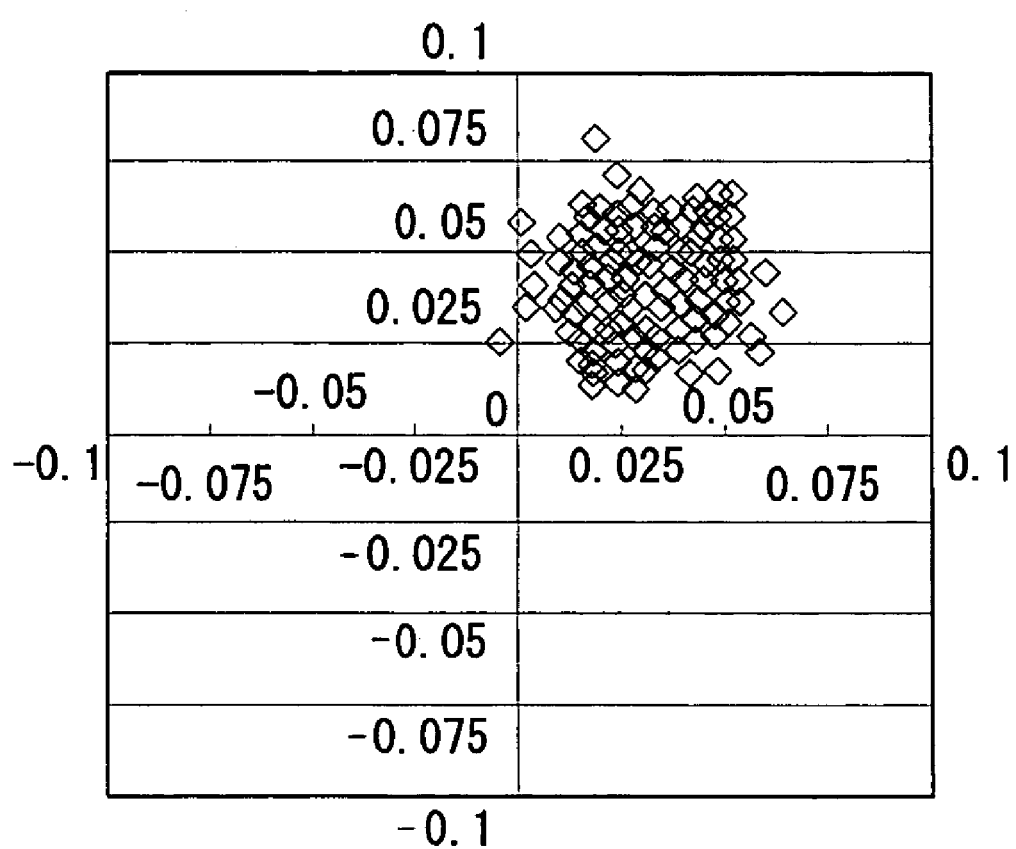
FIG. 27 is a view showing variation in the placing position with respect to a prescribed position when component mounting is carried out by the conventional component mounting apparatus.
Figure 28:
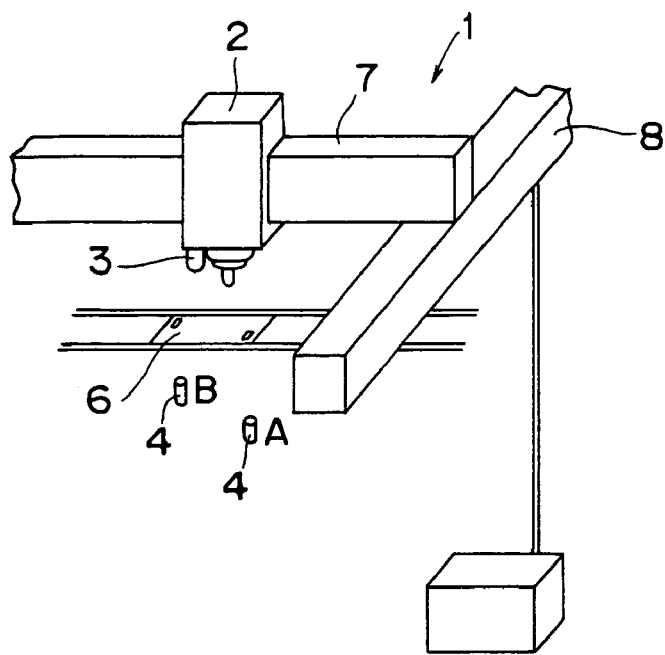
FIG. 28 is a perspective view showing the conventional component mounting apparatus.
Figure 29:
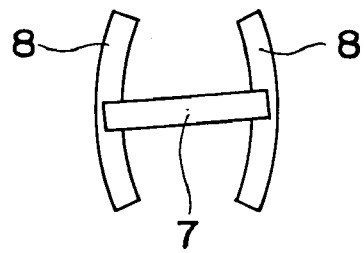
FIG. 29 is a view schematically showing the deformation of the X-Y robot due to the influence of heat in the conventional component mounting apparatus.
Figure 30:
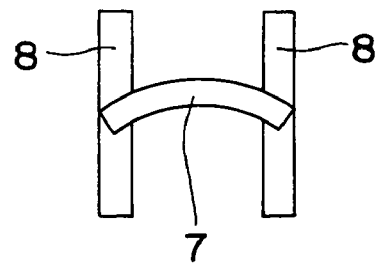
FIG. 30 is a view schematically showing the deformation of the X-Y robot due to the influence of heat in the conventional component mounting apparatus.

Further, FIGS. 25 through 27 show variation in the component placing position with the lapse of operating time of the component mounting time. The origin at the center of the graph means that an error between the prescribed placing position and the actual placing position is zero, and the plots gathering in the vicinity of the origin means that the variation is a little. FIG. 26 shows the case of the conventional component mounting apparatus, in which the center of the range of the variation deviates from the origin with the lapse of the operating time, and the range is also expanded. Therefore, it can be understood that the amount of displacement increases with the lapse of the operating time in the conventional component mounting apparatus. FIG. 27 shows the variation when the camera reference mark 160 is provided for the conventional component mounting apparatus, and the correction based on the camera reference mark 160 is carried out. In the case of FIG. 27, the range of variation is narrowed in comparison with the case of FIG. 26, whereas the center of the range of variation still deviates from the origin. On the other hand, FIG. 25 shows the case of the component mounting apparatus 100 of the first embodiment, in which the center of the range of variation is located in the vicinity of the origin, and the range of variation does not expand. As described above, it can be understood that the component mounting can be carried out with high accuracy by the component mounting apparatus 100 of the first embodiment in comparison with the conventional case also referring to FIG. 25.

A modification example of the component mounting apparatus 100 will be described next.

Figure 24:
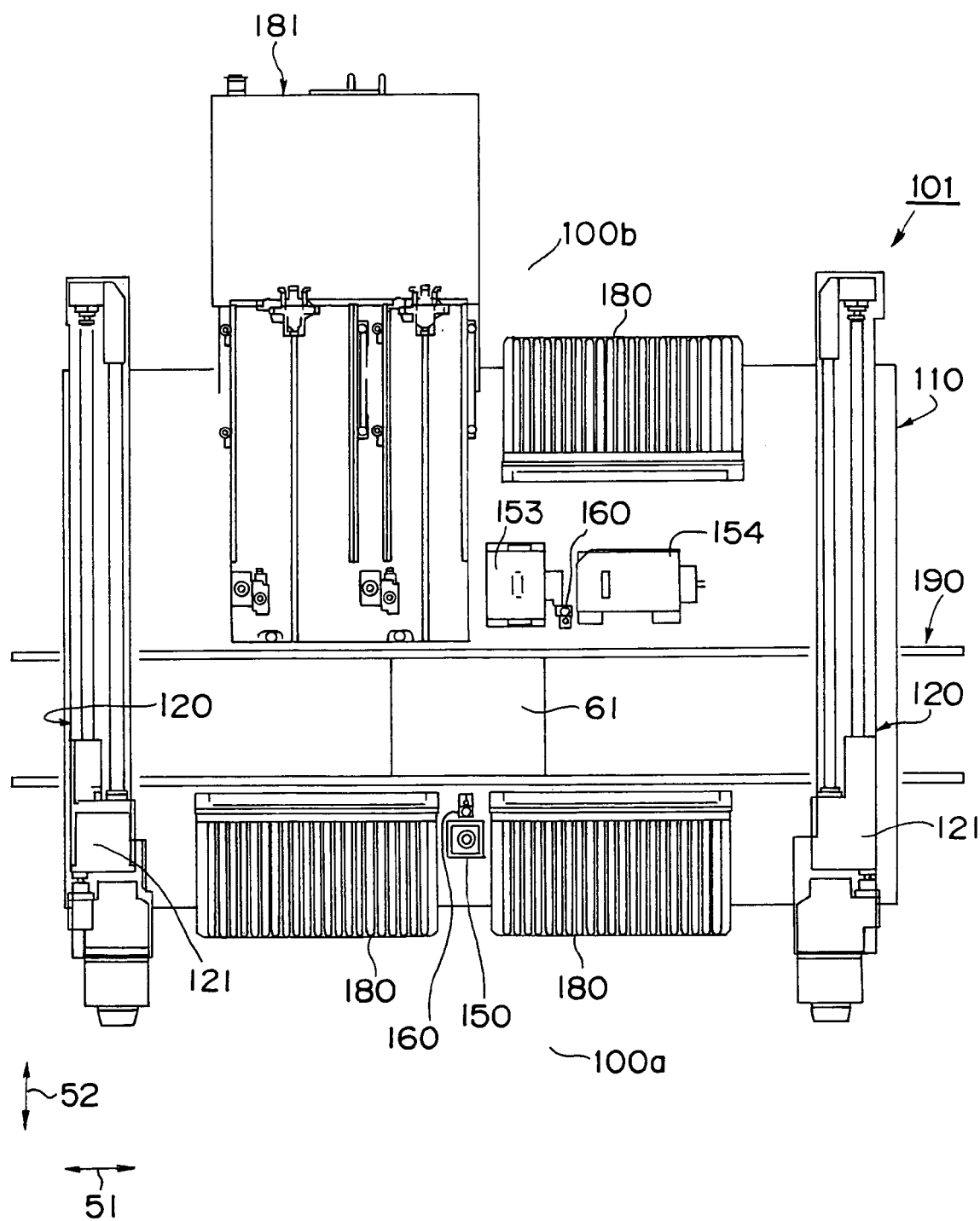
FIG. 24 is a plan view of a modification example of the component mounting apparatus shown in FIG. 1.

The component mounting apparatus 100 is provided with only the cassette type component feeding unit 180 having the tape reels. It is also acceptable to adopt the construction of, for example, a component mounting apparatus 101 as shown in FIG. 24. In FIG. 24, the X-axis robot 131 is not shown for the convenience of illustration. The component mounting apparatus 101 is also allowed to have a so-called tray type component feeding unit 181 to be able to feed large components and so on. Moreover, in addition to the component recognition camera 150, there are further provided a two-dimensional component recognition camera 153 that is able to obtain a two-dimensional pickup image-pick up of the electronic component 61 held by the component suction nozzle 1361 and has a resolution higher than that of the component recognition camera 150 as well as a three-dimensional component recognition camera 154 that is able to obtain a three-dimensional pickup image-pick up of the electronic component 61. Moreover, the component recognition camera 150 is arranged on the front side 100a, and the two-dimensional component recognition camera 153 and the three-dimensional component recognition camera 154 are arranged on the rear side 100b. Therefore, one more camera reference mark 160 is provided adjacent to the two-dimensional component recognition camera 153 and the three-dimensional component recognition camera 154.

It may be a case where the component recognition camera 150 image-picks up the electronic component 62 sucked from the component feeding unit 180 or 181 arranged on the rear side 100b or a case where the two-dimensional component recognition camera 153 and three-dimensional component recognition camera 154 image-pick up the electronic component 62 sucked from the component feeding unit 180 arranged on the front side 100a.

Moreover, because of the higher resolution of the two-dimensional component recognition camera 153, it is possible to eliminate the image-picking up by the component recognition camera 150 when the required accuracy is obtained as the result of image-picking-up by the two-dimensional component recognition camera 153.

Moreover, in the case where a plurality of camera reference marks 160 are provided as described above, if the aforementioned difference value is smaller than the set value as the result of carrying out the positional measurement of one camera reference mark 160 among the plurality of camera reference marks 160 by determination made in step 107, then the positional measurement of the other camera reference marks 160 may be eliminated.

According to the component mounting apparatus of the first aspect and the component mounting method of the second aspect of the present invention as described in detail above, the X-Y robot having a structure that is linearly deformed along the X-axis direction and the Y-axis direction when heat takes effect to cause no change in the relative position between the component holding member and the board recognition camera, the camera reference mark, and the control unit are provided. The amount of expansion and contraction of the X-Y robot due to heat is obtained by image-picking up the camera reference mark by means of the board recognition camera before and after the deformation of the X-Y robot due to heat, and the component placing position is corrected on the basis of the amount of expansion and contraction. As described above, the X-Y robot does not cause the displacement such as warp even if heat due to continuous operation takes effect and linearly deforms along only the X-axis direction and the Y-axis direction. Therefore, the component placing position is corrected on the basis of the amount of expansion and contraction of the X-Y robot due to heat obtained by image-picking up the camera reference mark, component mounting can be achieved with higher accuracy than in the conventional case. As described above, according to the component mounting apparatus and the component mounting method of the first aspect and the second aspect, the component mounting accuracy can be improved further than in the conventional case.

Moreover, components can be mounted with higher accuracy by correcting the component placing position in addition to the relative positions among the component holding member, the board recognition camera, and the component recognition camera for image-picking up the electronic component held by the component holding member.

Moreover, by forming the Y-axis robot of the X-Y robot on the chassis formed into an integrated structure by casting and making the Y-axis robot have the Y-ballscrew structure that expands and contracts only in the Y-axis direction, the expansion and contraction of the Y-axis robot can occur only in the Y-axis direction when heat takes effect.

Moreover, by providing the X-ballscrew structure that expands and contracts only in the X-axis direction due to heat on the X-frame whose both ends are fixed to the Y-axis robot, the X-ballscrew structure can be expanded and contracted in the X-axis direction when heat takes effect.

Moreover, by attaching the deformation prevention members to the X-frame, the X-frame can be prevented from deforming in the form of warp or the like due to heat, and this can contribute to the linear deformation of the X-Y robot only along the X-axis direction and the Y-axis direction.

Moreover, by providing the driving source for moving the component holding member in the Z-axis direction for every component holding member provided for the component placing head, it is possible to prevent the occurrence of the temperature gradient at the component placing head and the occurrence of a displacement in the distance between the component holding members, and this can contribute to the improvement of the component mounting accuracy.

Moreover, by equalizing the height positions of the camera reference mark and the circuit board, the focal distance when the board recognition camera image-picks up the camera reference mark and the board mark of the circuit board can be equalized, and the occurrence of an error attributed to the indistinctness of the pickup image-pick up can be prevented.

By providing the camera reference mark adjacent to the component recognition camera, the amount of movement of the X-Y robot between the image-pickup operation of the electronic component by means of the component recognition camera and the image-pickup operation of the camera reference mark by means of the board recognition camera can be reduced, and an increase in the error accompanying the movement of the X-Y robot can be reduced.

The present invention is not limited to the aforementioned embodiments but allowed to be implemented in various forms. For example, the following construction is acceptable.

As shown in FIGS. 31 through 34, a component mounting apparatus 100 capable of carrying out the component mounting method according to the second embodiment of the present invention can be provided with the basic constituents of a chassis 110, an X-Y robot 120, a board recognition camera 140, a component recognition camera 150, and a control unit 170 and further with component feeding units 180 and a board conveyance unit 190.

Figure 34:
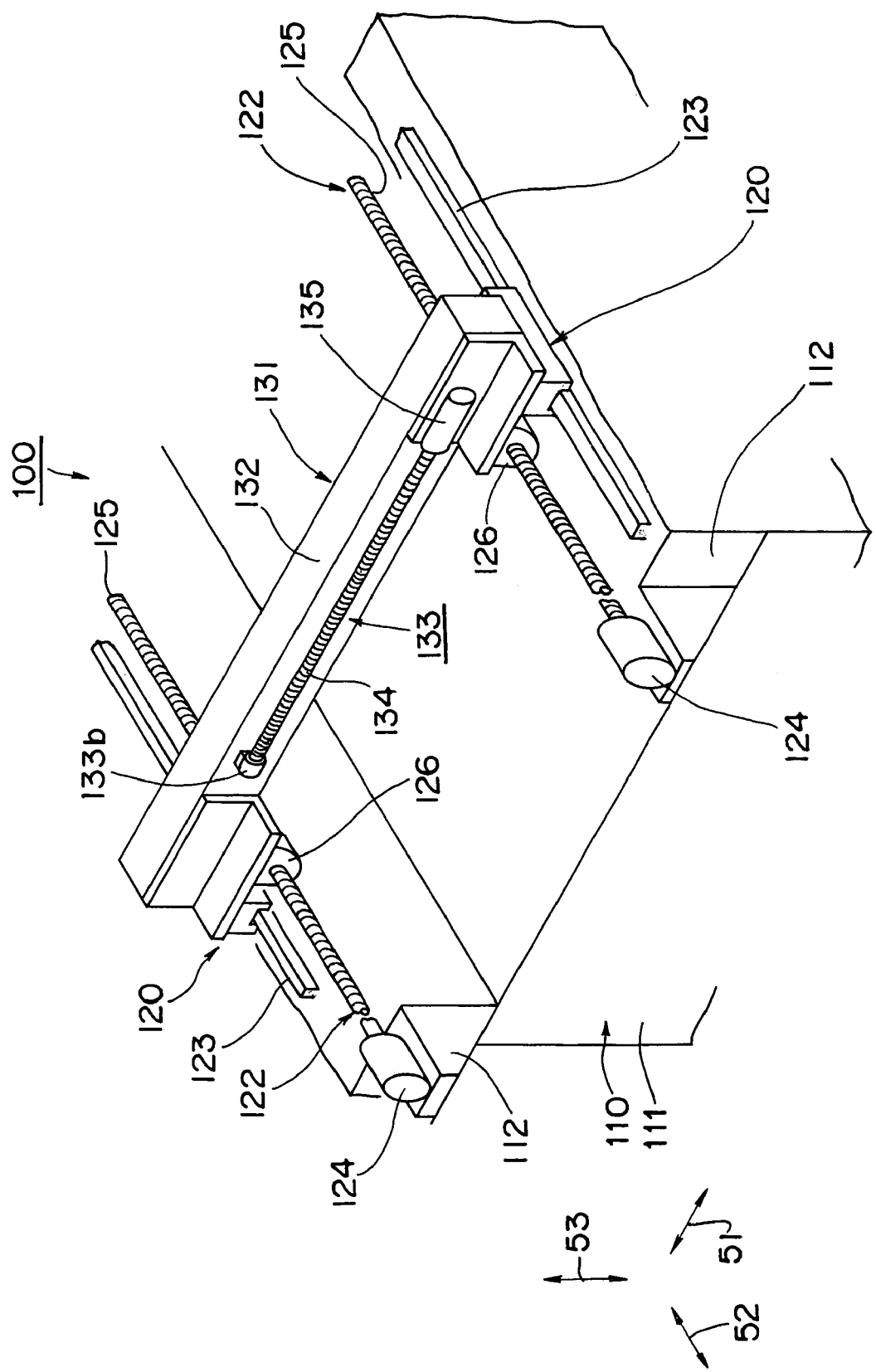
FIG. 34 is a conceptual diagram of a chassis and an X-Y robot provided for the component mounting apparatus shown in FIG. 31.

The chassis 110 is a base on which the X-Y robot 120, the component recognition camera 150, the control unit 170, the component feeding unit 180, and the board conveyance unit 190 are installed, and is constructed of a rectangular parallelepiped base section 111 and Y-axis robot leg sections 112. The base section 111 and the Y-axis robot leg sections 112, i.e., the chassis 110 is formed into an integrated structure by casting. The Y-axis robot leg sections 112 protrude from the base section 111 at both end portions of the base section 111 in the X-axis direction 51 and extend along the Y-axis direction 52 perpendicular to the X-axis direction 51. On each of the Y-axis robot leg sections 112 is installed a linear guide 123 or the like at the Y-axis robot 121, which constitutes the X-Y robot 120 and is described in detail later. Each linear guide 123 that serves as the guide support member of the nut section 126 of FIG. 34 is installed on the Y-axis robot leg section 112 along a linear guide installation surface 123a formed at each Y-axis robot leg portion 112 along the Y-axis direction 52, and as described above, the Y-axis robot leg portions 112 are formed into a structure integrated with the base section 111 by casting.

The X-Y robot 120 has two Y-axis robots 121 arranged parallel along the Y-axis direction 52 and one X-axis robot 131 arranged on the two Y-axis robots 121 along the X-axis direction 51 perpendicular to the Y-axis direction 52 on the Y-axis robot leg portions 112, i.e., on the chassis 110 molded into the integrated structure by casting.

Figure 31:
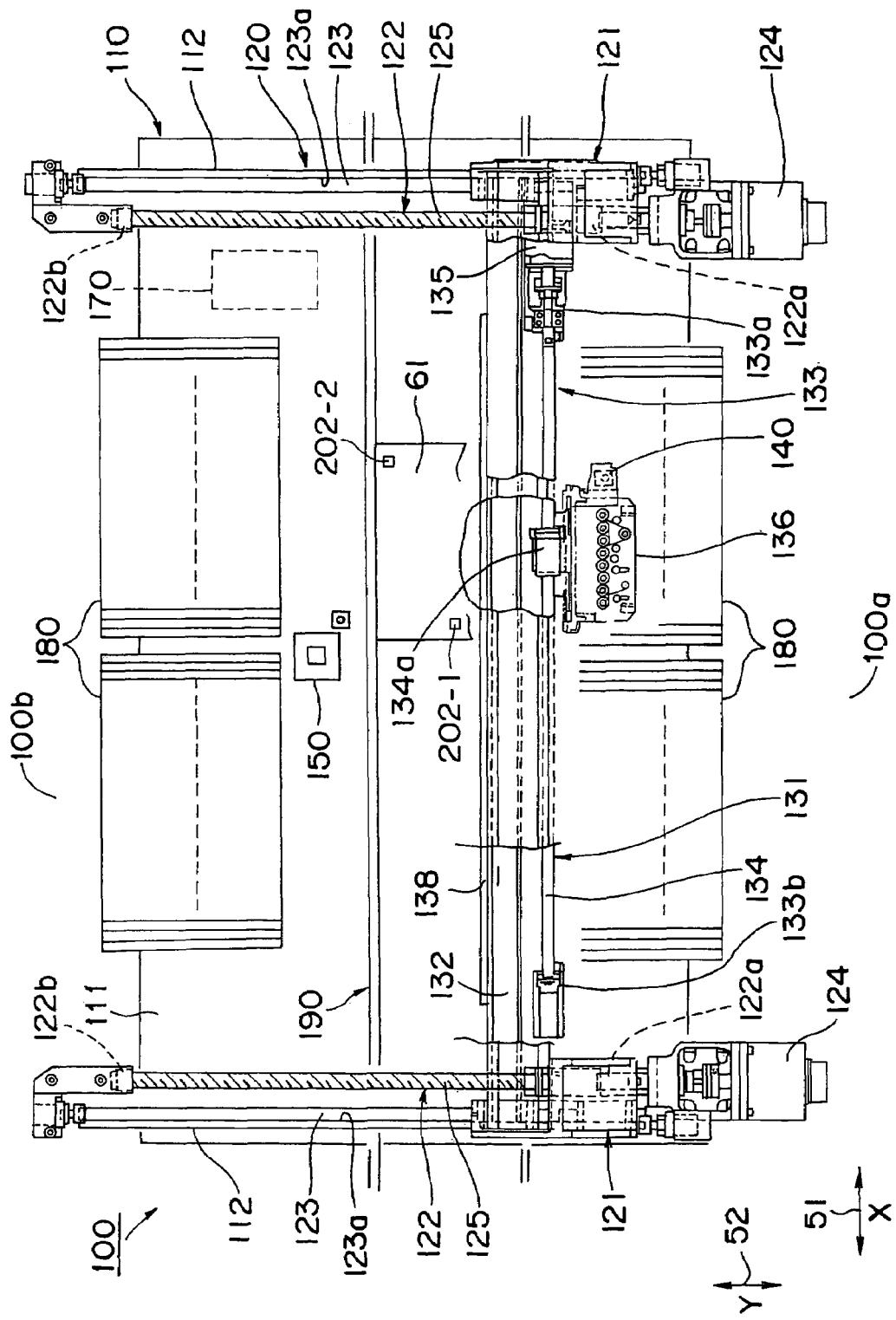
FIG. 31 is a plan view of a component mounting apparatus capable of carrying out a component mounting method according to a second embodiment of the present invention.
Figure 32:
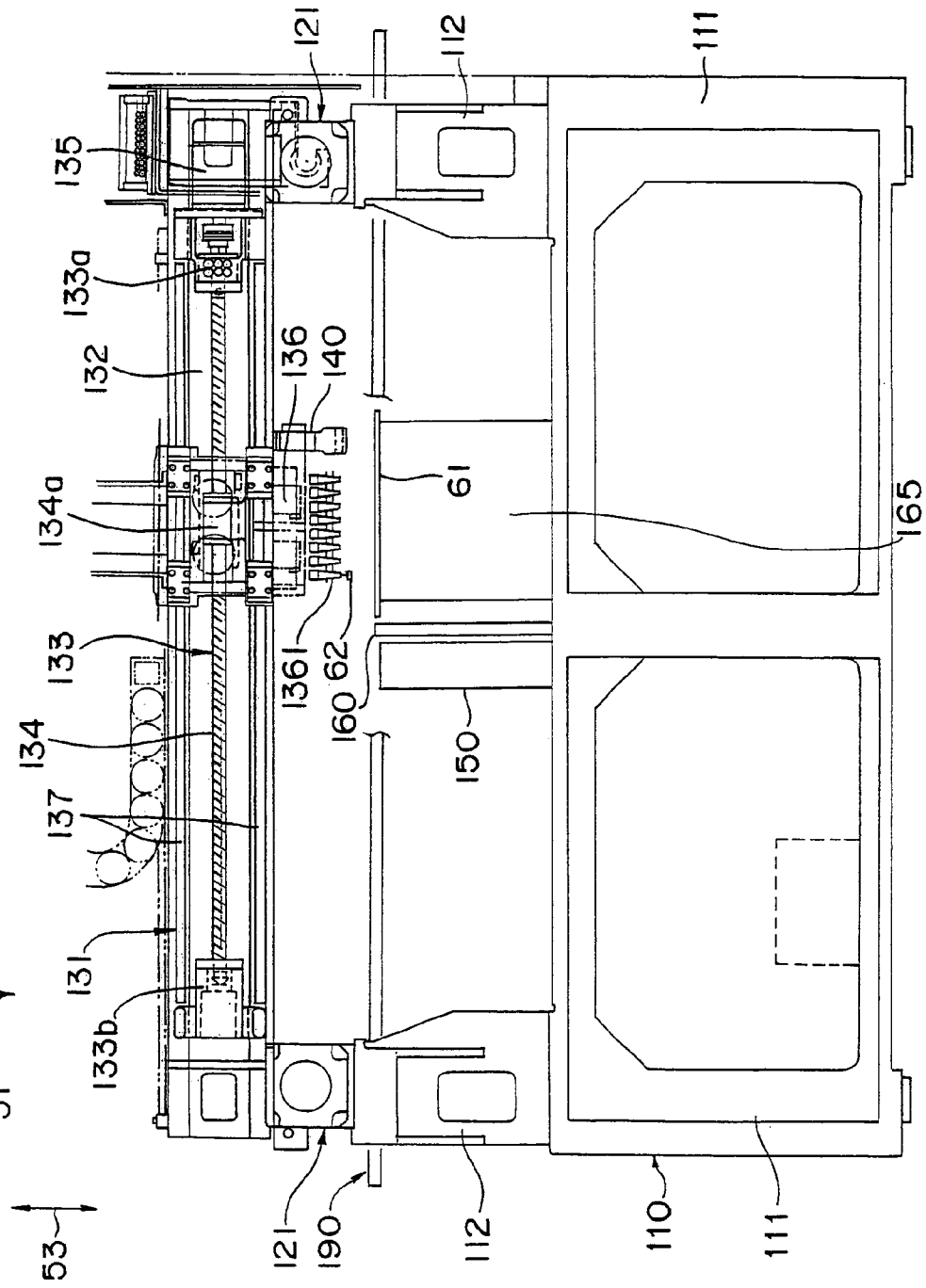
FIG. 32 is a front view of the component mounting apparatus shown in FIG. 31.
Figure 33:
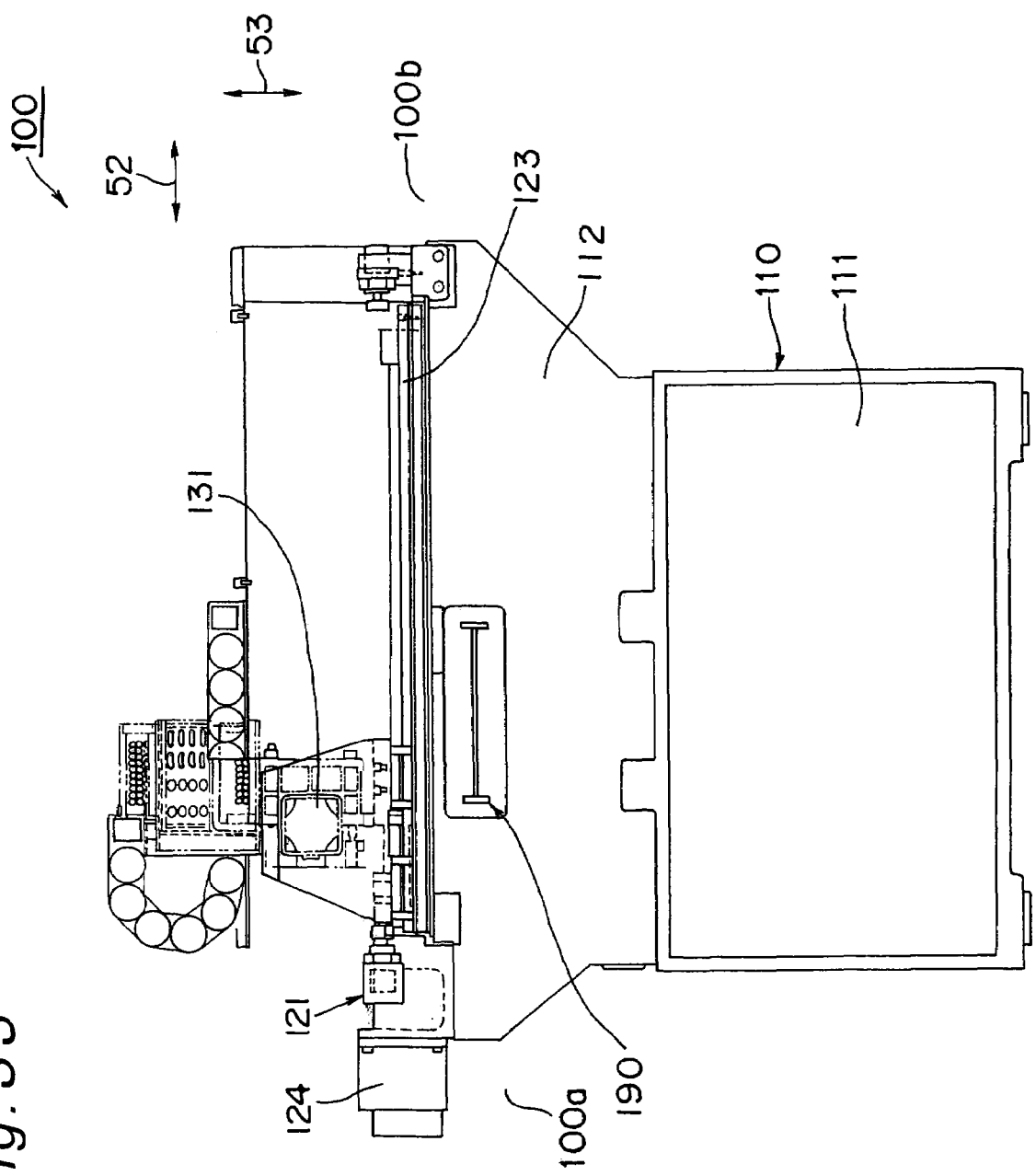
FIG. 33 is a right side view of the component mounting apparatus shown in FIG. 31.

Each of the Y-axis robots 121 has a Y-axis ballscrew structure 122 and the linear guide 123. The Y-axis ballscrew structure 122 linearly expands and contracts only in the Y-axis direction 52 due to heat with its one end 122a serving as a fixed end and the other end 122b serving as a support end, and moves the X-axis robot 131 in the Y-axis direction 52. If a detailed description is made, as shown in FIGS. 31 and 34, a motor 124 that is fixed to the Y-axis robot leg section 112 and serves as the driving source of the ballscrew 125 is provided at the one end 122a of the Y-axis ballscrew structure 122 and connected to the ballscrew 125. The other end 122b supports the ballscrew 125 rotatably in its circumferential direction and extendibly in the axial direction, i.e., in the Y-axis direction 52 and is fastened to the Y-axis robot leg section 112.

When the Y-axis robot 121 constructed as above is continuously operated, the portions that generate heat are the ballscrew 125 and the motor 124, and the other end 122b permits the expansion and contraction of the ballscrew 125 in the Y-axis direction 52 due to heat. Moreover, since the motor 124 is fixed to the chassis 110 of the integrated structure as described above, the expansion and contraction of each Y-axis robot 121 due to heat, i.e., the thermal expansion and contraction can be made linear only in the Y-axis direction 52. Moreover, since the two Y-axis robots 121 operate the same, the amounts of thermal expansion and contraction of the Y-axis robots 121 in the Y-axis direction 52 become equalized.

Moreover, a nut section 126 is attached around the ballscrew 125 of each Y-axis robot 121 as shown in FIG. 34, and the nut sections 126 move in the Y-axis direction 52 by the rotation of the respective ballscrews 125. The X-axis robot 131, which constitutes the X-Y robot 120, is arranged between the nut sections 126 along the X-axis direction 51. Since the amounts of expansion and contraction of the Y-axis robots 121 in the Y-axis direction 52 are the same as described above, the X-axis robot 131 arranged between the nut sections 126 can be moved in the Y-axis direction 52 parallel to the X-axis.

It is to be noted that FIG. 34 is a view conceptually showing the structures of the chassis 110 and the X-Y robots 120, and the component placing head described later is not shown. Moreover, the component feeding units 180 are not shown in FIGS. 32 through 34.

The X-axis robot 131 has an X-axis frame 132 and an X-ballscrew structure 133. The X-axis frame 132 has both ends fixed to the nut sections 126 of the respective ballscrew structures 122 of the Y-axis robots 121 and extends in the X-axis direction 51 as described above. The X-ballscrew structure 133 is formed on the X-axis frame 132 and expands and contracts linearly only in the X-axis direction 51 due to heat with its one end 133a serving as a fixed end and another end 133b serving as a support end. A component placing head 136 that serves as one example of the component holding head is further attached to move the component placing head 136 in the X-axis direction 51.

The X-frame 132 is a member made of aluminum into an almost square pillar configuration, and both ends are fixed to the nut sections 126 as described above. A motor 135, which serves as a driving source of the ballscrew 134 and is fixed to the X-frame 132 as shown in FIG. 34 and so on, is provided at the one end 133a of the X-ballscrew structure 133 formed on a side surface of the X-frame 132 and connected to the ballscrew 134. The other end 133b is fastened to the X-frame 132 while supporting the ballscrew 134 rotatably in the circumferential direction thereof and extendibly in the axial direction thereof, i.e., in the X-axis direction 51. When the X-axis robot 131 is continuously operated, the portions that generate heat are the ballscrew 134 and the motor 135, and the other end 133b permits the expansion and contraction of the ballscrew 134 in the X-axis direction 51 due to heat.

Moreover, as shown in FIG. 31, a nut section 134a for fastening the component placing head 136 is attached around the ballscrew 134, and the nut section 134a, i.e., the component placing head 136 moves in the X-axis direction 51 by the rotation of the ballscrew 134.

Figure 35:
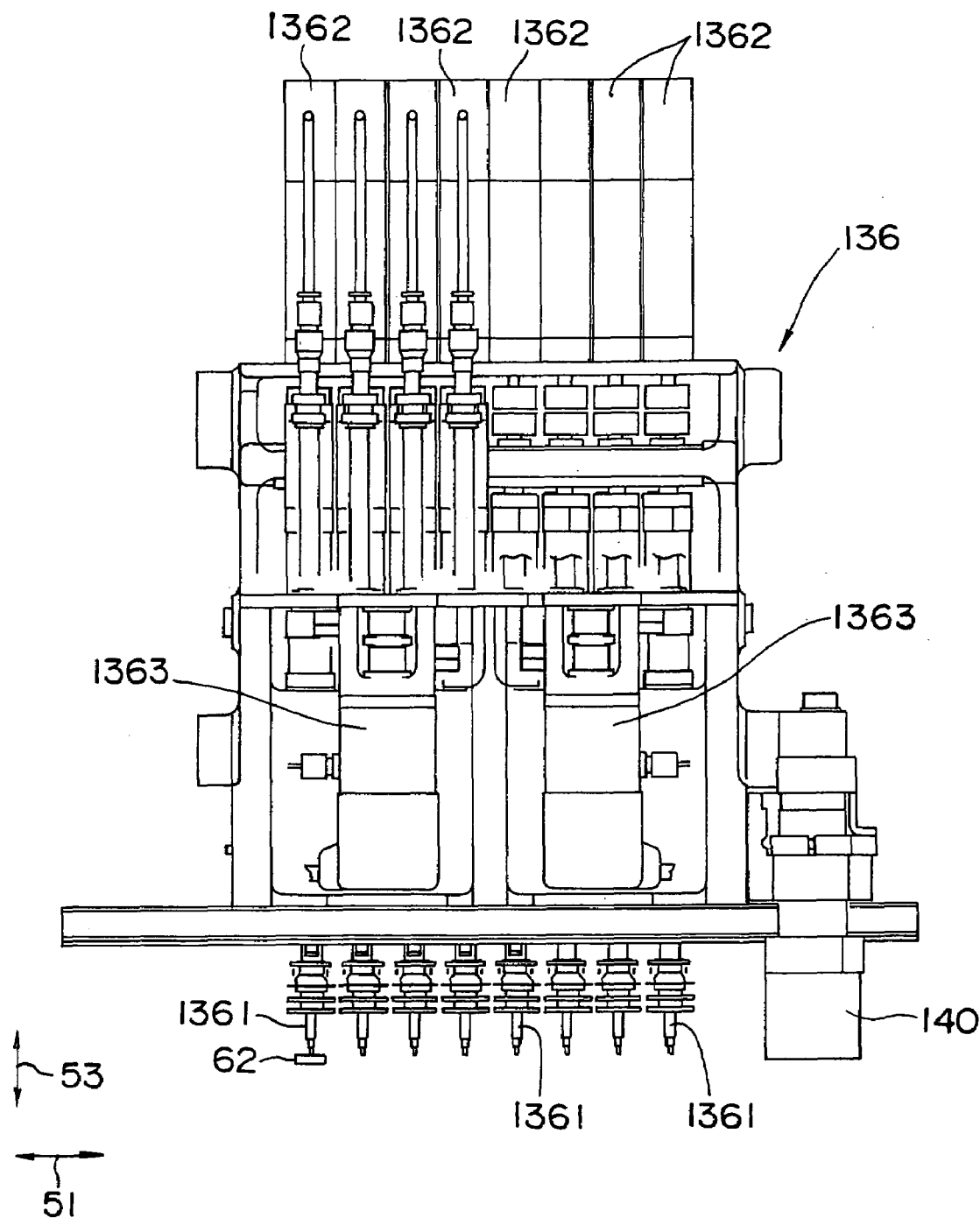
FIG. 35 is a front view of a component placing head of the X-axis robot provided for the component mounting apparatus shown in FIG. 31.

The component placing head 136 has component suction nozzles 1361 as one example that produce the function of the component holding members for holding electronic components 62, and a board recognition camera 140 for image-picking up board reference position calculation marks 202-1 and 202-2 that are located on the circuit board 61 to confirm the displacement of a circuit board 61 that is loaded and placed and image-picking up placing region reference marks 201 arranged at regular intervals of a placing region reference mark recognition reference board 200 described later in the second embodiment. As shown in detail in FIG. 35, with regard to the component suction nozzles 1361, eight component suction nozzles 1361 are provided in a straight line along the X-axis direction 51 in the second embodiment. It is to be noted that the electronic component 62 is a small component of a chip component or the like, or a large component of QFP or the like; or the like. Therefore, the component suction nozzles 1361 of optimum sizes and configurations are attached in correspondence with various components to be sucked. As described above, the board recognition camera 140 is arranged so that the image-pickup center of the board recognition camera 140 is located coaxially with a straight line that extends through the center of the component suction nozzles 1361 arranged along the X-axis direction 51. Moreover, a rotary motor 1363 for rotating each of the component suction nozzles 1361 in the circumferential direction of its axis is further provided for the component placing head 136.

Each of the component suction nozzles 1361 needs to be moved in the axial direction of the component suction nozzle 1361, i.e., along the Z-axis direction 53 in order to suck the electronic component 62 from the component feeding unit 180 and mount the sucked electronic component 62 on the circuit board 61 that serves as one example of the component mounting circuit board. In the second embodiment, a moving motor 1362, which serves as one example and that functions as a driving source for moving the component holding member, is provided for each component suction nozzle 1361 to move the component suction nozzle 1361 that serves as one example of the component holding member at the component placing head 136. Therefore, a low power motor can be used and the amount of heat generation from the motor can be suppressed in comparison with the conventional case where all of the plurality of component suction nozzles have been driven by one high power motor. As one working example, the moving motor 1362 has an output of 20 W, and scarce heat is generated from the moving motor 1362. Furthermore, in the conventional case where the high power motor with large amount of heat generation is singly provided, a temperature gradient in accordance with the distance from the high power motor occurs in the conventional component placing head, and distances between the component suction nozzles are disadvantageously varied in the direction of the array due to the difference in the thermal expansion and contraction. In contrast to this, by virtue of the provision of the moving motor 1362 for each of the component suction nozzles 1361 in the second embodiment, scarce heat is generated from each moving motor 1362, and if heat generation occurs, there occurs no such a temperature gradient that exerts influence on the component mounting accuracy at the component placing head 136. Therefore, even if the component placing head 136 is continuously operated, the distances between the component suction nozzles 1361 can be maintained equal or almost equal in the X-axis direction 51. It is to be noted that the almost equal state means the extent that no influence is exerted on the component mounting accuracy.

Moreover, since there occurs no such a temperature gradient that exerts influence on the component mounting accuracy at the component placing head 136 as described above, the relative position between each of the component suction nozzles 1361 and the board recognition camera 140, i.e., the distance between each of the component suction nozzles 1361 and the board recognition camera 140 can be made immovable. In this case, the above-mentioned "immovable" means that the expansion and contraction to the extent that influence is exerted on the component mounting accuracy is not caused by heat with regard to the distance between each of the component suction nozzles 1361 and the board recognition camera 140.

The component feeding unit 180 is the so-called cassette type component feeding unit that has a plurality of reels around which tapes accommodating the electronic components 62 are wound, and there are provided two sets of the units arranged on the front side 100a and the rear side 100b, in the component mounting apparatus 100 of the second embodiment.

The board conveyance unit 190 is an unit that performs loading, suction and holding, and unloading of the circuit board 61 in the placing position of the circuit board 61 in the component placing region in the component mounting apparatus 100, and, as shown in FIG. 31 and other figures, the unit is arranged along the X-axis direction 51 at an approximately central portion of the component mounting apparatus 100. The board conveyance unit 190 has a conveyance table 165 that serves as one example of the board holding device in the placing position, allowing the loaded circuit board 61 to be sucked and held and allowing the circuit board 61 to be unloaded by releasing the suction and holding.

Figure 36:
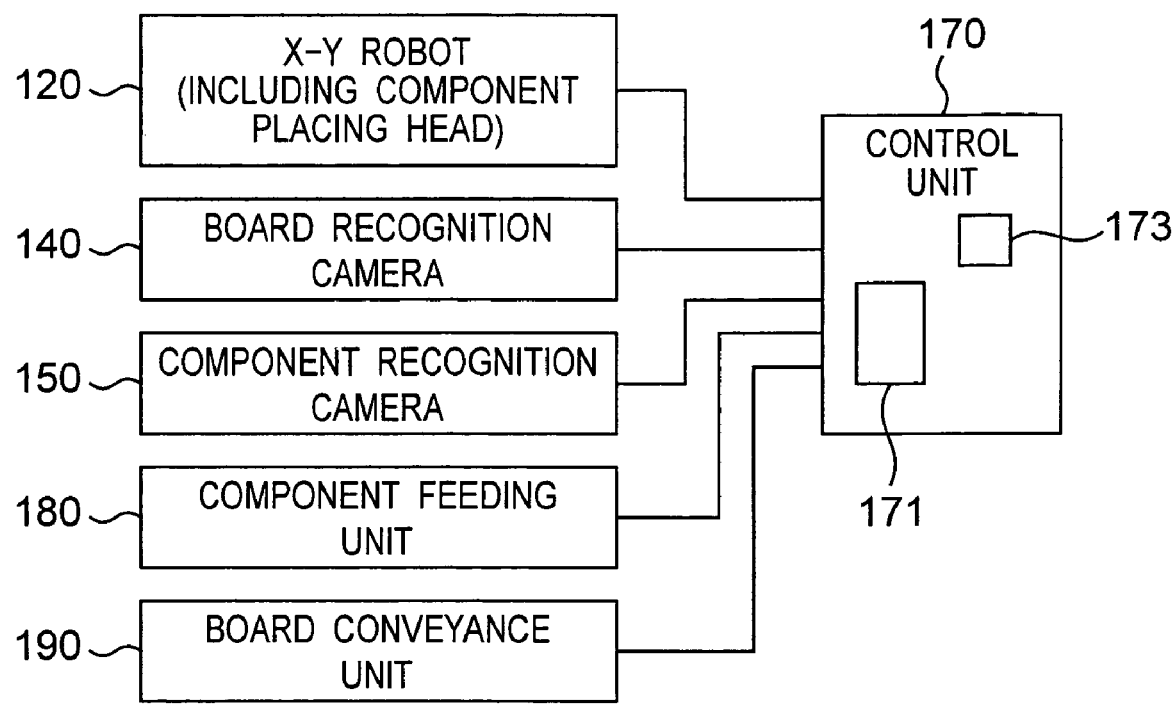
FIG. 36 is a block diagram showing the relation between the constituents and a control unit of the component mounting apparatus shown in FIG. 31.

As shown in FIG. 36, the control unit 170 is connected to the X-Y robot 120, the board recognition camera 140, the component recognition camera 150, the component feeding units 180, and the board conveyance unit 190, which are the constituents described above, and controls the mounting operation of the electronic components 62 on the circuit board 61 by controlling the operation of these constituents. The control unit 170 includes a storage section 173 for storing mounting information such as programs and mounting data (such as respective movement position coordinate data of the component placing head 136 during the mounting operation, mounting position coordinate data of the components, data of information of relations between the movement positions of the component placing head 136 and the placing positions of the components, and so on, data of the size of the placing region reference mark recognition reference board and position coordinate data of the placing region reference marks, data of the size of the board to be subjected to mounting and position coordinate data of the board reference position calculation marks, data of the components, data of nozzle size, and so on, component feed data of the component feeding units 180, and so on); recognition information by means of the board recognition camera 140; calculation results in the calculation section 171 described later necessary; and so on, and includes the calculation section 171 for executing various operations of, for example, calculating parallel deviation, inclination, expansion rate, and so on based on recognition information (e.g., recognition information of the placing region reference marks 201A and 201B by means of the board recognition camera 140, recognition information of the placing region reference marks 201 by means of the board recognition camera 140, and recognition information of the board reference position calculation marks 202-1 and 202-2 by means of the board recognition camera 140, and so on) by means of the board recognition camera 140 and obtaining by calculating an error at each placing position based on the recognition information and the placing position data of the mounting information stored in the storage section 173. The control unit 170 is made to execute the component mounting operation on the basis of the data and information stored in the storage section 173. The component mounting operation controlled by the control unit 170 constructed as above, and in particular, correction operation will be described in detail below.

The operation of the component mounting apparatus 100 constructed as described above, i.e., the component mounting method carried out by the component mounting apparatus 100 will be described more in detail. The conveyance operation of the circuit board 61 by the circuit board conveyance unit 190 as well as operations from the component suction from the component feeding units 180 to the component mounting on the circuit board 61 by the X-Y robot 120 including the component placing head 136 basically resembles the operation carried out in the conventional component mounting apparatus, and therefore, the operations will be simply described below.

That is, the component placing head 136 is moved to the component feeding unit 180 by the X-Y robot 120. Next, one or a plurality of electronic components 62 is sucked and held from the component feeding unit 180 by one or a plurality of component suction nozzles 1361 of the component placing head 136. Next, the component placing head 136 is moved over the component recognition camera 150 by the X-Y robot 120 to recognize the posture(s) and so on of the electronic component(s) 62 sucked and held by the nozzle(s) 1361 by means of the component recognition camera 150, and thereafter, the head is bound for the placing position(s) of the circuit board 61. The electronic component 62, which is sucked and held by one nozzle 1361 of the component placing head 136, is positioned above the corresponding placing position by the X-Y robot 120, and thereafter, the nozzle 1361 is moved down to place the electronic component 62 in the placing position. At this time, the mounting operation is carried out by rotating the nozzle 1361 around its axis and the like on the basis of the component posture recognition result by means of the component recognition camera 150, correcting the position of the component placing head 136 in consideration of an offset value described later, and thereafter carrying out the placing operation. All the components 62 to be mounted on the circuit board 61 are subjected to the series of mounting operations.

The component mounting method according to the second embodiment is characterized by the positional correction operation of the component placing head 136 during the mounting operation in consideration of the offset value, and this will be described in detail below with reference to FIG. 41.

That is, the component mounting method of the second embodiment recognizes the placing region reference marks 201 arranged at regular intervals on a glass board 200 that serves as one example of the placing region reference mark recognition reference board, obtains the position coordinates (coordinates constituted of an X-coordinate value in the X-direction and a Y-coordinate value in the Y-direction perpendicular to the X-direction in the plane of the glass board 200 for indicating the position of the placing region reference mark) of the placing region reference marks recognized as above, obtains a difference between the NC coordinates (design-predetermined numerical position coordinates of the placing region reference marks) of each of the placing region reference marks and the position coordinates as a correction value, obtains the NC coordinates of the position coordinates of at least two board reference position calculation marks of the component mounting circuit board, extracts placing region reference marks respectively located near to the two board reference position calculation marks among the recognized placing region reference marks, and obtains offset values of the placing region reference marks by respectively subjecting the position coordinates of the extracted placing region reference marks to coordinate transformation so that the correction values of the extracted placing region reference marks become zero or substantially zero. Then, at least two board reference position calculation marks of the component mounting circuit board held by the board holding device are respectively recognized in a state in which the component mounting circuit board is held by the board holding device and positioned in the component placing region in place of the placing region reference mark recognition reference board, the position coordinates of the recognized two board reference position calculation marks are obtained, and the NC coordinates of the two board reference position calculation marks are respectively corrected on the basis of the position coordinates of the obtained two board reference position calculation marks. When each component placing head 136 is moved to each of the movement positions during placing position correction, mark recognition and correction, and placing position offset measurement, or any one of the operations, the position coordinate of the movement position is corrected on the basis of the offset value of the placing region reference mark located nearest to the recognition camera provided for the component holding head, allowing highly accurate placing to be achieved.

In this case, the offset value means a numerical value for correcting the position coordinates of the placing region reference mark obtained by subjecting the extracted position coordinates of the placing region reference mark to coordinate transformation so that the correction values of the placing region reference marks extracted as the placing region reference marks respectively located near to the two board reference position calculation marks of the component mounting circuit board become zero or substantially zero as described later.

Moreover, the correction value means a difference between the NC coordinate of each of the placing region reference marks arranged at regular intervals on the reference board and the recognized position coordinate.

The outline of a method for obtaining the offset value will be described first.

Figure 37:
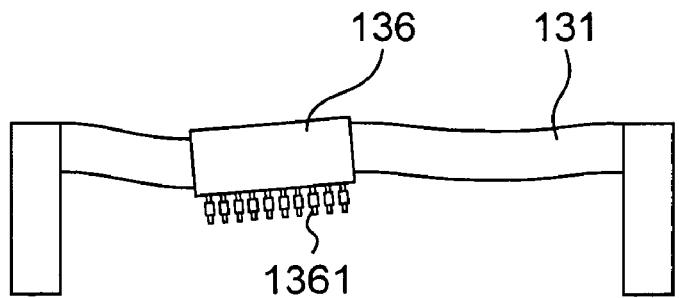
FIG. 37 is an explanatory view showing the relation between the distortion of the X-axis robot and the component placing head for explaining the fact that the positioning accuracy of the component placing head is largely influenced by the distortion of the X-Y robot.
Figure 38:
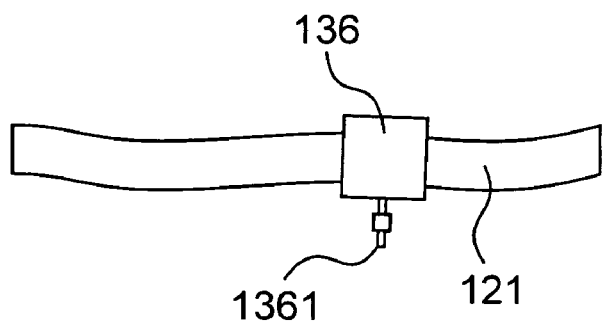
FIG. 38 is an explanatory view showing the relation between the distortion of the Y-axis robot and the component placing head for explaining the fact that the positioning accuracy of the component placing head is largely influenced by the distortion of the X-Y robot.
Figure 39:
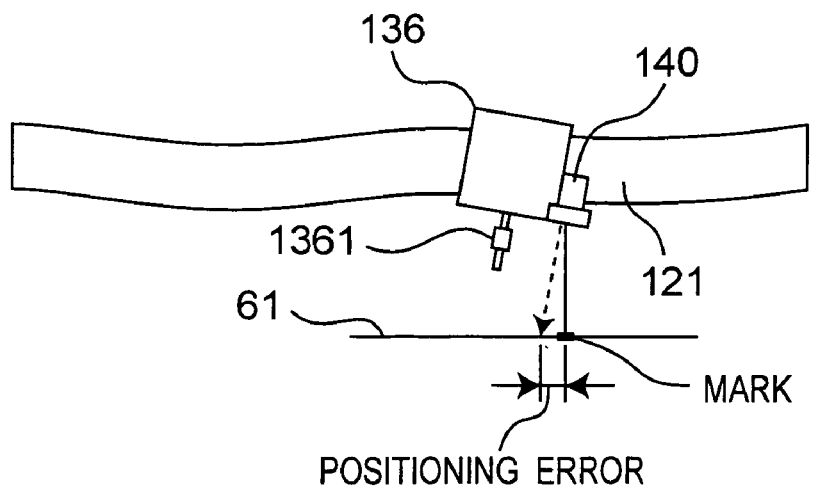
FIG. 39 is an explanatory view for explaining the concept of an offset value of the component mounting method according to the second embodiment of the present invention.

The positioning accuracy of the component placing head 136 is largely influenced by the distortion of the X-Y robot 120 (see FIGS. 37 and 38), and a positioning error is generated. For example, FIG. 37 is a view showing the relation between the distortion of the X-axis robot and the component placing head 136, and FIG. 38 is a view showing the relation between the distortion of the Y-axis robot and the component placing head 136. This positioning error is changed by the position in which the component placing head 136 moves and exerts influence on the placing accuracy. Accordingly, as shown in FIG. 39, when the X-Y robot 120 moves the head 136 to an arbitrary NC coordinate position, the offset value (in other words, the offset value for correcting the area where the NC coordinate position exists) in the placing region reference mark position located nearest to the NC coordinate position is used as a numerical value for the correction to remove the error of the positioning of the X-Y robot 120 and so on generated by the above movement. That is, the offset value used as the numerical value for the correction to correct the error of the positioning and so on is obtained by using the placing region reference mark recognition reference board within a maximum component placing region (a region including the boards to be produced, the boards having, for example, an XL size of 510 mm×460 mm and an M size of 330 mm×250 mm).

Figure 41:
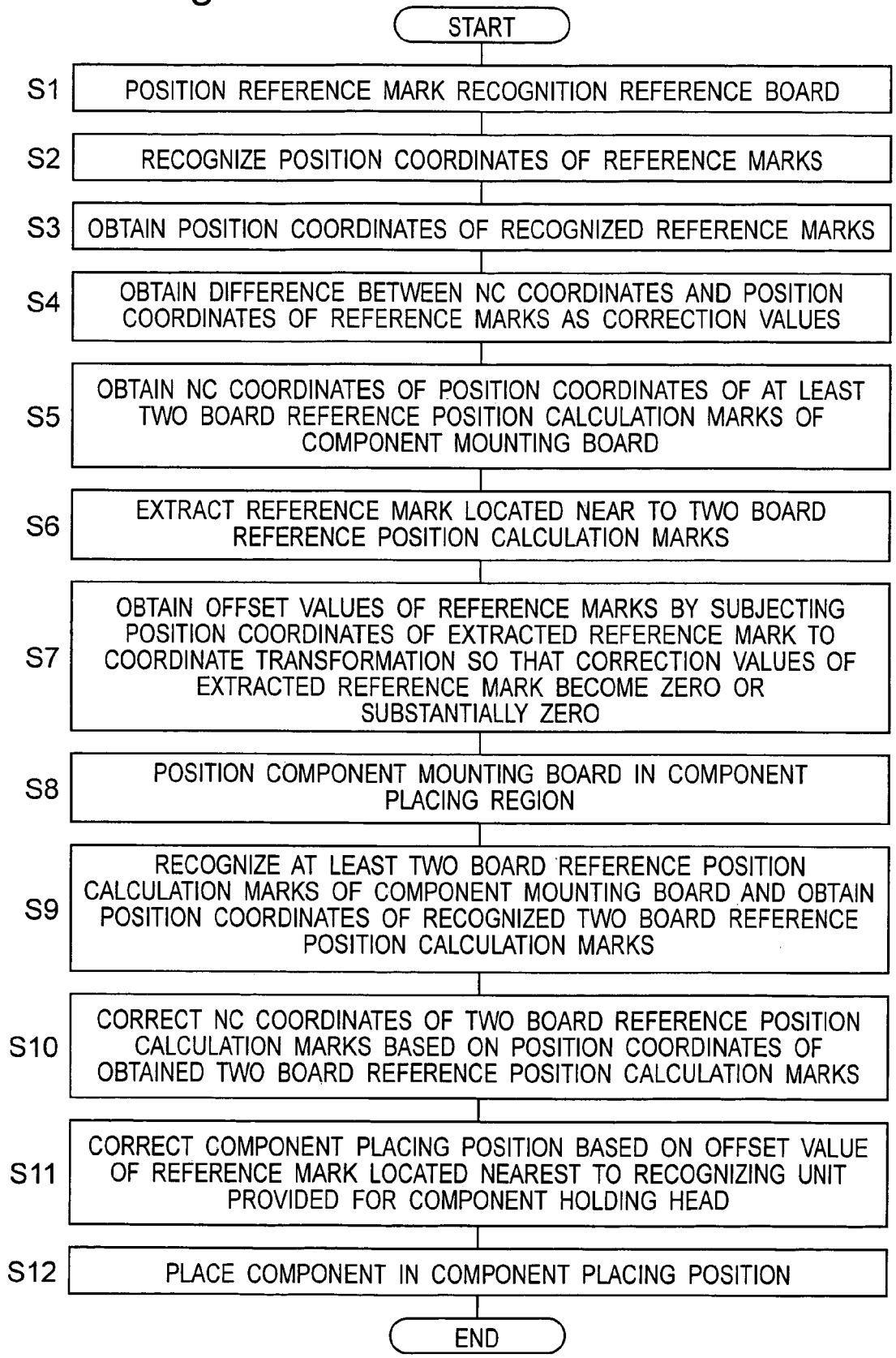
FIG. 41 is a flow chart showing a procedure for obtaining and using the offset value of the component mounting method according to the second embodiment of the present invention.

In concrete, first of all, in step S1 of FIG. 41, a glass board 200 that serves as one example of the placing region reference mark recognition reference board is held by the conveyance table 165 that serves as one example of the board holding device and positioned in the component placing region.

Figure 40:
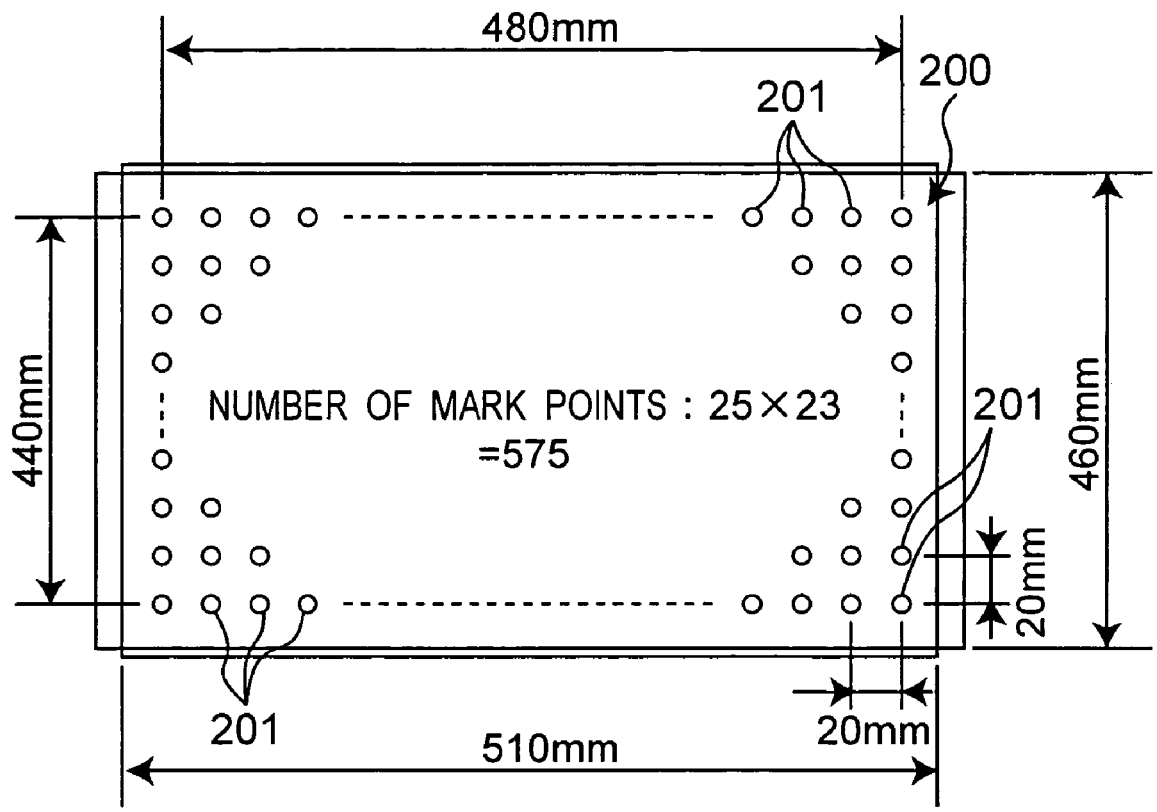
FIG. 40 is a plan view showing a concrete example of a glass board used by the component mounting method according to the second embodiment of the present invention.

Next, in step S2 of FIG. 41, the position coordinates of all the placing region reference marks 201 arranged at regular intervals on the glass board 200 held by the conveyance table 165 are recognized by the board recognition camera 140 of the component placing head 136. More concrete recognition of the placing region reference marks for the measurement of the correction value is carried out as follows. During the measurement of the correction value, a special glass board (hereinafter referred to as a glass board) on which the placing region reference marks (circles of a diameter of 1 mm) are formed in a grid (grating) form in a printing or a similar manner is used for the glass board 200 of the XL size of 510 mm×460 mm (M size: 330 mm×250 mm) that serves as one example of the placing region reference mark recognition reference board of the measurement board. That is, as one example of the glass board 200, as shown in FIG. 40, one on which the circular placing region reference marks (of a diameter of 1 mm) 201 constituted of 44 rows in the Y-direction and 49 columns in the X-direction arranged at 10-mm pitches are printed on a glass plate of a size of 510 mm×460 mm is used for the XL size. Therefore, the placing region reference marks used for the measurement are located at 2156 points. For the measurement of the M size, one on which the circular placing region reference marks (of a diameter of 1 mm) 201 constituted of 22 rows in the Y-direction and 39 columns in the X-direction at 10-mm pitches are printed on a glass plate of a size of 410 mm×240 mm is used. Therefore, the placing region reference marks used for the measurement are located at 858 points.

The size of the placing region reference mark recognition reference board may principally be of any size so long as the size is larger than the maximum component placing region of the component mounting apparatus. However, as described later, in the case of a size smaller than the maximum component placing region, the size may be virtually made greater than the size of the maximum component placing region by using a synthesis method. Although the accuracy is increased if the intervals between the placing region reference marks are made finer, the data obtaining time becomes long, and the amount of storage data increases. Accordingly, it is economically sufficient to set the pitch to about ¼ to ⅕ of the lead of the ballscrew of the ballscrew structure of the X-Y robot. As a concrete example, the placing region reference mark pitch can be set to 10 mm with respect to the lead of 40 mm.

Figure 43:
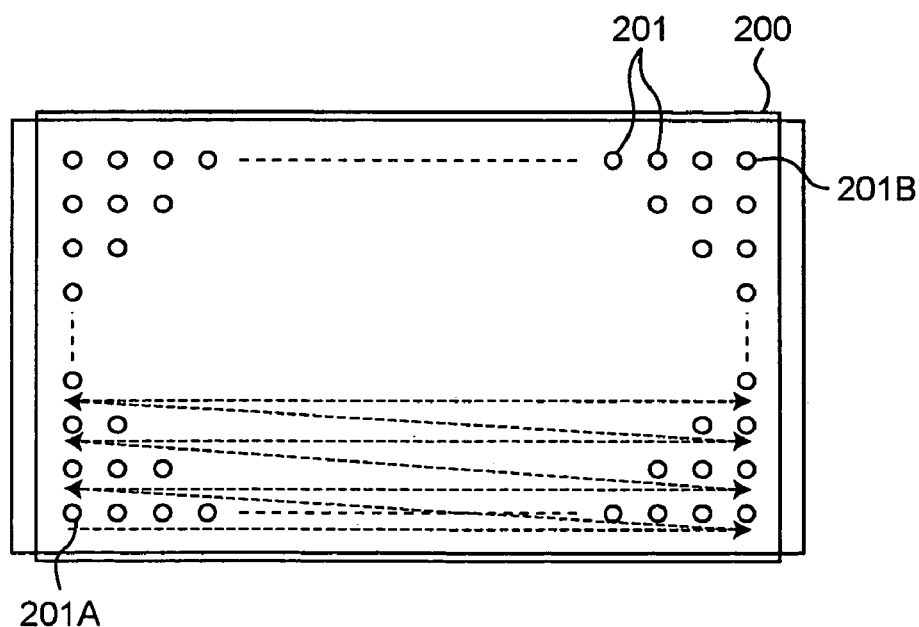
FIG. 43 is an explanatory view for explaining how to recognize the placing region reference marks on the glass board used by the component mounting method according to the second embodiment of the present invention.

Next, in step S3 of FIG. 41, the position coordinates of the recognized placing region reference marks 201 are obtained by the operation unit 171 on the basis of the recognition results and then stored in the storage section 173. That is, as shown in, for example, FIG. 43, all the placing region reference marks 201 are recognized by moving the board recognition camera 140 of the head 136 from the placing region reference mark 201 at the left end of the lowermost row to the placing region reference mark 201 at the right end of the same row parallel to the board conveyance direction of the board conveyance unit 190 in order to reduce the displacement to sequentially recognize all the placing region reference marks 201 of the row, obtaining the position coordinates by the operation unit 171 on the basis of the recognition results, and storing the results in the storage section 173. Next, after reversely moving the camera obliquely to the left, the board recognition camera 140 of the head 136 is moved from the placing region reference mark 201 at the left end of the row located upwardly next to the lowermost row to the placing region reference mark 201 at the right end of the same row to sequentially recognize all the placing region reference marks 201 of the row, the position coordinates are obtained by the operation unit 171 on the basis of the recognition results, and the results are stored in the storage section 173. Next, after reversely moving the camera obliquely to the left, the board recognition camera 140 of the head 136 is moved from the placing region reference mark 201 at the left end of the row located upwardly next but one to the lowermost row to the placing region reference mark 201 at the right end of the same row to sequentially recognize all the placing region reference marks 201 of the row, the position coordinates are obtained by the operation unit 171 on the basis of the recognition results, and the results are stored in the storage section 173.

The placing region reference marks 201 of all the rows are recognized according to the above sequence, the position coordinates are obtained by the operation unit 171 on the basis of the recognition results, and the results are stored in the storage section 173. It is to be noted that the lower side of the glass board 200 of FIG. 43 corresponds to the front side of the component mounting apparatus, i.e., this side of the operator.

In order to improve the recognition accuracy of the placing region reference marks 201, the recognition processing of the placing region reference marks 201 may be repetitively carried out a plurality of times. In the above case, the mean values of the position coordinates obtained by the recognition results of the corresponding frequency are calculated by the operation unit 171 and stored as the position coordinates of the corresponding placing region reference marks 201 in the storage section 173. The frequency is preferably arbitrarily changeable on the operation screen of the component mounting apparatus.

As described above, the position coordinates of all the placing region reference marks 201 are stored in the storage section 173.

Next, in step S4 of FIG. 41, differences between the NC coordinates of the placing region reference marks 201 and the respective position coordinates are obtained as correction values by the operation unit 171 and then stored in the storage section 173. The correction values are numerical values for correcting the deviation in holding the glass board 200 during the suction and holding of the glass board 200 by the conveyance table 165, the deviation during recognition, the positioning error of the X-Y robot, and so on.

Next, in step S5 of FIG. 41, the NC coordinates of the position coordinates of at least two board reference position calculation marks 202-1 and 202-2 of the component mounting circuit board 61 are obtained by the operation unit 171.

Next, in step S6 of FIG. 41, on the basis of the two NC coordinates of the position coordinates of the two board reference position calculation marks 202-1 and 202-2, the placing region reference marks 201 respectively located near to the two board reference position calculation marks 202-1 and 202-2 of the component mounting circuit board 61 are extracted by the operation unit 171 from among the recognized placing region reference marks 201 of the glass board 200. Concretely, in FIG. 42, the placing region reference marks 201A and 201B at the two points located diagonally at the upper right and the lower left, as examples, on the glass board 200 near to the two board reference position calculation marks 202-1 and 202-2 are recognized by the board recognition camera 140 while moving the head 136 by means of the X-Y robot 120. That is, it is difficult to hold the glass board 200 by the conveyance table 165 completely parallel to the board conveyance direction of the board conveyance unit 190, and thus a displacement occurs. In order to correct the displacement when this glass board is held, the placing region reference marks 201 located at the lower left corner and the upper right corner of the glass board 200 are first recognized as the placing region reference marks 201A and 201B.

Next, in step S7 of FIG. 41, the position coordinates of the extracted placing region reference marks 201A and 201B are subjected to coordinate transformation (coordinate transformation in consideration of parallel deviation, inclination, and expansion/contraction rate) so that the correction values of the extracted placing region reference marks 201A and 201B become zero or substantially zero, and the offset values at the placing region reference marks 201A and 201B are obtained. That is, the parallel deviation and the inclination of the glass board 200 are obtained by the operation unit 171 from the position coordinates of the recognition results of the placing region reference marks 201A and 201B at the two points obtained in step S3 of FIG. 41. Equations for obtaining the parallel deviation and the inclination will be described later. The parallel deviation means the displacement in the X-direction and/or the Y-direction. The inclination means the rotational deviation as a consequence of the rotation of the board in the X-direction and the Y-direction as a direction perpendicular to the X-direction when the board is stopped by the board stopper in the placing position of the conveyance table 165. At this time, in the case of the normal board reference position calculation mark correction, the expansion/contraction rate is obtained since it is required to consider the expansion and contraction of the board due to heat. However, on the basis of the idea that the glass board 200 of which the expansion and contraction due to heat are not required to be considered is used as a reference, the expansion/contraction rate of the glass board 200 is assumed to be one. In this case, the expansion/contraction rate means the ratio of expansion and contraction due to heat of the board itself.

Next, a graphic line for connecting the placing region reference marks 201A and 201B at the two points is rotated and shifted for coordinate transformation on the basis of the correction value (parallel deviation and inclination) obtained by the operation unit 171 so that the correction values of the placing region reference marks 201A and 201B at the two points become zero (in other words, so as to make coincidence with the data of the NC coordinates of the placing region reference marks 201A and 201B at the two points) or become substantially zero (e.g., within a range of ±5 μm). Then, the offset values at the position coordinates of all the placing region reference marks 201 are obtained and then stored in the storage section 173. As a result, the offset value of each area {rectangular area obtained by dividing the reference board every unit area based on the placing region reference marks (e.g., surrounded by placing region reference marks at four points)} corresponding to the size of the placing region reference mark recognition reference board can be determined. By carrying out positional correction using the offset values of every area as numerical values for the correction of the movement position of the component placing head existing in each area during the recognition operation of the placing region reference marks of the placing region reference mark recognition reference board, the component mounting operation on the board to be subjected to mounting, and so on, the placing accuracy can be improved.

The positioning error and so on peculiar to the X-Y robot 120 can be perceived as the relative displacement between placing positions by the offset values obtained through the steps S1 through S7 of FIG. 41 in the processes. Moreover, by using the thus obtained offset values as numerical values for correction of the position coordinates in the head positioning position calculation during the placing region reference mark recognition operation, the component placing operation, the placing offset value measurement operation, or any one of those operations, the deviation factor due to the distortion of the X-Y robot operation can be absorbed, and the placing accuracy can be improved.

In this case, the reason why the correction based on the deviation of the placing region reference mark recognition reference board is added to the position coordinates of all the placing region reference marks 201 is that the positioning error of the X-Y robot 120 is disadvantageously contained during the placing region reference mark recognition in the correction value measurement. An error is originally included in every positioning operation of the X-Y robot 120, and even if the glass board 200 can be produced with the desired high accuracy, accurate positioning in the placing position of the component mounting apparatus cannot be achieved. Then, since no absolute reference exists, it is impossible to accurately measure the positioning error of the X-Y robot 120.

Figure 44:
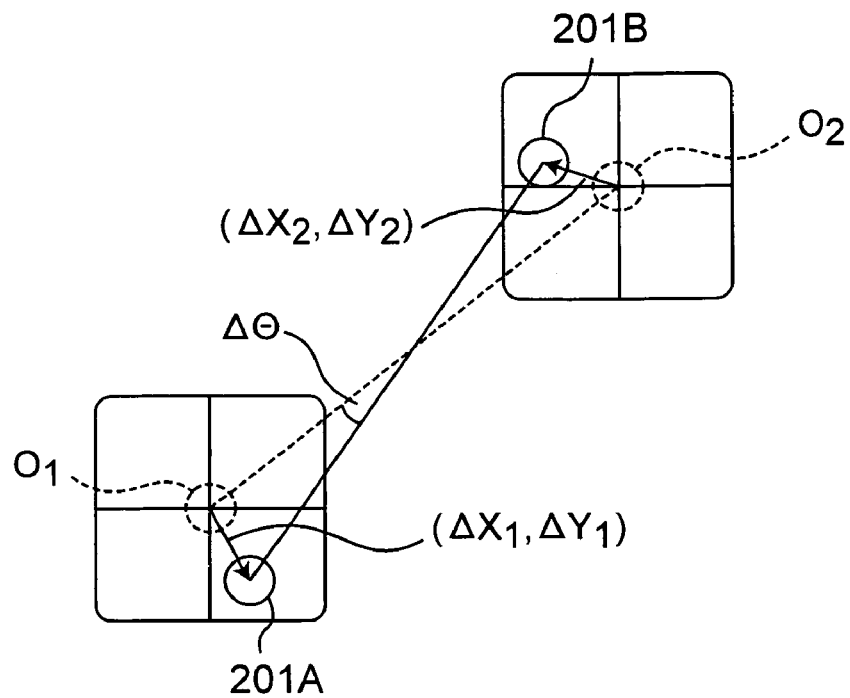
FIG. 44 is an explanatory view showing the fact that placing region reference marks are recognized in positions displaced from the visual field center positions $O_1$, $O_2$ of the board recognition camera by the component mounting method according to the second embodiment of the present invention.

Assuming herein that FIG. 44, which shows the fact that the placing region reference marks 201A and 201B are recognized in the positions displaced from the visual field central positions $O_1$ and $O_2$ of the board recognition camera 140, illustrates the recognition results of the placing region reference marks 201A and 201B during the placing region reference mark recognition, then position coordinate deviations ($\Delta X_1$, $\Delta Y_1$) obtained from the recognition result of the placing region reference mark 201A at the first point and position coordinate deviations ($\Delta X_2$, $\Delta Y_2$) obtained from the recognition result of the placing region reference mark 201B at the second point can be obtained as position coordinate deviations obtained from the placing region reference mark recognition results.

It is of course ideal that the deviation factor included in the position coordinate deviations obtained from the recognition results becomes only the amount of parallel deviation when the glass board 200 is held by the conveyance table 165. However, the recognition process error and the positioning error of the X-Y robot 120 are actually contained. Therefore, the position coordinate deviations obtained from the recognition results of the placing region reference marks 201A and 201B become as follows:

(position coordinate deviation of recognition
 results)=(deviation in holding board)+(deviation
 in recognition)+(X-Y robot positioning error), and assuming that the amount of board parallel deviations of the placing region reference marks 201A and 210B are ($X_{pcb1}$, $Y_{pcb1}$) and ($X_{pcb2}$, $Y_{pcb2}$), the recognition errors of the placing region reference marks 201A and 210B are ($X_{rec1}$, $Y_{rec1}$) and ($X_{rec2}$, $Y_{rec2}$) and the amounts of positioning errors of the X-Y robot 120 at the placing region reference marks 201A and 210B are ($X_{e1}$, $Y_{e1}$) and ($X_{e2}$, $Y_{e2}$), then the position coordinate deviations ($\Delta X_1$, $\Delta Y_1$) and ($\Delta X_2$, $\Delta Y_2$) obtained from the recognition results are expressed by the following Equations (1).

$$\Delta X_1 = X_{pcb1} + X_{rec1} + X_{e1}$$

$$\Delta Y_1 = Y_{pcb1} + Y_{rec1} + Y_{e1}$$

$$\Delta X_2 = X_{pcb2} + X_{rec2} + X_{e2}$$

$$\Delta Y_2 = Y_{pcb2} + Y_{rec2} + Y_{e2}$$

That is, the position coordinates of the placing region reference marks of which the position coordinate deviations of the glass board 200 are corrected with respect to the position coordinates of the placing region reference marks 201 by using the recognition results do not become the coordinates where the placing region reference marks 201 actually exist. The above is because the deviation factor due to the positioning error of the X-Y robot 120 has disadvantageously been contained in the position coordinates of the corrected placing region reference marks.

If it is postulated that the recognition errors ($X_{rec1}$, $Y_{rec1}$) and ($X_{rec2}$, $Y_{rec2}$) of the placing region reference marks 201A and 201B are zero, assuming that the NC coordinate of the placing region reference mark 201 obtained through correction is ($X_{mnc}$, $Y_{mnc}$) and the NC coordinates of the placing region reference marks 201A and 210B are ($X_{nc1}$, $Y_{nc1}$) and ($X_{nc2}$, $Y_{nc2}$), then the position coordinates ($X_m$, $Y_m$) of the placing region reference mark obtained through correction are expressed by the following Equations (2) and (3).

$$X_m = (X_{mnc} - X_{nc1})\cos\Delta\theta - (Y_{mnc} - Y_{nc1})\sin\Delta\theta + \Delta X_1 \qquad [1]$$
$$= (X_{mnc} - X_{cn1})\cos\Delta\theta - (Y_{mnc} - Y_{nc1})\sin\Delta\theta + X_{pcb1} + X_{e1}$$

$$Y_m = (X_{mnc} - X_{nc1})\sin\Delta\theta + (Y_{mnc} - Y_{nc1})\cos\theta + \Delta Y_1 \qquad [2]$$
$$= (X_{mnc} - X_{nc1})\sin\Delta\theta + (Y_{mnc} - Y_{nc1})\cos\theta + Y_{pcb1} + Y_{e1}$$

With regard to this, assuming that the position coordinate where the actual placing region reference mark 201 exists is ($X_t$, $Y_t$), then the following Equations (4) hold.

$$X_t = (X_{mnc} - X_{nc1})\cos\Delta\theta - (Y_{mnc} - Y_{nc1})\sin\Delta\theta + X_{pcb1} \qquad [1]$$

$$Y_t = (X_{mnc} - X_{nc1})\sin\Delta\theta + (Y_{mnc} - Y_{nc1})\cos\theta + Y_{pcb1} \qquad [2]$$

In this case, the NC coordinates as the results of correction must properly correspond to the position coordinates of the actual placing region reference marks ([1]=[1]′, [2]=[2]′). However, if the above equations are compared, then the following Equations (5) hold.

$$X_m - X_t = X_{e1} \neq 0$$

$$Y_m - Y_t = Y_{e1} \neq 0$$

In the equations, the NC coordinates as the results of correction do not correspond to the position coordinates of the actual placing region reference mark. For the reason that the head 136 cannot be positioned in the position coordinates of the actual placing region reference mark, the position coordinate deviation obtained from the recognition results obtained there cannot be used for positional correction since it disadvantageously leads to a correction value containing a positioning error.

As described above, the positioning error is always contained in the X-Y robot operation of the component mounting apparatus. If the correction value is measured on the basis of the glass board 200, it does not become a true value, and there is no absolute reference.

Accordingly, in order to adjust this error unlimitedly to zero (in other words, to make the data of the position coordinates of the placing region reference mark 201 coincide with the data of the NC coordinates), the correction value obtained above is subjected to the processing as follows.

Figure 45:
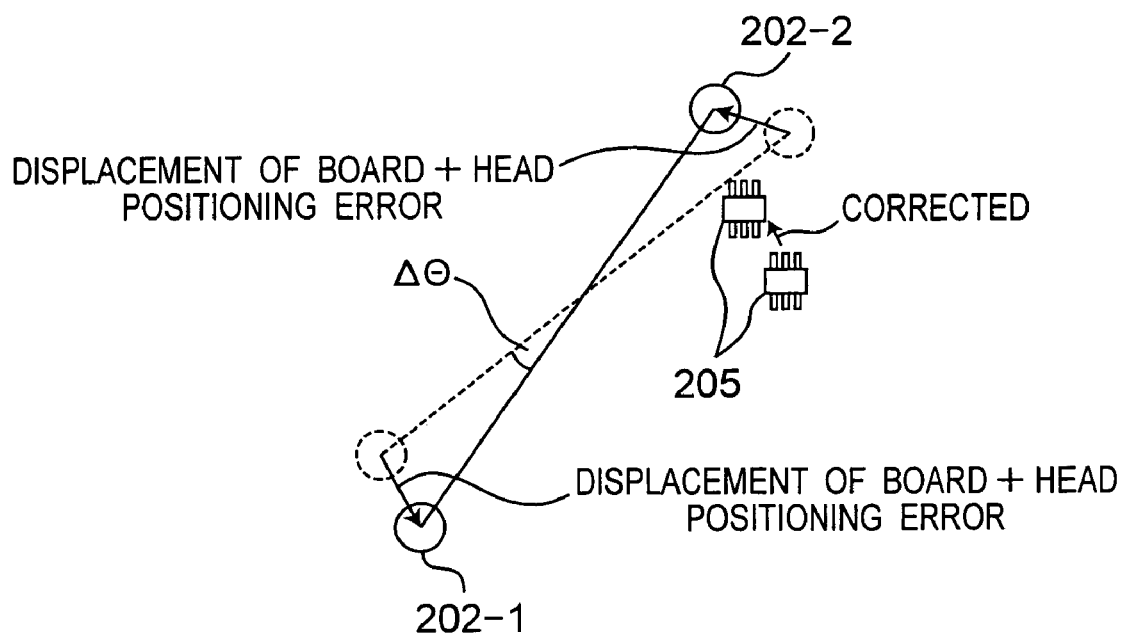
FIG. 45 is an explanatory view showing results when two board reference position calculation marks are recognized by the component mounting method according to the second embodiment of the present invention.

During the actual component mounting operation in the component mounting apparatus, the component mounting apparatus recognizes all the placing region reference marks as described above in order to correct the deviation of holding on the conveyance table 165 of the board to be produced (board to be subjected to mounting) and corrects each placing position by the results. The results of the recognition of the two board reference position calculation marks 202-1 and 202-2 at this time become as shown in FIG. 45. In this case, the positioning errors in the positions of the two board reference position calculation marks 202-1 and 202-2 are contained in the position coordinate deviation obtained from the recognition results of the two board reference position calculation marks 202-1 and 202-2 in addition to the deviation of holding.

In actually mounting the component 62 in the placing position 205 of the board 61 to be subjected to mounting, the parallel deviation, the inclination, and the expansion/contraction rate are obtained from the recognition results of the board reference position calculation marks, and each placing position 205 is corrected by the obtained result for use. Concretely, the correction is carried out by relocating all the placing positions 205 so that the amounts of deviation (deviation of holding+positioning error) in the positions of the placing region reference marks near the two board reference position calculation marks 202-1 and 202-2 become zero (in other words, the position coordinate data of the two board reference position calculation marks 202-1 and 202-2 are made to coincide with the data of the NC coordinates).

Figure 46:
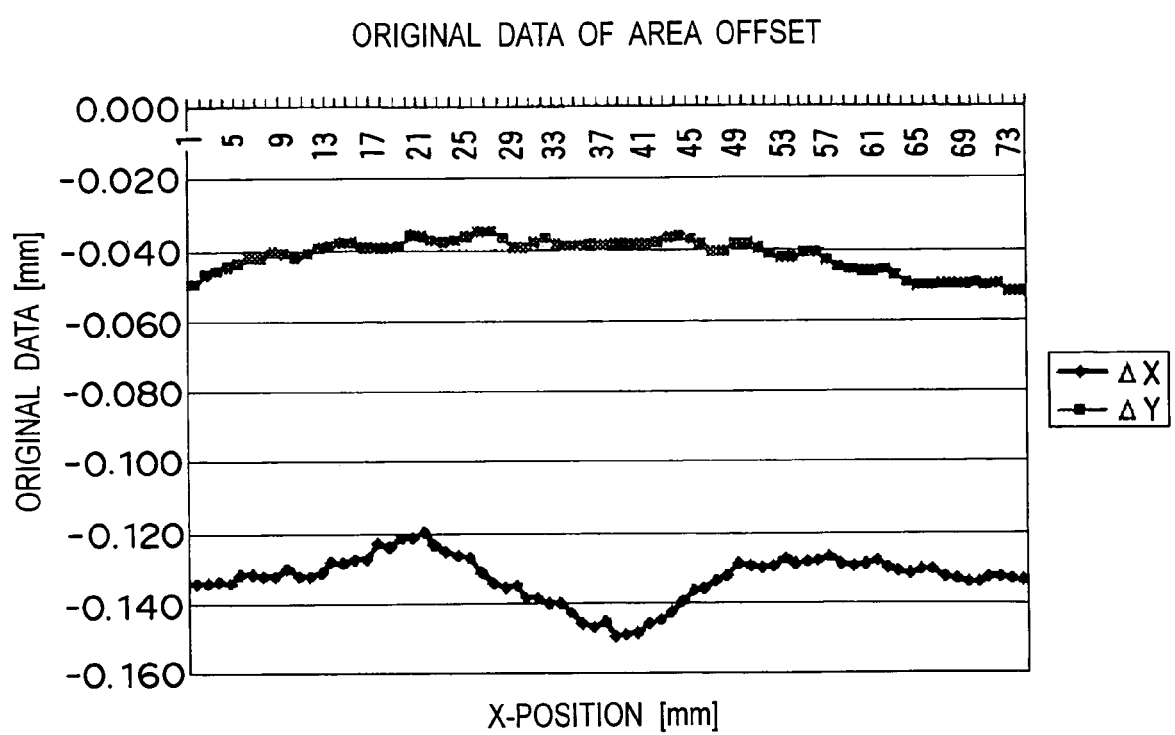
FIG. 46 is a graph, in which the vertical axis represents the amount of displacement and the horizontal axis represents the position in the X-direction, the upper graphic line represents ΔX, i.e., a displacement in the X-direction, and the lower graphic line represents ΔY, i.e., a displacement in the Y-direction.
Figure 47:
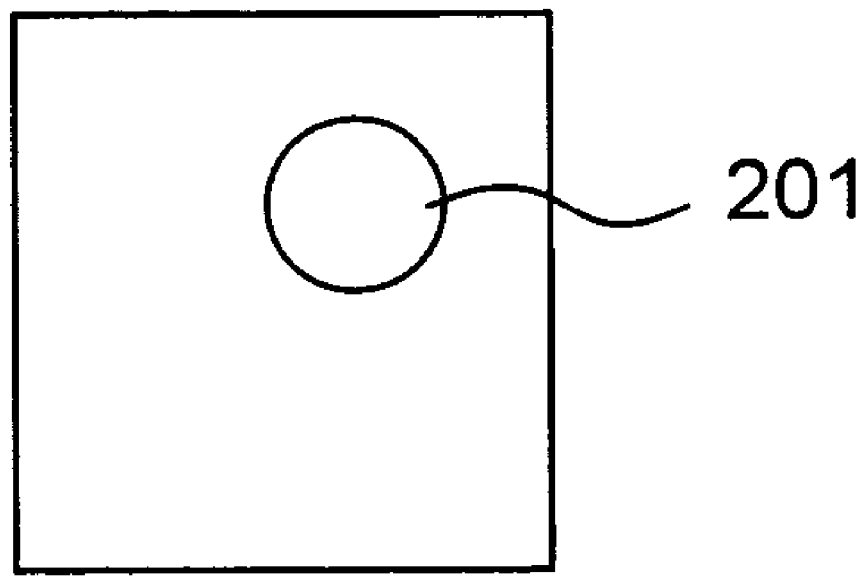
FIG. 47 is an explanatory view showing a state in which the placing region reference mark position is displaced in the X-direction and the Y-direction from the center position of a rectangular visual field region located at the proper position.

Concretely, as shown in FIG. 46, the position of the placing region reference mark of the original data of the correction value is not zero since the position is displaced from the proper position (the center position of the rectangular visual field region in FIG. 47) in the X-direction and the Y-direction as shown in FIG. 47. In FIG. 46, the vertical axis represents the amount of displacement, and the horizontal axis represents the position in the X-direction. The upper graphic line indicates ΔX, i.e., the displacement in the X-direction, and the lower graphic line indicates ΔY, i.e., the displacement in the Y-direction.

Figure 48:
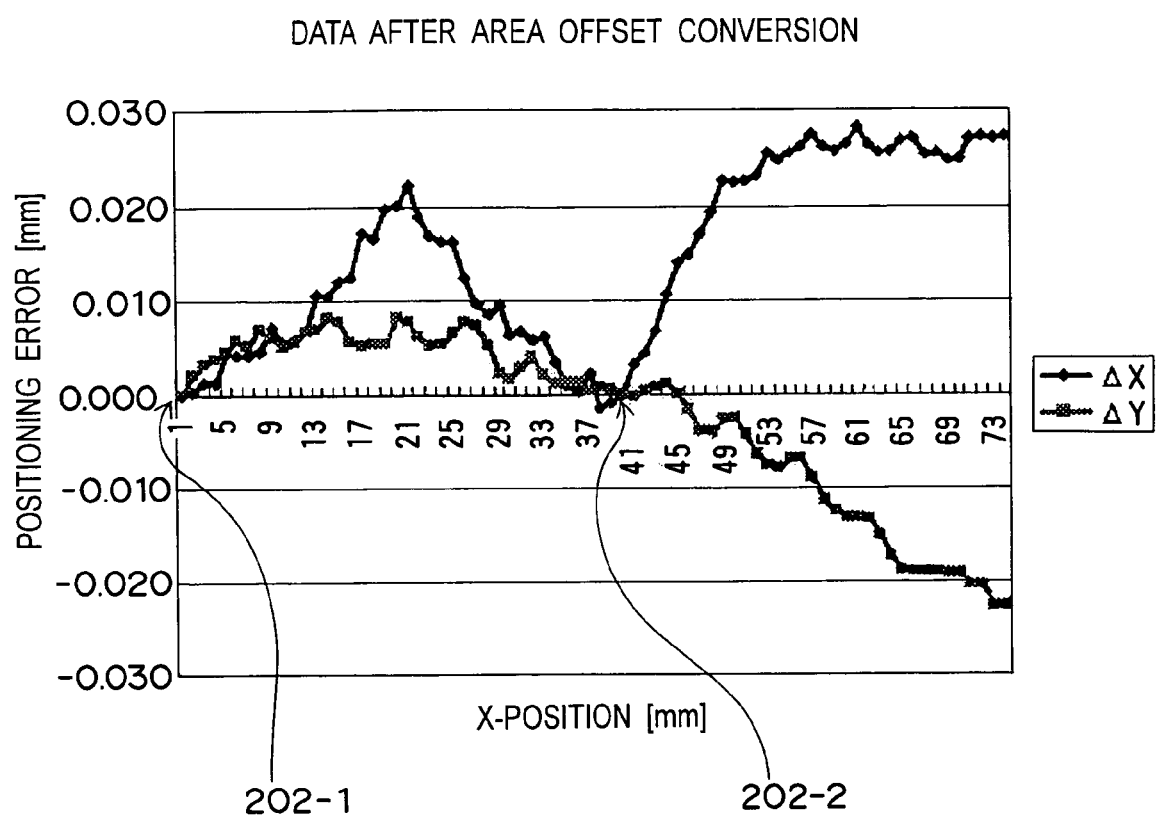
FIG. 48 is a graph showing a state in which the placing position is relocated through coordinate transformation by rotating and shifting the graph so that the correction values of the placing region reference marks located in the vicinity of two board reference position calculation marks on a comparatively small board to be subjected to mounting become zero or substantially zero.
Figure 49:
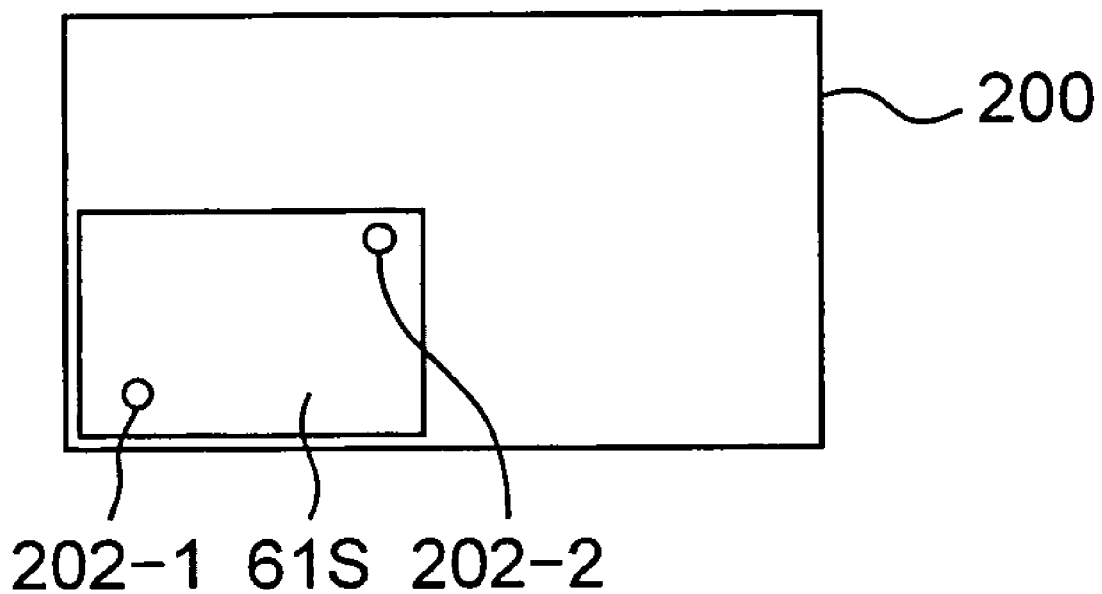
FIG. 49 is a plan view showing the two board reference position calculation marks on the comparatively small board to be subjected to mounting of FIG. 48.

Accordingly, as shown in FIGS. 48 and 49, all the placing positions are relocated through coordinate transformation by rotating and shifting the graphic line that connects the board placing region reference marks 201a and 201b at two points so that the correction values of the placing region reference marks 201a and 201b in the vicinity of the two board reference position calculation marks 202-1 and 202-2 of a comparatively small board 61S to be subjected to mounting become zero or substantially zero (e.g., within the range of ±5 μm). In the graph of FIG. 48, although the placing region reference marks 202-1 and 202-2 (diagonally located) are plotted on the same graph, the data themselves are obtained by measuring the X-coordinate at intervals of 10 mm with the Y-coordinate made constant. Therefore, the data indicated as "202-2" on the graph are the data of the placing region reference mark of which the Y-coordinate data are identical to those of the placing region reference mark 202-1 and the X-coordinate data are identical to those of the placing region reference mark 202-2. This holds same also in FIG. 50.

Figure 50:
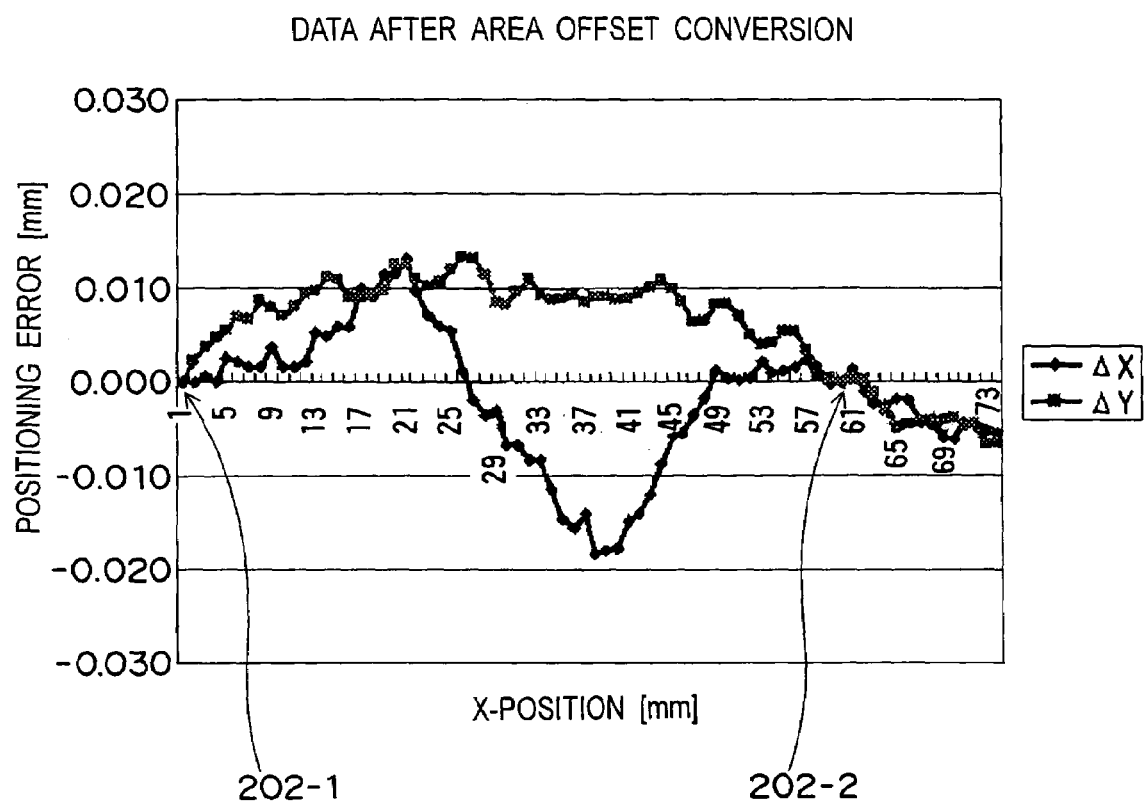
FIG. 50 is a graph showing a state in which the placing position is relocated through coordinate transformation by rotating and shifting the graph so that the correction values of the placing region reference marks located in the vicinity of two board reference position calculation marks on a comparatively large board to be subjected to mounting become zero or substantially zero.
Figure 51:
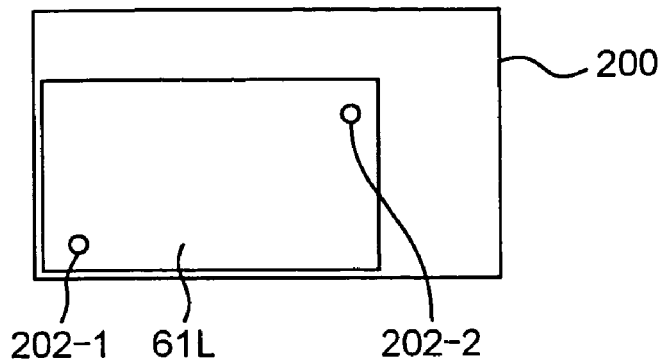
FIG. 51 is a plan view showing the two board reference position calculation marks on the comparatively large board to be subjected to mounting of FIG. 50.

Moreover, as shown in FIGS. 50 and 51, all the placing positions are relocated through coordinate transformation by rotating and shifting the graphic line so that the correction values of the placing region reference marks 201 in the vicinity of the two board reference position calculation marks 202-1 and 202-2 of a comparatively large board 61L to be subjected to mounting become zero or substantially zero (e.g., within the range of ±5 μm). As described above, the data actually used for the correction values largely differs depending on the board to be subjected to mounting.

Since there is no absolute reference through the processes of obtaining the X-Y robot positioning error, the amounts of the X-Y robot positioning errors of each measured area agree with the board 61 to be subjected to mounting during the production only in the positions of the two mark board reference position calculation marks 202-1 and 202-2 of the board 61 to be subjected to mounting. Accordingly, by using the correction values of the placing region reference marks near to the two board reference position calculation marks 202-1 and 202-2 of the board 61 to be produced, relocation is achieved by carrying out the coordinate transformation so that the correction values of the two points become zero or substantially zero (e.g., within the range of ±5 μm). As the processing at this time, the parallel deviation, the inclination, the expansion/contraction rate, and so on are obtained, and all the placing positions 205 are relocated by the results, similarly to the correction operation of the two board reference position calculation marks 202-1 and 202-2.

Figure 52:
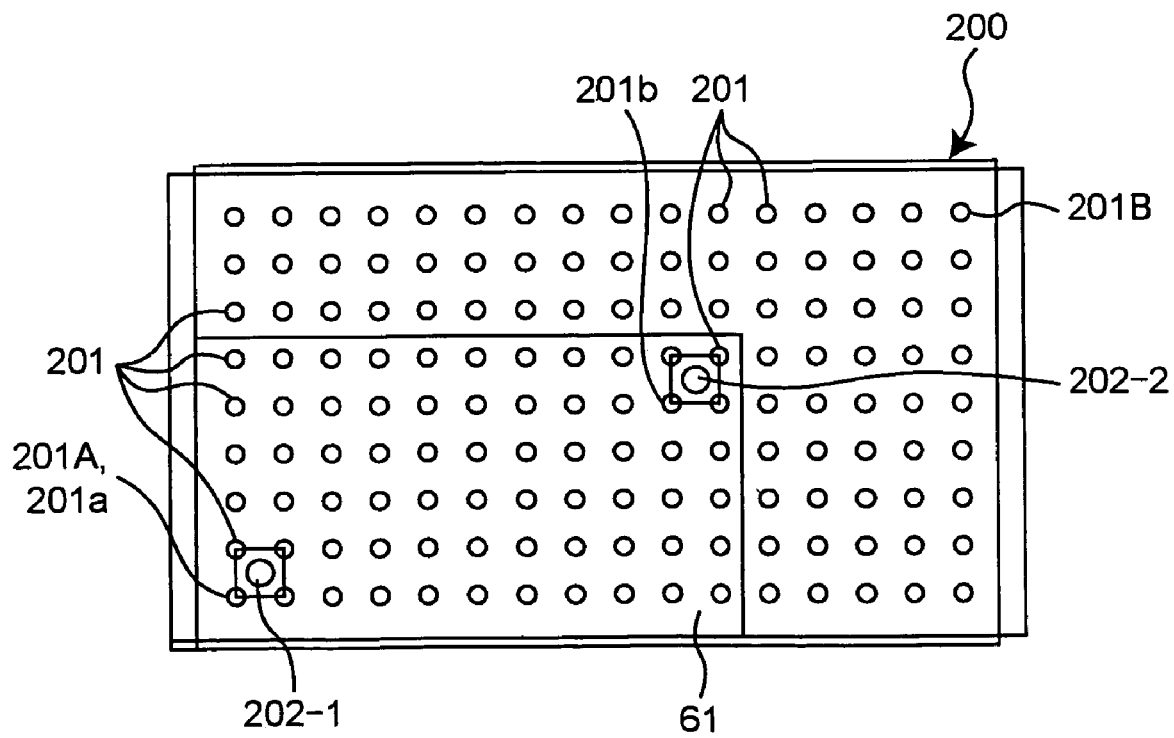
FIG. 52 is an explanatory view showing placing region reference marks on a glass board, the marks being located nearest the board reference position calculation marks of the board to be produced.

In FIG. 52, on the basis of the amount of the X-Y robot positioning errors at the placing region reference marks 201a and 201b on the glass board 200 located nearest to the board reference position calculation marks 202-1 and 202-2 of the board 61 to be produced, the amounts of X-Y robot positioning errors at all the placing region reference mark positions are subjected to coordinate transformation (coordinate transformation in consideration of parallel deviation, inclination, and then expansion/contraction rate) in the operation unit 171 and stored in the storage section 173.

The coordinate transformation is carried out when board type is selected, and the offset values obtained through the transformation are added as numerical values for the correction to the respective movement positions during the mark recognition operation, the component placing operation, and the placing offset measurement operation by the control unit 170. By thus using the offset values, the errors peculiar to the robot can be perceived as the relative displacements between the positions.

Next, the subsequent steps, i.e., steps S8 through S12 of FIG. 41 are the processes for correcting the position, inclination, and contraction of the component mounting circuit board 61 during mounting. That is, the following processes are carried out to correct the position, inclination, and contraction of the component mounting circuit board 61 during mounting.

Concretely, in step S8 of FIG. 41, the component mounting circuit board 61 is held by the conveyance table 165 and positioned in the component placing region.

Next in step S9 of FIG. 41, at least two board reference position calculation marks 202-1 and 202-2 of the component mounting circuit board 61 held by the conveyance table 165 are recognized, and the position coordinates of the recognized two board reference position calculation marks 202-1 and 202-2 are obtained.

Next, in step S10 of FIG. 41, on the basis of the position coordinates of the obtained two board reference position calculation marks 202-1 and 202-2, the NC coordinates of the two board reference position calculation marks 202-1 and 202-2 are corrected. That is, on the basis of a difference between the position coordinates of the two board reference position calculation marks 202-1 and 202-2 and the NC coordinates of the two board reference position calculation marks 202-1 and 202-2, the NC coordinates of the two board reference position calculation marks 202-1 and 202-2 are corrected to the position coordinates of the two board reference position calculation marks 202-1 and 202-2.

Next, in step S11 of FIG. 41, when the component 62 held by the component holding head 136 is positioned above each component placing position 205 of the component mounting circuit board 61, the component placing position 205 is corrected on the basis of the offset value of the placing region reference mark 201 located nearest to the board recognition camera 140 that serves as one example of the recognition camera provided for the component holding head 136 (in other words, the offset values of the area that includes the placing region reference mark 201 located nearest to the board recognition camera 140). Concretely, a nozzle (e.g., the nozzle located at the left end of FIG. 35) 1361, which becomes the reference of the plurality of nozzles 1361 of the head 136, is positioned at the NC coordinates of each placing region reference mark 201 on the glass board 200 that serves as one example of the placing region reference mark recognition reference board. The offset value of the placing region reference mark 201 located nearest to the board recognition camera 140 fixed to the head 136 is read from the storage section 173 using the camera 140, and the component placing position 205 is corrected on the basis of the read offset value.

Next, in step S12 of FIG. 41, the placing of the component 62 in the corrected component placing position 205 is carried out.

Although the offset value has been utilized in step S11 according to the above description, it is acceptable to move the board recognition camera by adding the offset value to the NC coordinate data of the board reference position calculation mark in step S9 and obtain the position away from the visual field center of the recognition camera.

The above is the outline of the placing position correction operation based on the measurement and the measurement results of the correction values for obtaining the offset value of each area.

A more concrete example of the component mounting method according to the second embodiment will be described below with reference to FIGS. 54 through 56.

(1) First of all, for example, the placing region reference mark recognition operation is carried out before the shipping of the component mounting apparatus from the component mounting apparatus manufacturing factory toward the user. It is to be noted that the following placing region reference mark recognition operation is similarly carried out at the time of overhauling after the apparatus is handed over to the user.

Figure 54:
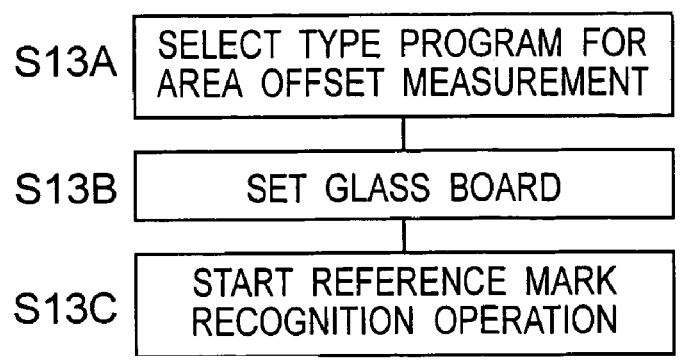
FIG. 54 is a flow chart of placing region reference mark recognition operation in a more concrete example of the component mounting method according to the second embodiment.

That is, as shown in FIG. 54, the operator is urged to select the placing region reference mark recognition reference board type program for the correction value measurement for obtaining the offset value of each area on the operation screen of the component mounting apparatus in step S13A of FIG. 54. The placing region reference mark recognition reference board type program is associated with the type and size of the glass board 200 that serves as one example of the placing region reference mark recognition reference board and the data of the NC coordinate of the position of each placing region reference mark 201 on the glass board 200. By selecting the board type, the glass board 200 is specified, and the data of the NC coordinate at the position of each placing region reference mark 201 on the glass board 200 are transferred from the storage section 173 to the control unit 170.

As one more concrete example, when 858 placing region reference marks constituted of 22 longitudinal rows by 39 transverse columns are arranged longitudinally and transversely at intervals of 10 mm on a glass board of a size of 410 mm×240 mm, the coordinate of the first placing region reference mark is (10, 10), the coordinate of the second placing region reference mark is (20, 10), and this coordinate plotting continues to the coordinate (390, 220) of the 800-th placing region reference mark. As another concrete example, when 2156 placing region reference marks constituted of 44 longitudinal rows by 49 transverse columns are arranged longitudinally and transversely at intervals of 10 mm on a glass board of a size of 510 mm×460 mm, the coordinate of the first placing region reference mark is (10, 10), the coordinate of the second placing region reference mark is (20, 10), and this coordinate plotting continues to the coordinate (490, 440) of the 2156-th placing region reference mark. These are the examples of the data of the NC coordinates.

Next, while or after the data of the NC coordinates are transferred from the storage section 173 to the control unit 170, the glass board 200 on which the placing region reference marks 201 are arranged at regular intervals in a grid form as shown in FIG. 40 is positioned in the component placing region by the conveyance table 165 of the board conveyance unit 190 in step S13B of FIG. 54 (refer to step S1 of FIG. 41).

Next, after the glass board 200 is positioned in the component placing region, the X-Y robot 120 is driven to move the head 136 in step S13C of FIG. 54 on the basis of the data of the NC coordinates at the positions of the placing region reference marks 201 transferred from the storage section 173 and thus move the board recognition camera 140 to the positions of the placing region reference marks 201 to recognize all the placing region reference marks 201 on the glass board 200 (refer to step S2 of FIG. 41). The position coordinate deviation ($\Delta X$, $\Delta Y$) obtained from each recognition result of all the placing region reference marks 201 or position coordinate ($X+\Delta X$, $Y+\Delta Y$) that contains the deviation are stored into the storage section 173 (refer to step S3 of FIG. 41). At this time, it is acceptable to obtain the coordinate of the position of each placing region reference mark 201 with higher accuracy by subjecting the position coordinates of each placing region reference mark 201 to the recognition process a plurality of times.

The respective positions of the placing region reference marks 201 are stored in the storage section 173 and managed as the respective movement positions of the component placing head 136. Therefore, according to the positioning position of the component placing head 136 during the placing region reference mark recognition operation, the component placing operation, the placing offset value measurement operation (particularly, the placing offset value measurement operation during the placing of a chip component or a QFP component) or any one of those operations in component mounting production, it is determined by the control unit 170 which area's offset value is reflected. For example, a concrete practice has the processes of allocating a region surrounded by placing region reference marks 201 at four points as one area, adopting the offset value of the position of any one placing region reference mark 201 among the placing region reference marks 201 at the four points as an area offset value of the placing position of the component 62 to be mounted within the area, and adding the offset value as the area offset value of the area to the position coordinate of the placing position to carry out the correction.

In the case of the glass board of the size of 410 mm×240 mm of the concrete example, position coordinate deviation (−0.132, −0.051) obtained from the recognition result of the first placing region reference mark or position coordinate (10−0.132, 10−0.051) containing the deviation is stored in the storage section 173. Moreover, position coordinate deviation (−0.132, −0.051) obtained from the recognition result of the second placing region reference mark or position coordinate (20−0.132, 10−0.051) containing the deviation are stored in the storage section 173. Moreover, position coordinate deviation (−0.139, −0.050) obtained from the recognition result of the third placing region reference mark or position coordinate (20−0.139, 20−0.050) containing the deviation is stored in the storage section 173. Moreover, position coordinate deviation (−0.139, −0.049) obtained from the recognition result of the fourth placing region reference mark or position coordinate (10−0.139, 20−0.050)

containing the deviation is stored in the storage section 173. The position coordinate deviation (−0.132, −0.051) of the first placing region reference mark is adopted as the area offset value. Moreover, as another example, position coordinate deviation (−0.132, −0.051) obtained from the recognition result of the 51st placing region reference mark or the position coordinate (210−0.132, 93−0.051) containing the deviation is stored in the storage section 173. Moreover, position coordinate deviation (−0.130, −0.067) obtained from the recognition result of the 52nd placing region reference mark or position coordinate (220−0.130, 93−0.067) containing the deviation is stored in the storage section 173. Moreover, position coordinate deviation (−0.139, −0.050) obtained from the recognition result of the 53rd placing region reference mark or position coordinate (220−0.139, 103−0.050) containing the deviation is stored in the storage section 173. Moreover, position coordinate deviation (−0.139, −0.049) obtained from the recognition result of the 54th placing region reference mark or position coordinate (210−0.139, 103−0.050) containing the deviation is stored in the storage section 173. The position coordinate deviation (−0.132, −0.051) of the 51st placing region reference mark is adopted as the area offset value. The operation is similarly carried out for other placing region reference marks.

(2) Next, the production board type is selected.

Figure 55:
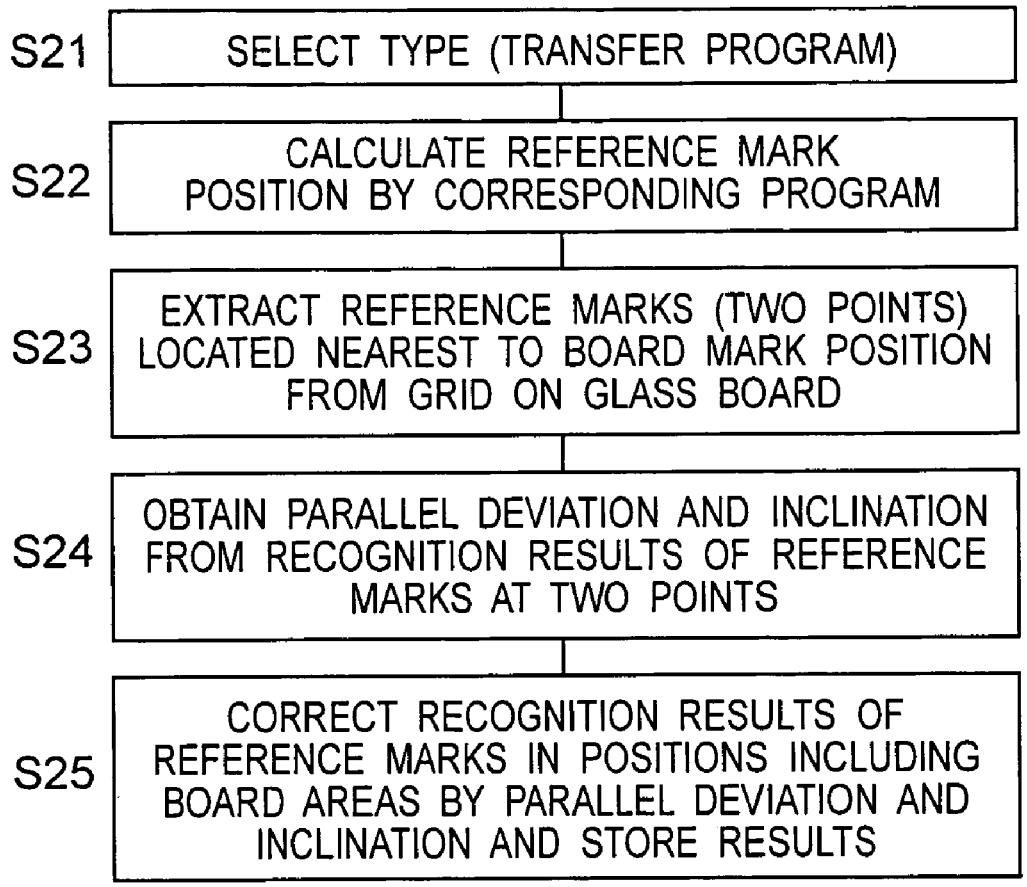
FIG. 55 is a flow chart of a type selection operation in a more concrete example of the component mounting method according to the second embodiment.

First of all, as shown in FIG. 55, in step S21, the board type selection program is transferred from the storage section 173 to the control unit 170, urging the operator to select the board type of the board 61 to be produced (subjected to mounting) on the operation screen of the component mounting apparatus. If the board type is selected by the operator, then the data of the size of the selected board and the NC coordinates of the position coordinates of the placing region reference marks 201 are read from the storage section 173 by the control unit 170.

Next, in step S22, the position coordinates of two board reference position calculation marks 202-1 and 202-2 of the board 61 of the selected board type are extracted from the data of the NC coordinates read in accordance with the selected board type by the control unit 170.

In the case of the glass board of the size of 410 mm×240 mm of the concrete example, (15, 18) and (215, 111) are extracted as the position coordinates of the board reference position calculation marks 202-1 and 202-2.

Next, in step S23, through the operation by the operation unit 171 on the basis of the data stored in the storage section 173, the placing region reference marks 201 on the glass board 200 located nearest to the two board reference position calculation marks 202-1 and 202-2 are extracted one for each. For example, in FIG. 52, the first placing region reference mark 201a located at the lower left is extracted for the first board reference position calculation mark 202-1, and the 52nd placing region reference mark 201b located at the lower left is extracted for the second board reference position calculation mark 202-2.

In the case of the glass board of the size of 410 mm×240 mm of the concrete example, the position coordinate (10, 10) of the first placing region reference mark 201a at the lower left is extracted for the position coordinate (15, 18) of the first board reference position calculation mark 202-1, and the position coordinate (210, 110) of the 52nd placing region reference mark 201b at the lower left is extracted for the position coordinates (215, 111) of the second board reference position calculation mark 202-2.

Next, in step S24, the parallel deviation, the inclination, and the expansion/contraction rate are obtained through the operation by the operation unit 171 from the recognition results of the first placing region reference mark 201a and the 52nd placing region reference mark 201b of the extracted two points.

Concretely, among the first placing region reference mark 201a and the 52nd placing region reference mark 201b of the two points, the parallel deviation is considered with the first placing region reference mark 201a served as a reference.

Therefore, assuming that the offset values of the first placing region reference mark 201a is ($\Delta X_a$, $\Delta Y_a$), then the amount of parallel deviation ($\Delta X_{ab}$, $\Delta Y_{ab}$) can be expressed by the following Equations (6).

$$\Delta X_{ab} = \Delta X_a$$

$$\Delta Y_{ab} = \Delta Y_a$$

In the case of the glass board of the size of 410 mm×240 mm of the concrete example, assuming that the area offset value of the first placing region reference mark 201a is (−0.132, −0.051), then the amount of parallel deviation becomes (−0.132, −0.050) according to the Equations (6).

On the other hand, the inclination of the glass board 200 is expressed by an angle made between a straight line that connects the NC coordinates of the first placing region reference mark 201a and the 52nd placing region reference mark 201b and a straight line that connects the coordinates obtained by adding the respective offset values to the NC coordinates of the first placing region reference mark 201a and the 52nd placing region reference mark 201b.

Assuming that the NC coordinates of the first placing region reference mark 201a and the 52nd placing region reference mark 201b are ($X_a$, $Y_a$) and ($X_b$, $Y_b$), and the offset values of the first placing region reference mark 201a and the 52nd placing region reference mark 201b are ($\Delta X_a$, $\Delta Y_a$) and ($\Delta X_b$, $\Delta Y_b$), respectively, then an inclination $\Delta \theta_{ab}$ of the first placing region reference mark 201a and the 52nd placing region reference mark 201b can be expressed by the following Equations (7).

$$\Delta\theta_{ab} = \tan^{-1}\{(Y_b - Y_a)/(X_b - X_a)\} - \tan^{-1}[\{(Y_b + \Delta Y_b) - (Y_a + \Delta Y_a)\}/\{(X_b + \Delta X_b) - (X_a + \Delta X_a)\}]$$

In the case of the glass board of the size of 410 mm×240 mm of the concrete example, assuming that the NC coordinates of the first placing region reference mark 201a and the 52nd placing region reference mark 201b are (10, 10) and (210, 110), and the offset values of the first placing region reference mark 201a and the 52nd placing region reference mark 201b are (−0.132, −0.051) and (−0.130, −0.067), respectively, then, according to the Equations (7), the inclination $\Delta\theta_{ab}$ of the first placing region reference mark 201a and the 52nd placing region reference mark 201b is expressed by the following Equations (8).

$$\Delta\theta_{ab} = \tan^{-1}\{(110 - 10)/(210 - 10)\} - \tan^{-}[\{(110 - 0.067) - (10 - 0.051)\}/\{(210 - 0.130) - (10 - 0.132)\}]$$

$$= -0.004125°$$

In the basis of the idea that the expansion/contraction rate E of the glass board 200 is based on the glass board 200 as a reference, the expansion/contraction rate of the glass board 200 is assumed to be one.

Next, in step S25, the position coordinates of the positions of all the placing region reference marks 201, which have been stored in step S3 of FIG. 41 and correspond to the regions of the board 61 to be subjected to mounting, are corrected through calculation by the parallel deviation and the inclination (and the expansion/contraction rate) in the operation unit 171, and the position coordinates of the placing region reference marks 201 after the correction are stored in the storage section 173. Concretely, the correction values of the placing region reference marks 201 are to be corrected in consideration of the parallel deviations, the inclination, and the expansion/contraction rate of the first placing region reference mark 201a and the 52nd placing region reference mark 201b, and thereafter stored as offset values in the storage section 173. Assuming herein that the parallel deviation is ($\Delta X_{ab}$, $\Delta Y_{ab}$), the inclination is $\Delta \theta_{ab}$, the expansion/contraction rate is E and the NC coordinate of the first placing region reference mark 201a is ($X_a$, $Y_a$), the NC coordinate of an arbitrary placing region reference mark 201 of the object to be corrected is ($X_{nc}$, $Y_{nc}$) and the offset value is ($\Delta X_R$, $\Delta Y_R$), then the offset value ($\Delta X_{off}$, $\Delta Y_{off}$) of each placing region reference mark 201 after the correction can be expressed by the following equations (9).

$$X_{off}=E\{((X_{nc}+\Delta X_R)-X_a)\} \cos \Delta\theta_{ab}((Y_{nc}+\Delta Y_R)-Y_a)\sin \Delta\theta_{ab}\}-(X_{nc}-X_a)+\Delta X_{ab}$$

$$Y_{off}=E\{(X_{nc}+\Delta X_R)-X_a)\} \sin \Delta\theta_{ab}+((Y_{nc}+\Delta Y_R)-Y_a)\cos \Delta\theta_{ab}\}-(Y_{nc}-Y_a)+\Delta Y_{ab}$$

In the case of the glass board of the size of 410 mm×240 mm of the concrete example, assuming that the parallel deviation is (−0.132, −0.050), the inclination $\Delta\theta_{ab}$ is 0.004125°, the expansion/contraction rate E is 1.000026, the NC coordinate of the first placing region reference mark 201a is (10, 10) and the offset value is (−0.132, −0.050), then the offset value ($\Delta X_{off}$, $\Delta Y_{off}$) of the first placing region reference mark 201 after the correction becomes (0, 0). Likewise, assuming that the NC coordinate of the placing region reference mark 201 of the 15-row and 8-column of the object to be corrected is (150, 80) and the offset value is (−0.132, −0.060), then the offset value ($\Delta X_{off}$, $\Delta Y_{off}$) of the placing region reference mark 201 after the correction becomes (−0.001, −0.015).

(3) Next, the placing region reference mark recognition and the component placing operation are carried out.

Figure 56:
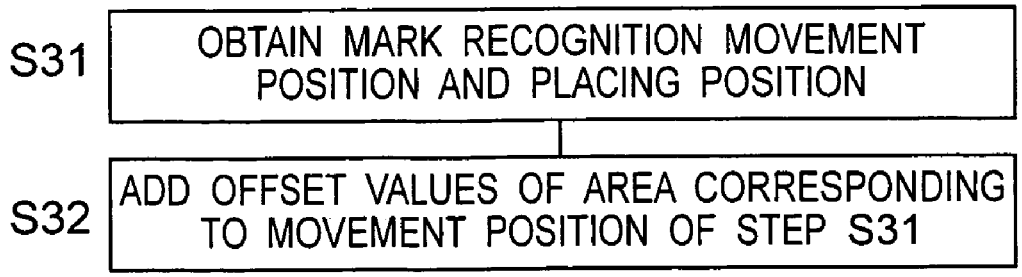
FIG. 56 is a flow chart of placing region reference mark recognition operation and component placing operation in a more concrete example of the component mounting method according to the second embodiment.

First of all, as shown in FIG. 56, in step S31, the control unit 170 reads the position, to which the head 136 should move for the placing region reference mark recognition operation or the component placing operation or the placing offset value measurement operation, from the mounting data in the storage section 173 and obtains the recognition position or the placing position.

At this time, for example, during the component placing operation, when the head 136 is moved by the X-Y robot 120 and stopped in a certain movement position and a certain component 62 sucked and held by a certain nozzle 1361 of the head 136 is positioned above the placing position after the correction of the component 62 on the board 61 to be ready for the placing operation, the placing region reference mark 201 located nearest to the visual field center of the board recognition camera 140 of the head 136 at the time is regarded as the placing region reference mark 201 for the component 62.

Likewise, during the placing region reference mark recognition operation, when the head 136 is moved by the X-Y robot 120 and stopped in a certain movement position and a certain nozzle 1361 of the head 136 is positioned above a certain placing region reference mark 201 after the correction of the placing region reference mark recognition reference board 200, the placing region reference mark 201 located nearest to the visual field center of the board recognition camera 140 of the head 136 at the time is regarded as the placing region reference mark 201 for the certain placing region reference mark 201.

Moreover, similarly, during the placing offset value measurement operation, the head 136 is moved by the X-Y robot 120 and stopped in a certain movement position and a certain nozzle 1361 of the head 136 is positioned above a certain board reference position calculation mark 202-1 or 202-2 after the correction of the placing region reference mark recognition reference board 200, the placing region reference mark 201 located nearest to the visual field center of the board recognition camera 140 of the head 136 at the time is regarded as the placing region reference mark 201 for the board reference position calculation mark 202-1 or 202-2.

Figure 53:
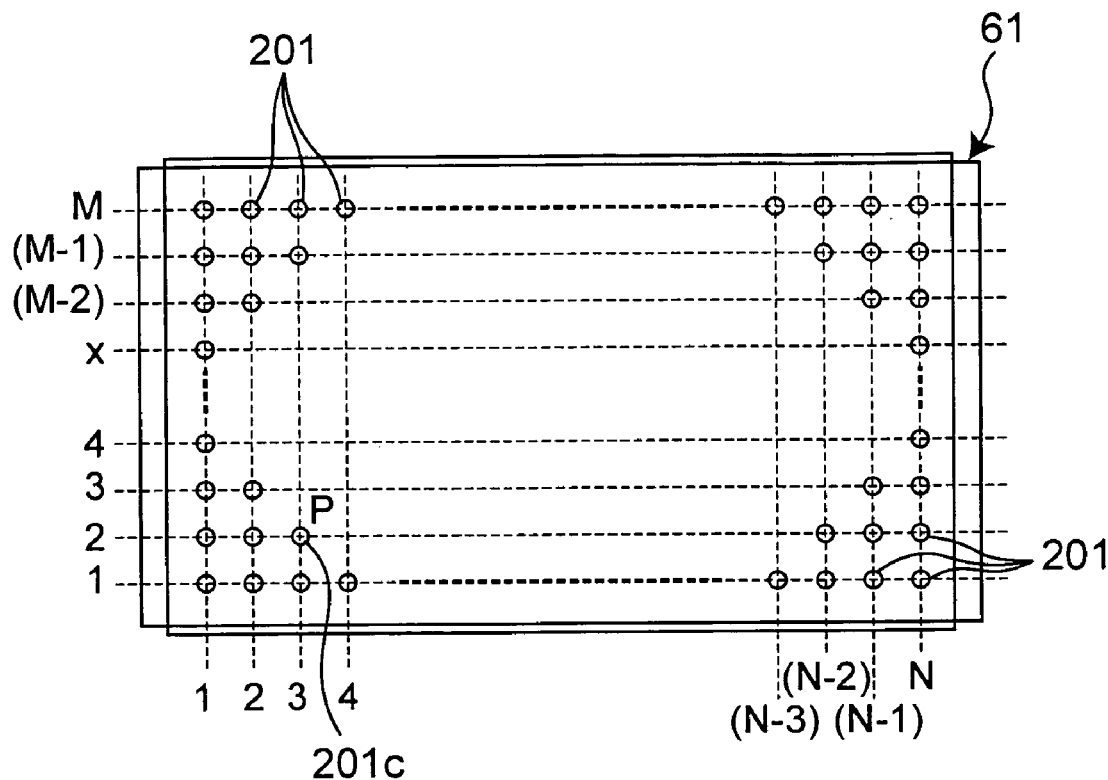
FIG. 53 is an explanatory view showing a state in which a region P surrounded by four placing region reference marks is allocated as one area when there are placing region reference marks of M columns in the vertical direction and N rows in the horizontal direction on the board to be subjected to mounting.

Next, in step S32, the offset value of the area corresponding to the movement position of the head 136 in step S31 is added to the position coordinate of the movement position of the head 136 by the operation unit 171. Concretely, as shown in FIG. 53, when there are placing region reference marks 201 constituted of M rows in the longitudinal direction by N columns in the transverse direction of the board 61 to be subjected to mounting (accordingly, a total of M×N placing region reference marks 201), a region (the region indicated by P in FIG. 53) surrounded by the placing region reference marks 201 at four points is allocated as one area. Correction is carried out by adopting the offset value of any one of the placing region reference marks 201 at the four points or, for example, the position of a placing region reference mark 201c located at the lower left as the area offset value for the position coordinate in the placing position of the component 62 to be mounted in the area (or the position coordinate of an individual mark that becomes a criterion of the placing position) and adding the offset value as the area offset value to the position coordinate in the placing position (or the position coordinate of the individual mark that becomes the criterion of the placing position).

Next, by moving the head 136 to the corrected position coordinates, highly accurate positioning can be secured, and the placing region reference mark recognition operation or the component placing operation or the placing offset value measurement operation can be carried out with high accuracy. Particularly, during the component placing operation, the area offset values can be used as numerical values for correcting individual marks for discrete components such as IC components (BGA components, etc.) that require high placing accuracy (e.g., the X-Y robot positioning accuracy is about ±2 μm, and the total accuracy of the mounting apparatus is about ±20 μm).

Figure 42:
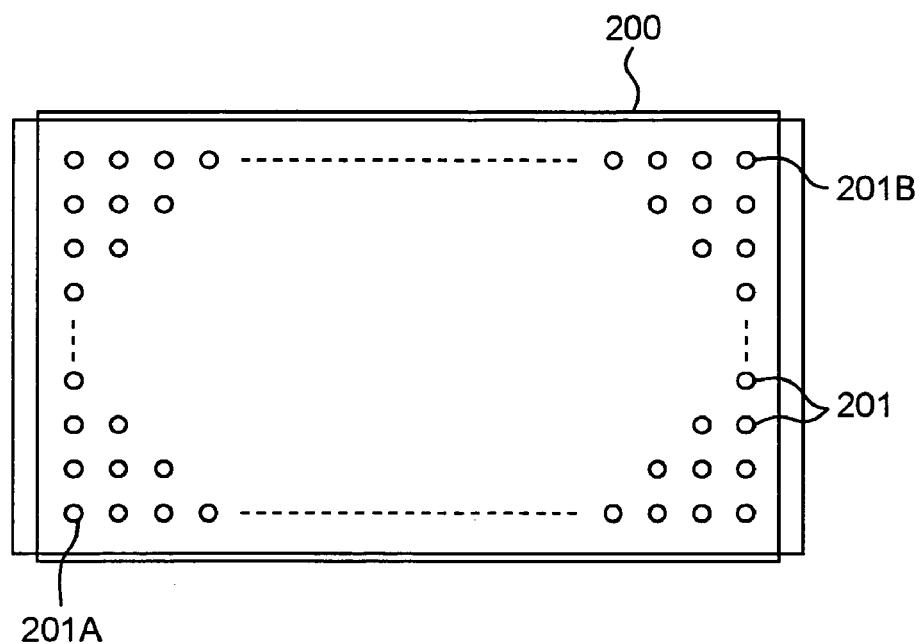
FIG. 42 is a plan view showing placing region reference marks on the glass board used by the component mounting method according to the second embodiment of the present invention.

When the position coordinate (position coordinate) of the recognized placing region reference mark 201 are stored in the storage section 173 in step S3 of FIG. 41, the following corrections may be further added. That is, the position coordinate of each placing region reference mark 201 is calculated by recognizing the placing region reference marks 201A and 201B at two points located at the lower left and the upper right of the glass board 200 as shown in FIG. 42, obtaining the parallel deviation and the inclination of the glass board 200 with respect to the conveyance table 165, and calculating the recognition positions of all the placing region reference marks 201 to be measured in the operation unit 171 in consideration of the obtained correction values.

The parallel deviation of the glass board 200 is considered on the basis of the placing region reference mark 201A used as a reference out of the placing region reference marks 201A and 201B at the two points. Moreover, the center of the board recognition camera 140 is moved to the position of the placing region reference mark 201 in the NC coordinates when the placing region reference marks 201A and 201B are recognized. Therefore, the amount of parallel deviation ($\Delta X$, $\Delta Y$) becomes position coordinate deviation (the amount of deviation from the center of the recognition visual field of the board recognition camera 140) obtained from the recognition results of the placing region reference mark recognition.

Figure 64:
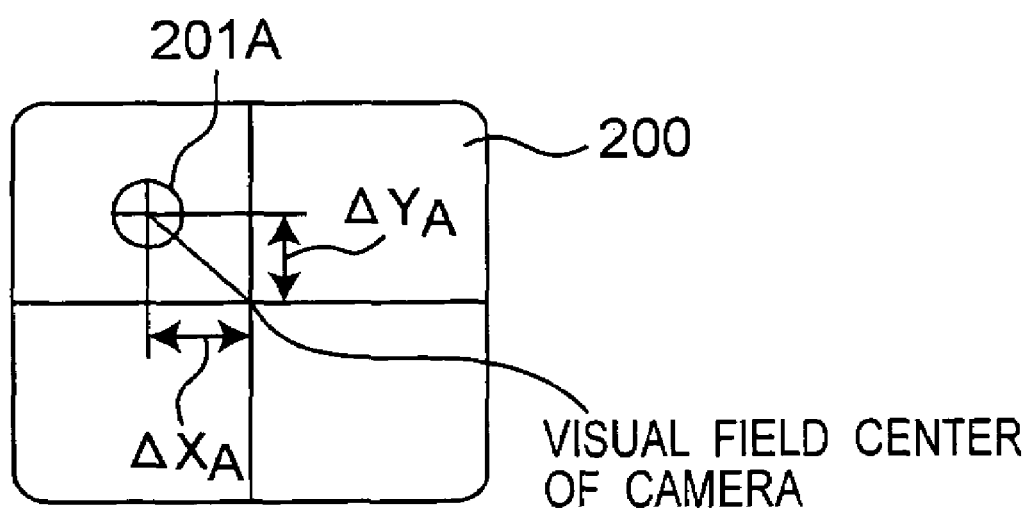
FIG. 64 is an explanatory view showing the amounts of displacement of a placing region reference mark in the X-direction and the Y-direction from the visual field center of the board recognition camera.

Therefore, assuming that the position coordinate deviation obtained from the recognition result of the placing region reference mark 201A is ($\Delta X_A$, $\Delta Y_A$) (see FIG. 64), then the amount of parallel deviation ($\Delta X_g$, $\Delta Y_g$) of the glass board 200 can be expressed by the following equations (10).

$$\Delta X_g = \Delta X_A$$

$$\Delta Y_g = \Delta Y_A$$

It is to be noted that coordinate transformation from the position coordinate system to the NC coordinate system is carried out.

Moreover, the inclination of the glass board 200 is assumed to have an angle $\Delta\theta$ made between a straight line that connects the placing region reference mark 201A and the placing region reference mark 201B on the NC coordinates and a straight line that connects the recognized placing region reference mark 201A' and placing region reference mark 201B'.

That is, assuming that the NC coordinates of the placing region reference marks 201A and 201B are ($X_A$, $Y_A$) and ($X_B$, $Y_B$) and the position coordinate deviations (the amounts of deviations from the visual field center) obtained from the recognition results when the placing region reference marks 201A and 201B are recognized are ($\Delta X_A$, $\Delta Y_A$), ($\Delta X_B$, $\Delta Y_B$), then the board inclination $\Delta\theta_g$ can be expressed by the following equations (11).

$$\Delta\theta_g = \tan^{-1}\{(Y_B - Y_A)/(X_B - X_A)\} - \tan^{-1}[\{(Y_B + (-\Delta Y_B)) -$$

$$(Y_A + (-\Delta Y_A))\}/\{(X_B + \Delta X_B) - (X_A + \Delta X_A)\}]$$

$$= \tan^{-1}\{(Y_B - Y_A)/(X_B - X_A)\} - \tan^{-1}[\{(Y_B - \Delta Y_B) - (Y_A -$$

$$\Delta Y_A)\}/\{(X_B + \Delta X_B) - (X_A + \Delta X_A)\}]$$

It is to be noted that coordinate deformation from the position coordinate system to the NC coordinate system is carried out.

Therefore, the position coordinate of each recognized placing region reference mark 201 is calculated by the operation unit 171 in consideration of the parallel deviation and the inclination of the glass board 200. In this case, assuming that the parallel deviation is ($\Delta X_g$, $\Delta Y_g$), the inclination is $\Delta\theta_g$, the NC coordinate of the placing region reference mark 201A is ($X_A$, $Y_A$) and the NC coordinate of the placing region reference mark N located in an arbitrary position on the glass board 200 is ($X_N$, $Y_N$), then the recognition position ($X_{RN}$, $Y_{RN}$) of the placing region reference mark N in an arbitrary position is expressed by the equations (12).

$$X_{RN} = (X_n - X_A)\cos\theta - (Y_m - Y_A)\sin\theta + \Delta X_g$$

$$Y_{RN} = (X_n - X_A)\sin\theta + (Y_m - Y_A)\cos\theta + \Delta Y_g$$

Therefore, the recognition position of the thus obtained placing region reference mark N may be stored as the position coordinate (position coordinate) of the recognized placing region reference mark 201 into the storage section 173 in step S3 of FIG. 41.

According to the second embodiment, by recognizing the placing region reference marks 201 arranged at regular intervals on the glass board 200 that serves as one example of the placing region reference mark recognition reference board, determining the offset value of each area corresponding to the board size as the area offset value from the recognition result and reflecting the corresponding area offset values of the movement positions of the component placing head 136 as the numerical values for correction during the placing position correction, mark recognition and correction, and the placing position offset value measurement operation, or any one of those operations, the deviation factor due to the distortion of the X-Y robot operation is absorbed, and optimum offset values corresponding to the board size are obtained, allowing the placing to be achieved with high accuracy.

Moreover, by reflecting the area offset values corresponding to the movement positions of the component placing head 136 as the numerical values for correction also when the placing region reference mark is recognized, the deviation factor due to the distortion of the X-Y robot operation is absorbed, and optimum offset values corresponding to the board size are obtained, allowing the placing to be achieved with higher accuracy.

It is to be noted that the present invention is not limited to the second embodiment but allowed to be implemented in various forms.

For example, the two of the first and 52nd placing region reference marks 201a and 201b or 201A and 201B or 202-1 and 202-2 are merely required to be located at different positions diagonally separated on the placing region reference mark recognition reference board or the board to be subjected to mounting or different positions along either one of the X- and Y-directions, or in other words, two arbitrary different points other than an identical point.

Figure 57:
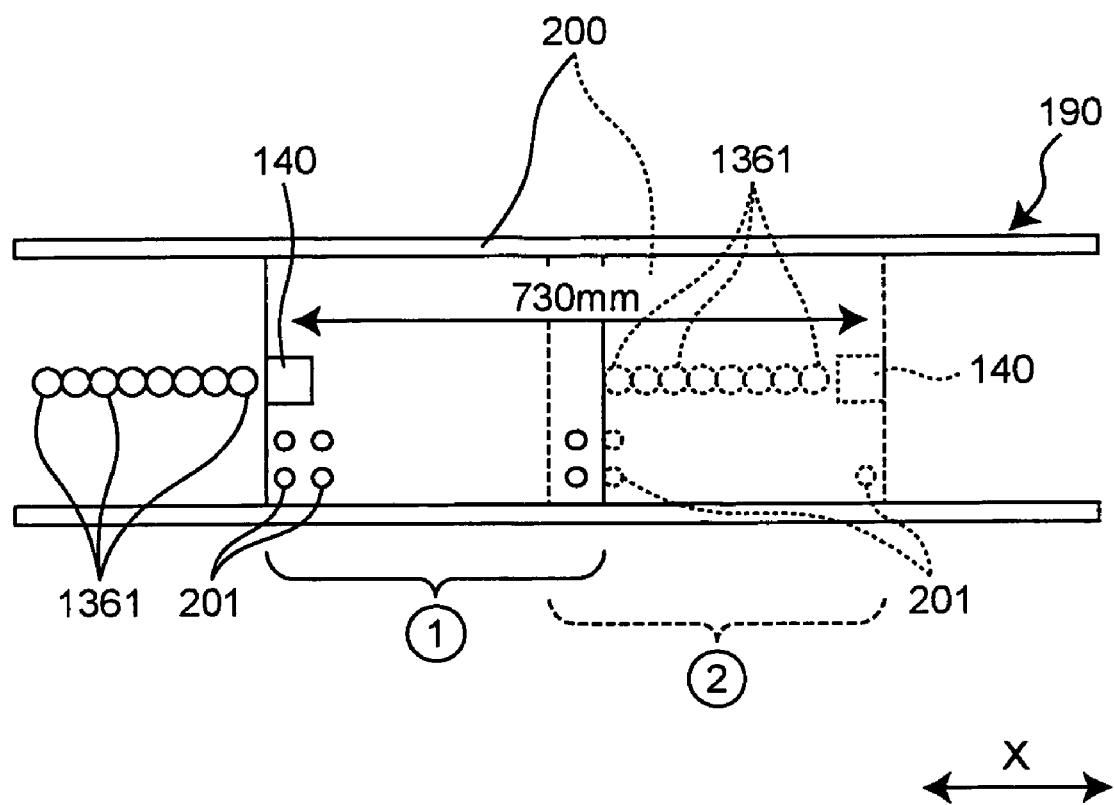
FIG. 57 is an explanatory view in a case where data ① of the position coordinates of the placing region reference mark measured in the normal position of the board and data ② of the position coordinates of the placing region reference mark measured in the position moved leftward by 350 mm are combined with each other.

Moreover, when the placing region reference mark recognition reference board 200 is smaller than the board 61 to be subjected to mounting, it is proper to manage the data by recognizing and obtaining the position coordinates of the placing region reference marks 201 in a state in which the placing region reference mark recognition reference board 200 is positioned in either one end of the component placing region of the board 61 to be subjected to mounting, thereafter recognizing and obtaining again the position coordinates of the placing region reference marks 201 by moving the placing region reference mark recognition reference board 200 to the other end of the component placing region of the board 61 to be subjected to mounting, and recognizing and obtaining the position coordinates of the placing region reference marks 201 by means of one large virtual placing region reference mark recognition reference board 200 as if common portions were overlapped. For example, concretely as shown in FIG. 57, data (1) of the position coordinates of the placing region reference marks 201 measured in the normal position of the board and data (2) of the position coordinates of the placing region reference mark 201 measured in a position moved leftward by 350 mm are combined with each other. The data (1) and data (2) are subjected to only rotational and shifting corrections so that they have common portions coinciding with each other. Since the common portions do not coincide with each other when the expansion/contraction rate is added, the rate is not considered.

Working Examples

There are shown examples of a change in the amount of deviation and a change in the component placing accuracy between when the offset values of the areas according to the second embodiment are not effected and when the values are effected.

The offset values of the areas were measured by using the placing region reference marks 201 of the board of a size of 428 mm×250 mm shown in FIG. 57.

In FIG. 57, when the placing region reference marks 201 are recognized, the visual field center of the board recognition camera 140 is located in a position 60 mm apart from the center of the nozzle 1361 located at the right end in the X-direction (i.e., in the rightward direction in FIG. 57) in terms of the arrangement of the head 136. Therefore, in order to allow all the nozzles 1361 including the nozzle located at the left end and the nozzle located at the right end to be positioned in every region on the board 61, the board recognition camera 140 is required to be moved in the X-direction (i.e., in the rightward direction in FIG. 57) by 720.5 mm (XL=board width 510 mm+60 mm+distance 150.5 mm between both end nozzles) from the position of the board stopper that is brought into contact with the left end of the board 61 and positions the board 61 in the placing position of the conveyance table 165.

However, in the case where the placing region reference mark recognition reference board used in recognizing the placing region reference mark 201 is located within a range of 410 mm in the X-direction from the position of the board stopper, the range of the entire region (0 mm to 720.5 mm) of the board 61 can be covered by recognizing twice the placing region reference marks 201 with the placing region reference mark recognition reference board shifted in the X-direction.

Figure 58:
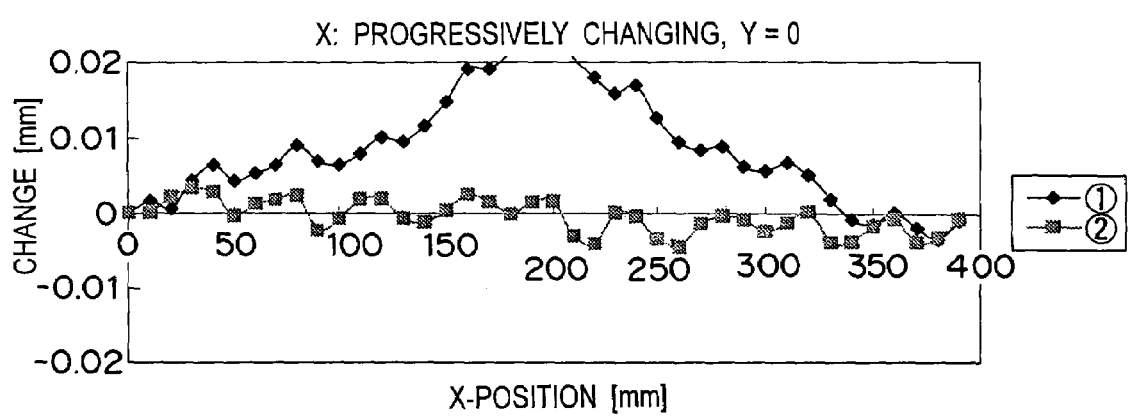
FIG. 58 is a graph showing the relation between the position in the X-direction and the amount of displacement in the X-direction when the head is moving in the X-direction at 10-mm pitches over the board of FIG. 57.
Figure 59:
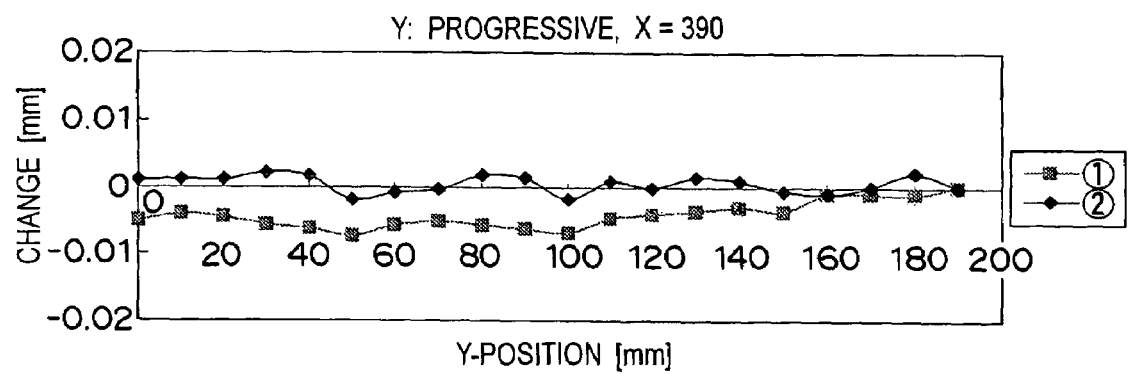
FIG. 59 is a graph showing the relation between the position in the Y-direction and the amount of displacement in the Y-direction when the head is moving in the Y-direction at 10-mm pitches over the board of FIG. 57.

In the graphs shown in FIGS. 58 and 59, output data of the position coordinate deviation obtained from the recognition results when the offset values of the areas are used are plotted. The two graphic lines of FIG. 58 show the relation between the position in the X-direction and the amount of deviation in the X-direction when the head 136 is moving in the X-direction at 10-mm pitches. The graphic line (1) indicates the relation before the use of the offset values of the areas, and the line (2) indicates the relation after the use of the offset values of the areas. The two graphic lines of FIG. 59 show the relation between the position in the Y-direction and the amount of deviation in the Y-direction when the head 136 is moving in the Y-direction at 10-mm pitches. The graph line (1) indicates the relation before the use of the offset values of the areas, and the line (2) indicates the relation after the use of the offset values of the areas.

In FIG. 58, with regard to the graphic line (1), in the X-direction, before the use of the offset values of the areas, a maximum of 20 μm of an error occurs in the position where the board stopper is moved by 200 mm exhibiting an upwardly protruding configuration before the use of the offset values of the areas. In contrast to this, the graphic line (2) after the correction exhibits a transition at almost zero level.

According to the graph of FIG. 59, in the Y-direction, the graphic line (1) of the relation before the use of the offset values of the areas exhibit a transition with slight inclinations, whereas the graphic line (2) after the use of the offset values of the areas exhibits a transition at almost zero level similarly to the X-direction.

The graphic lines (2) after the use of the offset values of the areas in FIGS. 58 and 59 have errors falling within a range of ±5 μm in each of the X-direction and the Y-direction.

Figure 60:
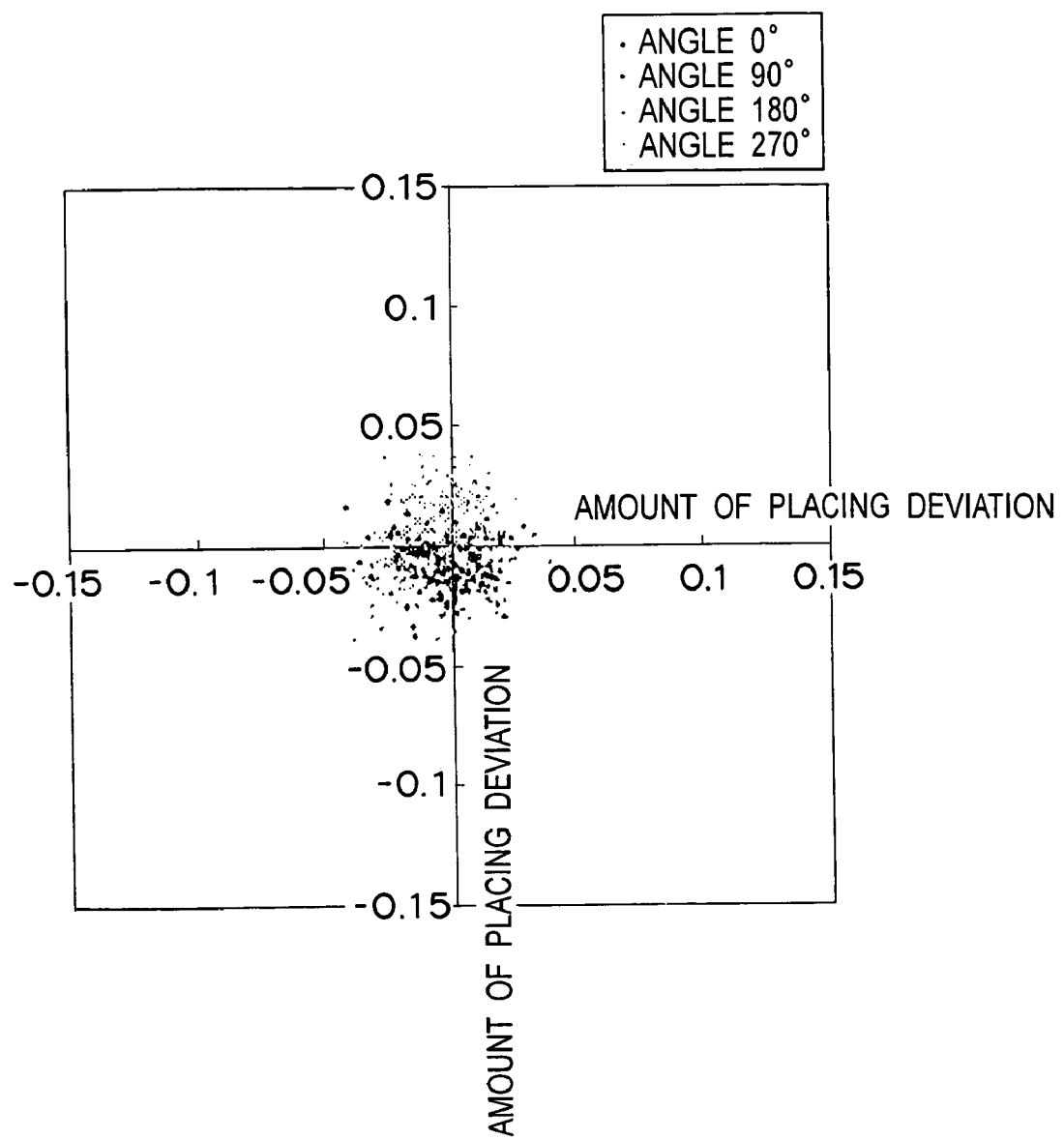
FIG. 60 is a graph showing the placing accuracy when 400 ceramic capacitors of chip components of a size of 1.6 mm×0.8 mm are placed on a board of a size of 428 mm×250 mm and the offset value according to the second embodiment is not applied, where the vertical axis represents the amount of placing displacement in the Y-direction and the horizontal axis represents the amount of placing displacement in the X-direction.
Figure 61:
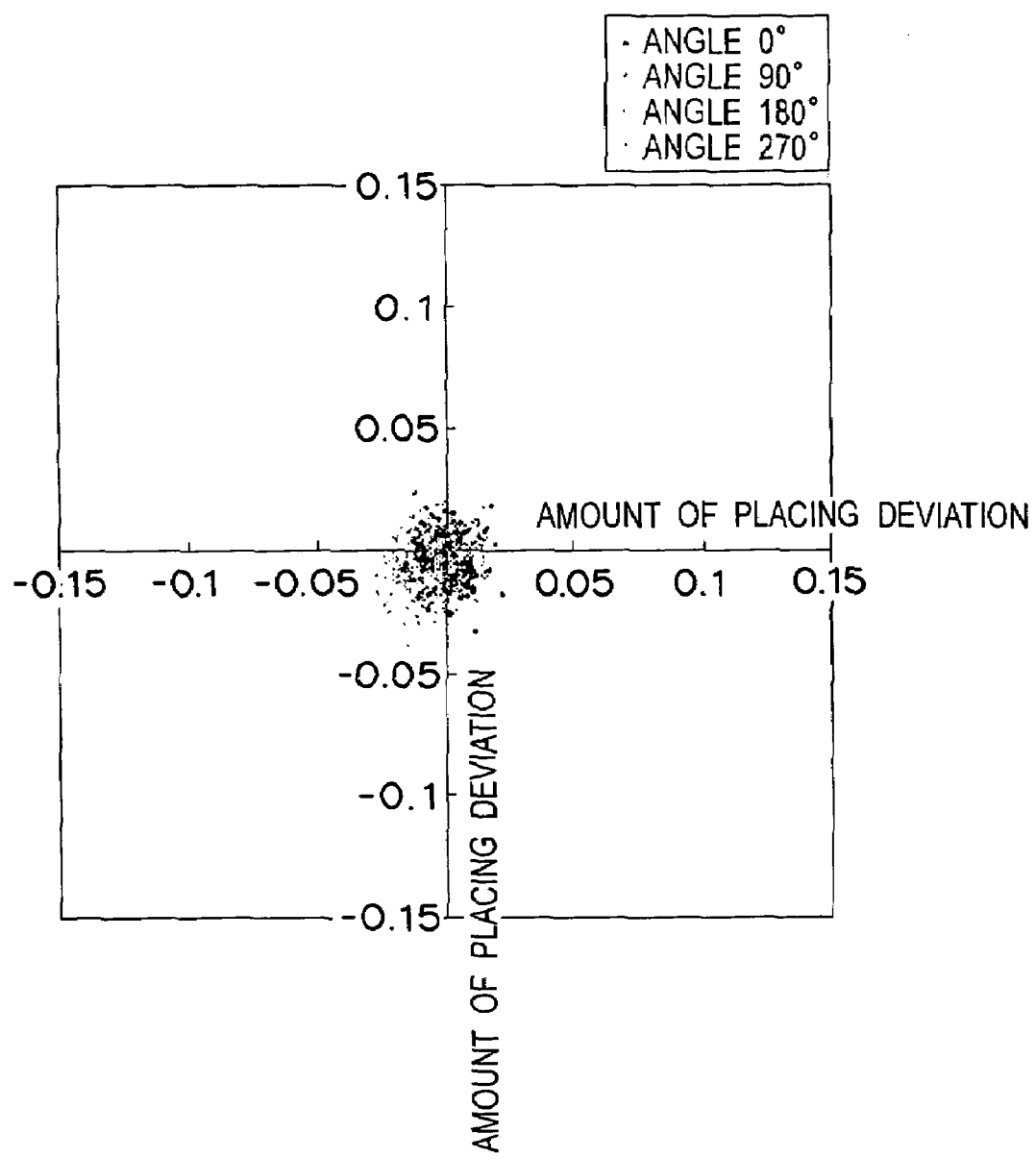
FIG. 61 is a graph showing the placing accuracy when 400 ceramic capacitors of chip components of a size of 1.6 mm×0.8 mm are placed on a board of a size of 428 mm×250 mm and the offset value according to the second embodiment is applied, where the vertical axis represents the amount of placing displacement in the Y-direction and the horizontal axis represents the amount of placing displacement in the X-direction.
Figure 62:
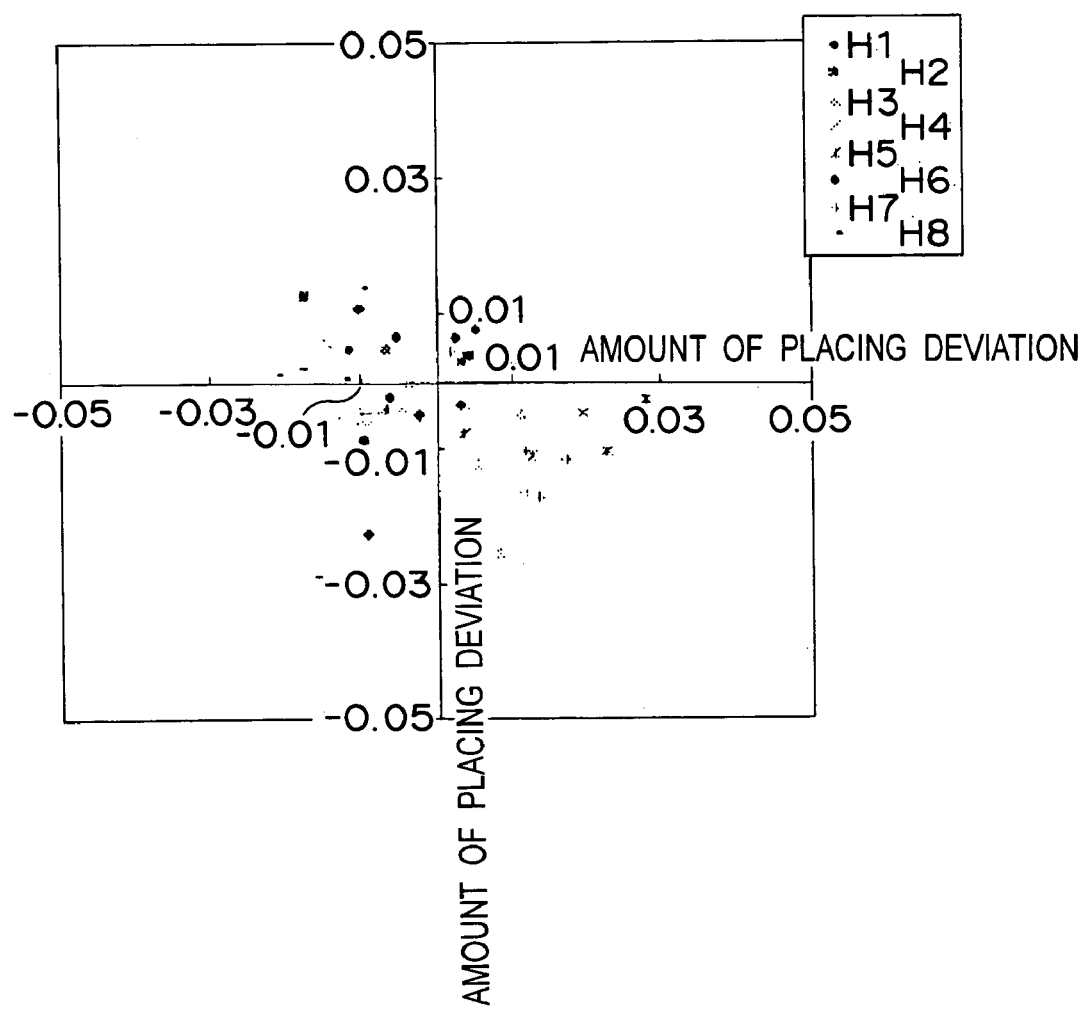
FIG. 62 is a graph showing the placing accuracy when numbers of QFP components are placed on a board of a size of 428 mm×250 mm and the offset value according to the second embodiment is not applied, where the vertical axis represents the amount of placing displacement in the Y-direction and the horizontal axis represents the amount of placing displacement in the X-direction.
Figure 63:
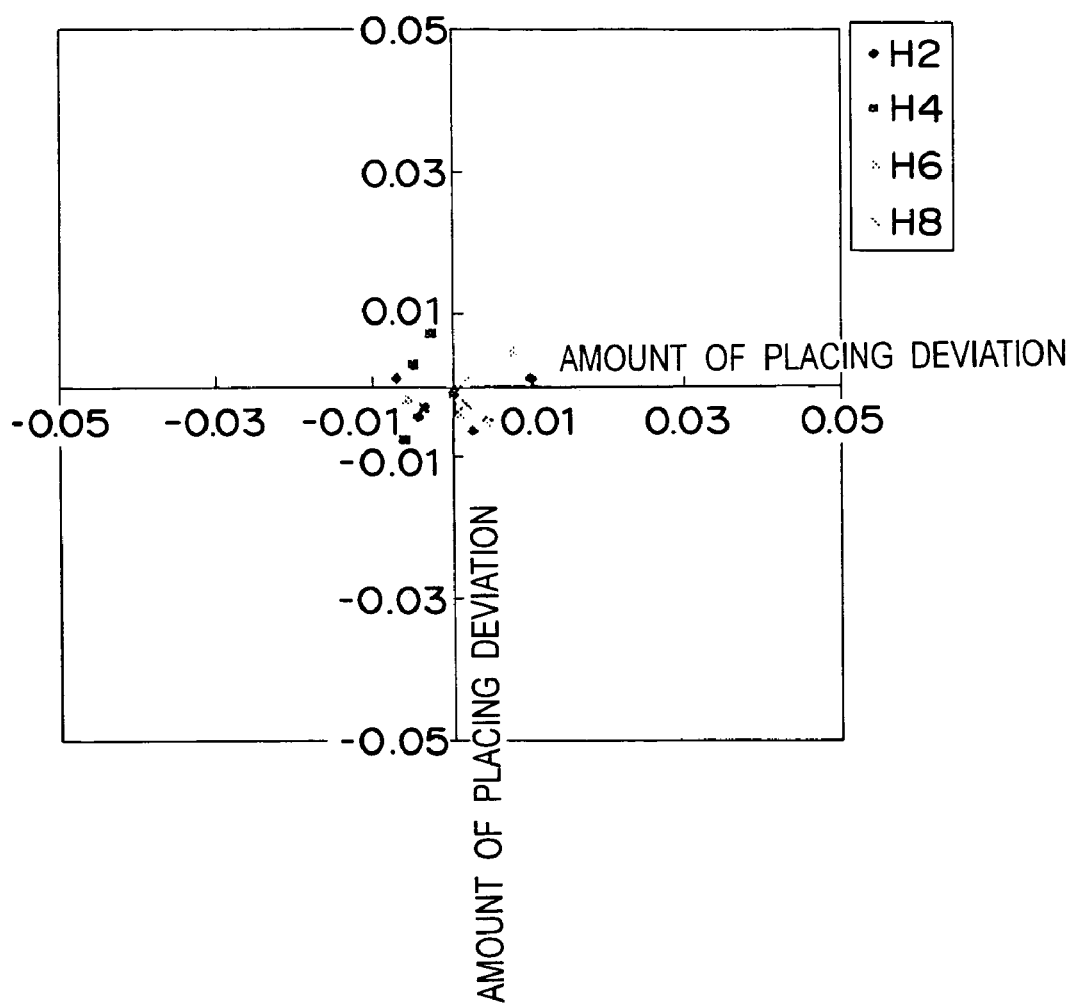
FIG. 63 is a graph showing the placing accuracy when numbers of QFP components are placed on a board of a size of 428 mm×250 mm and the offset value according to the second embodiment is applied, where the vertical axis represents the amount of placing displacement in the Y-direction and the horizontal axis represents the amount of placing displacement in the X-direction.

Next, with regard to a change in the component placing accuracy, FIG. 60 shows the placing accuracy in a case where the offset values of the areas according to the second embodiment are not used when 400 ceramic capacitors, each of which is a chip component having a size of 1.6 mm×0.8 mm, are placed on a board of a size of 428 mm×250 mm, while FIG. 61 shows the placing accuracy in a case where the offset values of the areas of the second embodiment according to the second embodiment are used. Moreover, in a case where numbers of QFP components are placed on a board, FIG. 62 shows the placing accuracy when the offset values of the areas according to the second embodiment are not used, while FIG. 63 shows the placing accuracy when the offset values of the areas according to the second embodiment are used. The dimensional values are each on the millimeter order in the figures.

According to the above results, a tendency of improvement in the placing accuracy in the X-direction and the Y-direction are observed as shown in FIGS. 61 and 63. That is, it can be understood that the amount of deviation between the corrected placing position data and the true placing position data is reduced also numerically in comparison with the case where the offset values of the areas according to the second embodiment are not used.

As a concrete numerical value in one example, the correction value is about 10 μm to 30 μm. When a board of 400 mm×250 mm, which serves as one example of the small board, is subjected to coordinate transformation, the expansion/contraction rate is about 1.000025. When a board of 600 mm×250 mm, which serves as one example of the large board, is subjected to coordinate transformation, the expansion/contraction rate is about 1.00005. Besides the boards, this method is effective also for a small board of a size of 100×100 mm.

The present invention is applicable to the mounting of almost all the electronic components to be placed and applicable to, for example, rectangular chip capacitors, rectangular chip resistors, small components such as transistors, ICs of the objectives of fine pitch mounting such as QFP or BGA.

It is also possible to measure the movement position of the board camera section by means of a laser scale (laser measuring instrument) instead of measuring the placing region reference mark recognition reference board by means of the camera (in this case, the placing region reference mark recognition reference board becomes unnecessary).

In addition to the correction by means of the area offset values, the accuracy can be further improved by reflecting the area offset values in the measurement positions of "board camera offset value" and the "nozzle pitch" during the camera calibration on the "board camera offset value" and the "nozzle pitch" used for the head movement position calculation during the operations of the mark recognition operation (board mark recognition, individual mark recognition corresponding to IC components, pattern mark recognition indicated on the individual boards of multiple printed board, recognition of group mark indicated every component group, recognition of bad mark indicating defectiveness), component placing operation, placing offset value measurement operation, and placing region reference mark recognition.

Although the offset values of the board recognition camera 140 and the nozzle pitch (distance between the nozzles of a plurality of nozzles) are obtained during the camera calibration, the correction values of each area for correcting the distortion of the X-Y robot are not reflected in the process of obtaining them. Therefore, by reflecting the correction values in the offset values of the board recognition camera 140 and the nozzle pitch used in obtaining the head movement position during the mark recognition and the component placing operation and/or the placing offset value measurement operation, placing can be achieved with higher accuracy. The offset values of the board recognition camera 140 and the nozzle pitch are given as distances from the first nozzle 1361-1. Therefore, when the correction values are reflected in the offset values of the board recognition camera 140 and the nozzle pitch used in obtaining the head movement position during the mark recognition and the component placing operation and/or the placing offset value measurement operation, differences between the board camera offset values or the area offset values during the nozzle pitch measurement and the area offset values during the measurement of the position of the first nozzle 1361-1 are reflected in each operation.

Figure 67A:
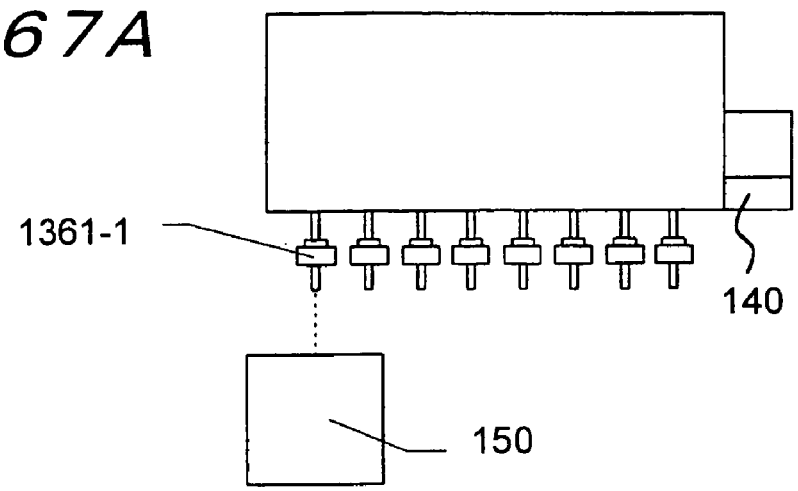
FIGS. 67A, 67B, and 67C are views showing the positional relation between the nozzle, the component recognition camera, and the board recognition camera during measurement.
Figure 67B:
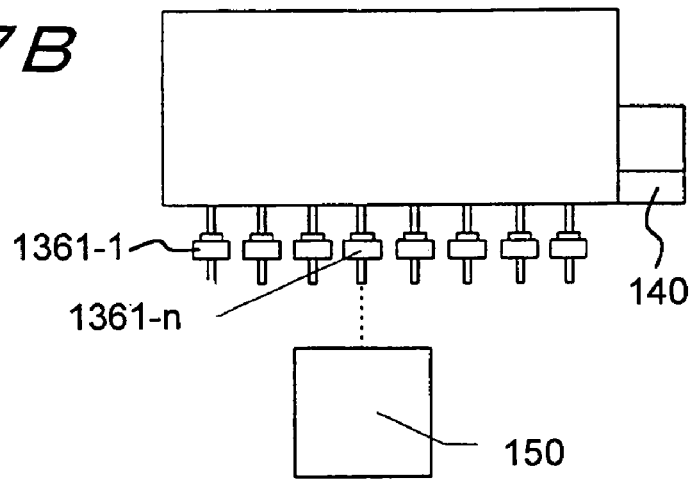
Figure 67C:
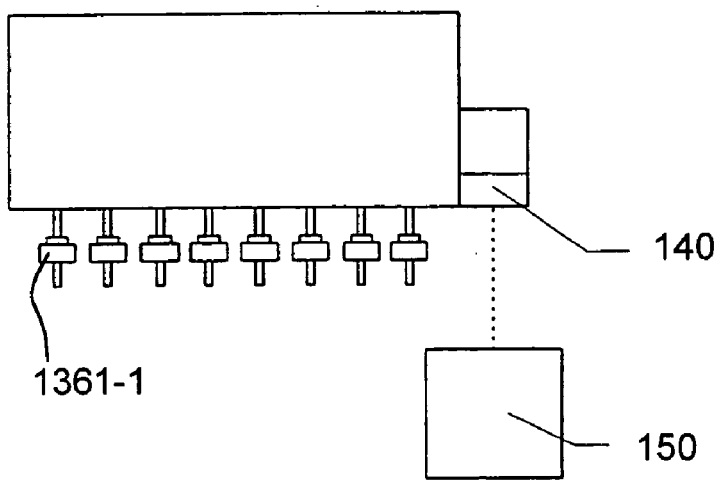

Reference is made below to FIGS. 67A through 67C that show the positional relation between the nozzle, the component recognition camera 150, and the board recognition camera during measurement.

When the position of the first nozzle (assumed to be a reference nozzle) 1361-1 is measured as shown in FIG. 67A, the first nozzle 1361-1 is positioned above the component recognition camera 150, and the position of the first nozzle 1361-1 is measured. The value of the position of the first nozzle 1361-1 obtained through the measurement in this state is assumed to be an area offset value (x1, y1).

Subsequently, when measuring the nozzle pitch to the n-th nozzle 1361-$n$ as shown in FIG. 67B, the n-th nozzle 1361-$n$ is positioned above the component recognition camera 150, and the position of the n-th nozzle 1361-$n$ is measured. The value of the position of the n-th nozzle 1361-$n$ measured in this state is assumed to be an area offset value (Xn, Yn). The head shown in FIGS. 67A through 67C has a total of eight nozzles, and therefore, the measurement is successively carried out for the number n from 2 to 8, setting the results as the area offset values of the first nozzle 1361-1.

Subsequently, when the board camera 140 is measured as shown in FIG. 67C, the board camera 140 is positioned above the component recognition camera 150, and the position of the board camera 140 is measured. The value of the position of the board camera 140 obtained through the measurement in this state is assumed to be an area offset value (Xp, Yp).

Figure 68:
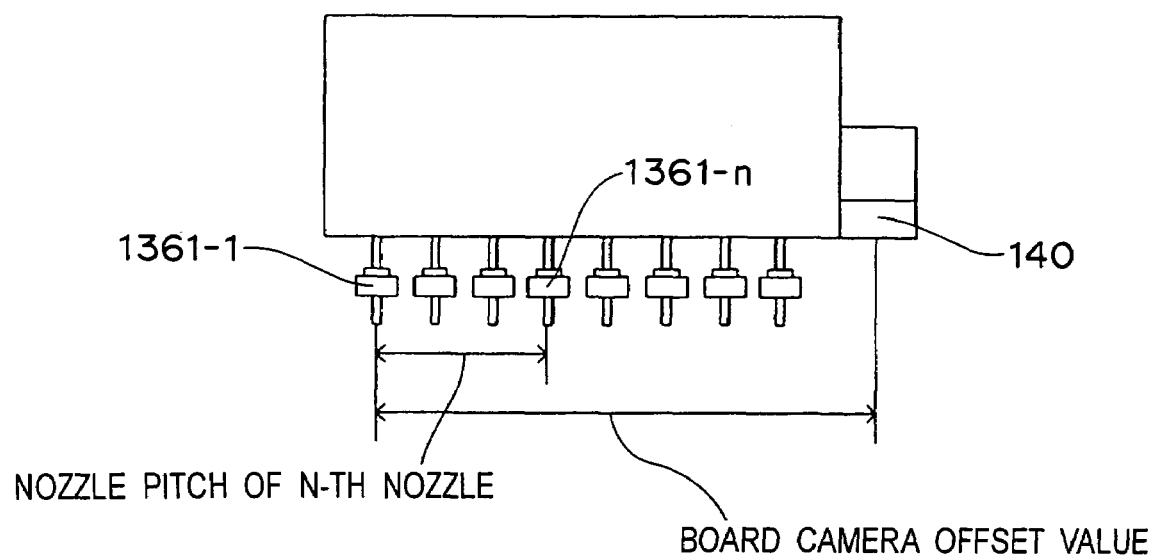
FIG. 68 is a view for explaining the offset value of the board camera, and the nozzle pitch.

As shown in FIG. 68, the offset value of the board camera and the nozzle pitch are given as distances from the first nozzle 1361-1. Therefore, when the area offset value is reflected, difference between the board camera offset value or the area offset value during the nozzle pitch measurement and the area offset value during the measurement of the position of the first nozzle 1361-1 are reflected in each operation.

For example, reference is made to FIG. 68, assuming that the area offset value during the measurement of the position of the first nozzle 1361-1 in the camera calibration stage is (X1, Y1), the area offset value during the nozzle pitch measurement of the n-th nozzle 1361-$n$ in the camera calibration stage is (Xn, Yn), and the area offset value during the board camera offset value measurement in the camera calibration stage is (Xp, Yp), then the area offset value to be reflected in the "board camera offset value" in each operation becomes (Xp−X1, Yp−Y1). Further, the area offset values reflected in the "nozzle pitch" of the n-th nozzle 1361-$n$ during the component placing operation become (Xn−X1, Yn−Y1).

Figure 65:
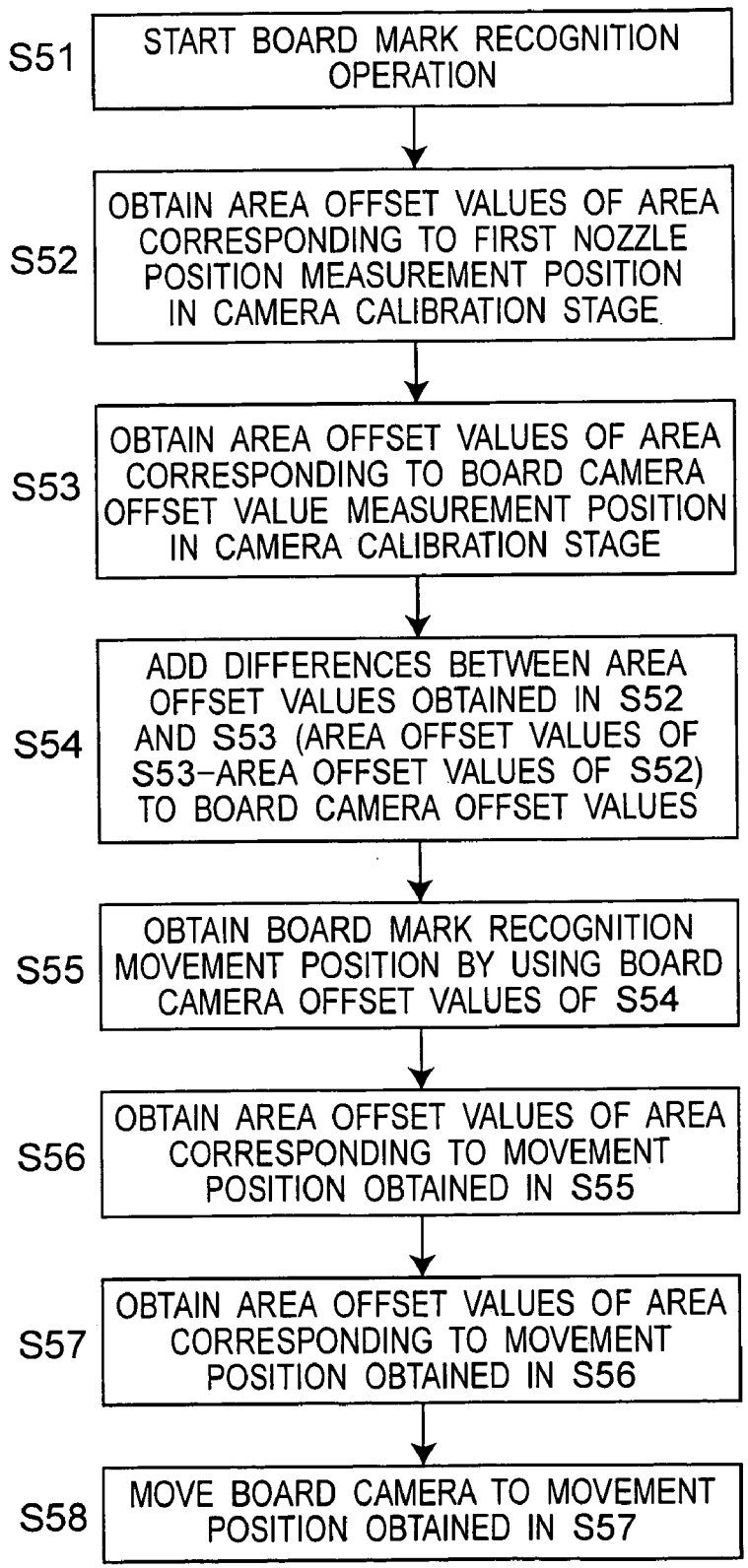
FIG. 65 is a flow chart showing an operation for reflecting an area offset value contained in a nozzle pitch and a board camera offset value due to the distortion of X-Y robot operation in the nozzle pitch and a board camera offset value as an application example of the second embodiment.

As shown in the flow chart of FIG. 65, an area offset value corresponding to the positional measurement position of the first nozzle 1361-1 in the camera calibration stage is obtained in step S51 during the placing region reference mark recognition operation.

Further, an area offset value corresponding to the board camera offset value measurement position in the camera calibration stage is obtained in step S52.

Next, when the area offset value is reflected in the board camera offset value in step S53, then the movement position of the head 136 is obtained, and the area offset value corresponding to the movement position of the head 136 is obtained in step S22 (FIG. 45). Further, an area offset value corresponding to the position in which the first nozzle (the nozzle of which the position becomes the reference position of the nozzle pitch and the board camera offset value) 1361-1 is located above the recognition camera is obtained in step S23 (FIG. 45), and an area offset value corresponding to the position in which the board camera 140 is located above the recognition camera is obtained in step S24 (FIG. 45). The area offset value obtained in step S22 during the placing region reference mark recognition operation is reflected in step S25, and difference between the area offset value obtained in step S23 and the area offset value obtained in step S24 (area offset value obtained by subtracting the area offset value obtained in step S23 from the area offset value obtained in step S24) is reflected in step S54. Concretely, difference between the area offset value obtained in step S52 and the area offset value obtained in step S53 (area offset value obtained by subtracting the area offset value of step S52 from the area offset value of step S53) is added to the board camera offset value in step S54. Next, the board mark recognition movement position is obtained in step S55 by using the board camera offset value of step S54. Next, an area offset value corresponding to the movement position obtained in step S55 is obtained in step S56. Next, an area offset value corresponding to the movement position obtained in step S56 is added in step S57. Next, the board camera is moved in step S58 to the movement position obtained in step S57.

With this arrangement, the area offset value due to the distortion of the X-Y robot operation contained in the nozzle pitch and the board camera offset value can be reflected, allowing the placing to be achieved with higher accuracy.

Figure 66:
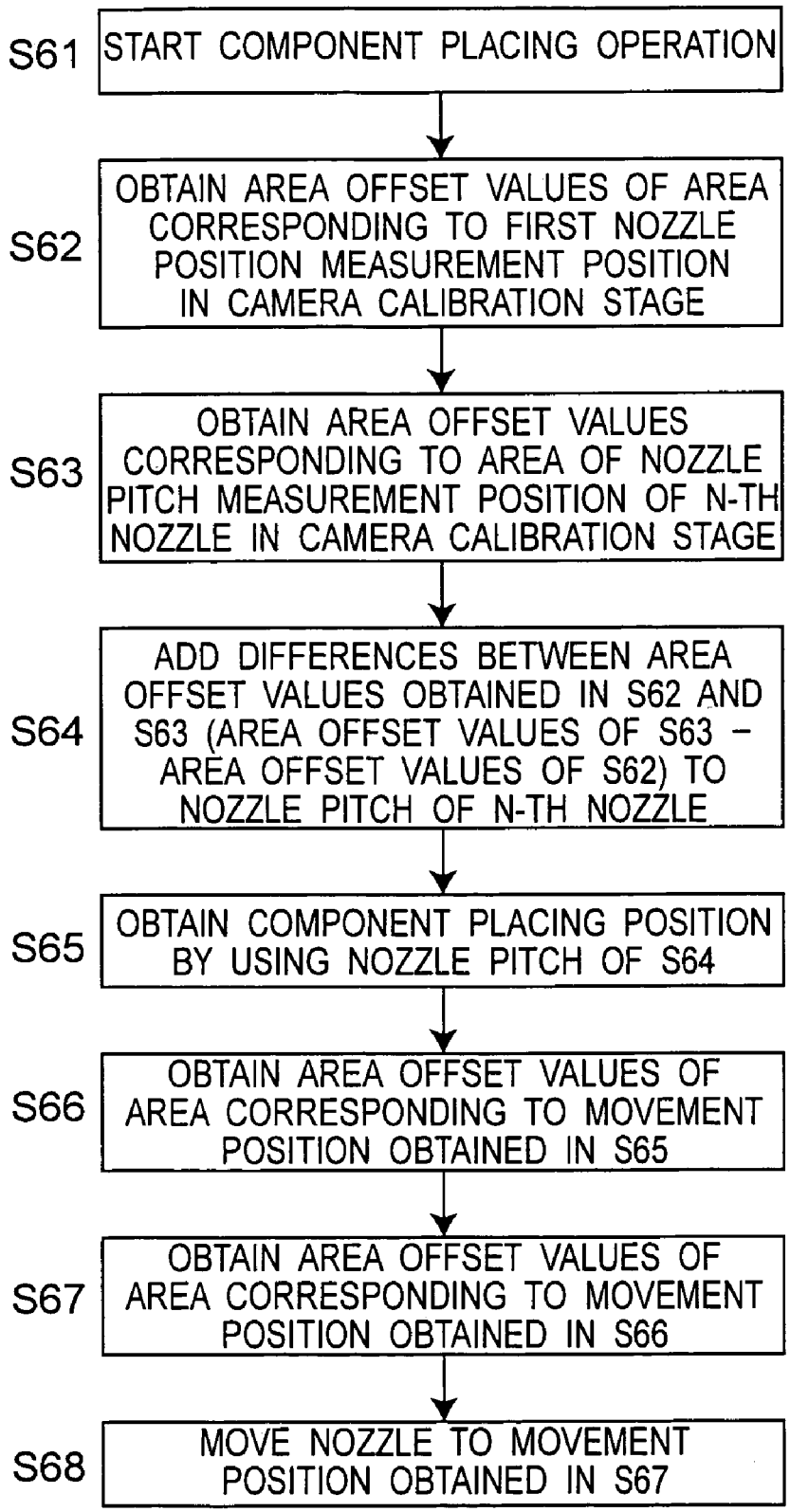
FIG. 66 is a flow chart showing a procedure for carrying out the component placing operation by reflecting the area offset value in the measurement position of the nozzle pitch.

The flow chart of FIG. 66 shows a procedure for carrying out the component placing operation by reflecting the area offset value in the nozzle pitch measurement position.

First of all, the area offset values of the first nozzle and the n-th nozzle in the camera calibration stage are obtained as described above in steps S62 and S63. That is, an area offset value of the area corresponding to the positional measurement position of the first nozzle in the camera calibration stage is obtained in step S62. Next, an area offset value corresponding to the area of the n-th nozzle pitch measurement position in the camera calibration stage is obtained in step S63.

Next, difference between the area offset values obtained in steps S62 and S63 (area offset value obtained by subtracting the area offset value of step S62 from the area offset value of step S63) is added to the n-th nozzle pitch in step S64.

Next, the component placing position is obtained in step S65 by using the nozzle pitch of step S64.

Next, an area offset value corresponding to the movement position obtained in step S65 is obtained in step S66.

Next, an area offset value of the area corresponding to the movement position obtained in step S66 is added in step S67.

Next, the nozzle is moved in step S68 to the movement position obtained in step S67.

By properly combining the arbitrary embodiments of the aforementioned various embodiments, the effects possessed by the embodiments can be produced.

The component mounting method and apparatus of the present invention is effective with the placing accuracy allowed to be improved by recognizing the placing region reference marks 201 arranged at regular intervals on the glass board 200, determining the offset value of each area corresponding to the board size as numerical value for correction from the recognition results, and reflecting the offset value corresponding to each movement position of the component placing head 136 as numerical value for correction during the placing position correction, the mark recognition and correction, or the placing position offset value measurement.

According to the present invention, in a state in which the placing region reference mark recognition reference board is held by the board holding device and positioned in the component placing region, the position coordinates of the placing region reference marks arranged at regular intervals on the reference board held by the board holding device are recognized to obtain the position coordinates of the recognized placing region reference marks, and the differences between the NC coordinates and the position coordinates of the placing region reference marks are obtained as correction values. The NC coordinates of the position coordinates of at least two board reference position calculation marks of the component mounting circuit board are obtained, and the placing region reference marks located near to the two board reference position calculation marks are extracted from among the recognized placing region reference marks. The position coordinates of the extracted placing region reference marks are subjected to coordinate transformation so that the correction values of the extracted placing region reference marks become zero or substantially zero, and the offset values of the respective placing region reference marks are obtained. Subsequently, in the state in which the component mounting circuit board is held by the board holding device and positioned in the component placing region in place of the placing region reference mark recognition reference board, at least two board reference position calculation marks of the component mounting circuit board held by the board holding device are recognized to obtain the position coordinates of the recognized two board reference position calculation marks, and the NC coordinates of the two board reference position calculation marks are corrected on the basis of the position coordinates of the obtained two board reference position calculation marks. When the component held by the component holding head is positioned above each component placing position of the component mounting circuit board, the position coordinate of the component placing position is corrected on the basis of the offset value of the placing region reference mark located nearest to the recognition camera provided for the component holding head, and thereafter, the component is placed in the component placing position on the basis of the position coordinates of the corrected component placing position. Consequently, the placing region reference marks arranged at regular intervals on the placing region reference mark recognition reference board are recognized, and the numerical value for the correction of the position coordinate of each area corresponding to the board size is determined as offset value from the recognition results. The corresponding offset values of the movement positions of the component holding head are to be used during the placing position correction, the mark recognition and correction, the placing position offset value measurement operation or any one of those operations. As a result, the deviation factor due to the distortion of the X-Y robot operation is absorbed, and the optimum offset value corresponding to the size of the board is obtained, allowing the highly accurate placing (e.g., placing under the conditions of the positioning accuracy on the ±0.005 mm level in the mounting stage) to be achieved.

Moreover, by reflecting the corresponding offset values of the movement positions of the component placing head as the numerical values for the correction also in the placing region reference mark recognition, the deviation factor due to the distortion of the X-Y robot operation is absorbed, and the optimum offset value corresponding to the size of the board is obtained, allowing the placing to be achieved with higher accuracy.

By properly combining the arbitrary embodiments of the aforementioned various embodiments, the effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component mounting method comprising:
   image-picking up a camera reference mark by a board recognition camera that is provided for a component placing head having a component holding member holding an electronic component, and is to image-pick up a board mark on a circuit board, said camera reference mark being
   (i) provided upright on a chassis individually of both an X-Y robot, having the component placing head, and a component recognition camera that is for picking up an image of the electronic component held by the component holding member,
   (ii) arranged adjacent the component recognition camera,
   (iii) positioned in a location where image-pickup of the electronic component by the component recognition camera is not disturbed, and
   (iv) provided at a height position that is the same as a height position of the circuit board when the board recognition camera picks up an image of the board mark, and the same as an image-pickup height position of the component recognition camera;
   obtaining relative positional relations among the component holding member, the board recognition camera, and the component recognition camera from central positional information of the component holding member, obtained by image-picking up the component holding member by use of the component recognition camera, and image-pickup information obtained by image-picking up an image-pickup mark, provided at the image-pickup height position of the component recognition camera, by use of the component recognition camera and the board recognition camera;
   for a positional relation between the component holding member and the board recognition camera, from among the relative positional relations, ignoring an amount of displacement between the component holding member and the board recognition camera attributed to heat;

using displacement information of the camera reference mark, obtained by image-picking up the camera reference mark by use of the board recognition camera, as information of a relative displacement between the board recognition camera and the component recognition camera;

based on only the displacement information, correcting a placing position, on the circuit board, for the electronic component;

moving the component placing head in mutually perpendicular directions so as to move the component holding member such that the electronic component is moved to the placing position so as to be placed onto the circuit board;

recognizing placing region reference marks arranged at regular intervals on a placing region reference mark recognition reference board held by a board holding device while the placing region reference mark recognition reference board is positioned in a component placing region, and then obtaining positional coordinates of each recognized placing region reference mark;

obtaining numerical control (NC) coordinates of positional coordinates of at least two board reference position calculation marks of a component mounting circuit board;

extracting placing region reference marks, located near the at least two board reference position calculation marks, from among the recognized placing region reference marks;

obtaining an offset value for each placing region reference mark by subjecting the positional coordinates of each extracted placing region reference mark to coordinate transformation so that a correction value of said each extracted placing region reference mark becomes zero or substantially zero;

recognizing at least two board reference position calculation marks of the component mounting circuit board when held by the board holding device in the component placing region in place of the placing region reference mark recognition reference board, and then obtaining positional coordinates of the recognized at least two board reference position calculation marks;

correcting the NC coordinates of the at least two board reference position calculation marks based on the obtained positional coordinates of the recognized at least two board reference position calculation marks;

performing correction of positional coordinates of a component placing position, of the component mounting circuit board, based on an offset value of a placing region reference mark that is located nearest to a recognition camera provided for a component holding head when a component held by the component holding head is positioned above the component placing position; and then placing the component in the component placing position based on the corrected positional coordinates of the component placing position.

2. The component mounting method according to claim 1, wherein obtaining the offset value for each placing region reference mark by subjecting the positional coordinates of each extracted placing region reference mark to coordinate transformation so that the correction value of said each extracted placing region reference mark becomes zero or substantially zero, comprises obtaining the offset value for each placing region reference mark by subjecting the positional coordinates of each extracted placing region reference mark to coordinate transformation, by rotating and shifting a graphic line that interconnects said each extracted placing region reference mark, so that the correction value of said each extracted placing region reference mark becomes zero or substantially zero.

3. The component mounting method as claimed in claim 1, wherein obtaining the offset value for each placing region reference mark by subjecting the positional coordinates of each extracted placing region reference mark to coordinate transformation so that the correction value of said each extracted placing region reference mark becomes zero or substantially zero, comprises (i) calculating a correction value in at least one of an X-direction of the board holding device and a Y-direction, perpendicular to the X-direction, of said each extracted placing region reference mark, (ii) obtaining an inclination of said placing region reference mark recognition reference board, and (iii) subjecting the positional coordinates of said each extracted placing region reference mark to coordinate transformation such that the correction value as calculated becomes zero or substantially zero.

* * * * *